US005561077A

United States Patent [19]
Terashima

[11] Patent Number: 5,561,077
[45] Date of Patent: Oct. 1, 1996

[54] DIELECTRIC ELEMENT ISOLATED SEMICONDUCTOR DEVICE AND A METHOD OF MANUFACTURING THE SAME

[75] Inventor: Tomohide Terashima, Itami, Japan

[73] Assignee: Mitsubishi Denki Kabushiki Kaisha, Tokyo, Japan

[21] Appl. No.: 531,750

[22] Filed: Sep. 21, 1995

Related U.S. Application Data

[62] Division of Ser. No. 371,487, Jan. 11, 1995, Pat. No. 5,485,030, which is a continuation of Ser. No. 84,948, Jul. 2, 1993, abandoned.

[30] Foreign Application Priority Data

Oct. 21, 1992 [JP] Japan ..................... 4-282772
Nov. 24, 1992 [JP] Japan ..................... 4-313257

[51] Int. Cl.$^6$ ............................. H01L 21/302
[52] U.S. Cl. ................. 437/63; 437/61; 437/67; 437/56
[58] Field of Search .................. 437/63, 61, 62, 437/67, 68, 56, 57; 257/506, 492, 524, 347

[56] References Cited

U.S. PATENT DOCUMENTS

| | | | |
|---|---|---|---|
| 4,970,175 | 11/1990 | Haisma et al. | 437/63 |
| 5,110,749 | 5/1992 | Ikeda | 437/63 |
| 5,164,804 | 11/1992 | Terashima | 257/487 |
| 5,164,805 | 11/1992 | Lee | 257/351 |
| 5,237,193 | 8/1993 | Williams et al. | 257/336 |
| 5,254,864 | 10/1993 | Ogawa | 437/63 |
| 5,256,586 | 10/1993 | Choi et al. | 437/41 SW |
| 5,326,991 | 7/1994 | Takasu | 257/350 |
| 5,343,067 | 8/1994 | Nakagawa et al. | 257/487 |
| 5,443,998 | 8/1995 | Meyer | 437/69 |
| 5,484,738 | 1/1996 | Chu et al. | 437/67 |

*Primary Examiner*—Kevin M. Picardat
*Attorney, Agent, or Firm*—Oblon, Spivak, McClelland, Maier & Neustadt, P.C.

[57] ABSTRACT

A high-breakdown voltage semiconductor device and a fabrication method are disclosed. A dielectric layer (3) dielectrically isolates a semiconductor substrate (1) from a $n^-$ type semiconductor layer (2). An $n^+$ type semiconductor region (4) having a lower resistance than the $n^-$ type semiconductor layer (2) is formed as if surrounded by a $p^+$ type semiconductor region (5). The dielectric layer (3) consists of a relatively thick first region (3a) and a relatively thin first region (3b). The $n^+$ type semiconductor region (4), which is located above the first region (3a), occupies a narrower area than the first region (3a). Thus, by forming the dielectric layer thick immediately under the first semiconductor layer and controlling the thickness of the dielectric layer at other portions, the breakdown voltage of the semiconductor device is improved without curbing RESURF effect.

8 Claims, 57 Drawing Sheets

F I G. 7
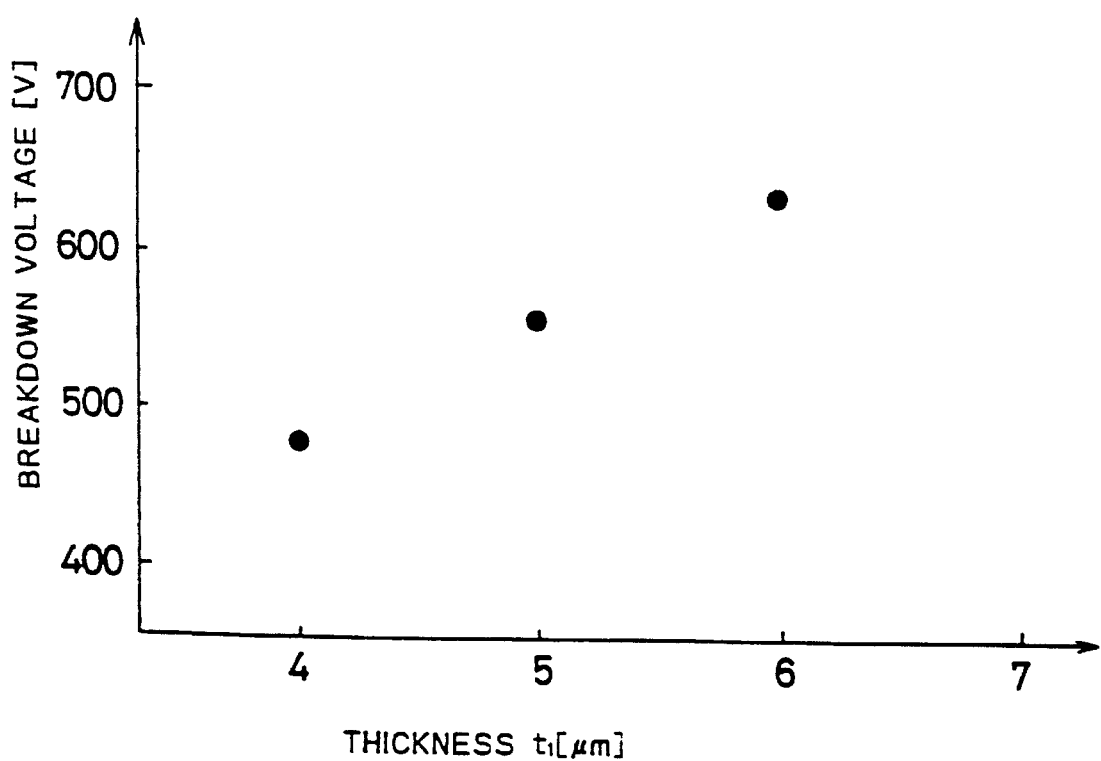

DIELECTRIC ELEMENT ISOLATED SEMICONDUCTOR DEVICE AND A METHOD OF MANUFACTURING THE SAME

This is a division, of application Ser. No. 08/371,487 filed on Jan. 11, 1995, now U.S. Pat. No. 5,485,030, which is a continuation of Ser. No. 08/084,948 filed on Jul. 2, 1993, now abandoned.

BACKGROUND OF THE INVENTION

1. Field of the Invention

The present invention relates to a semiconductor device which is capable of holding a high breakdown voltage, and more particularly, to a dielectric layer isolated semiconductor device.

2. Description of the Prior Art

FIGS. 52 and 53 are a perspective cross sectional view and a cross sectional view, respectively, of a conventional dielectric element isolated semiconductor device 200. On the top and the bottom surfaces of a semiconductor substrate 1, a dielectric layer 3 and a back surface electrode 8 are formed, respectively. An $n^-$ typesemiconductor layer 2 is formed on the top surface of the dielectric layer 3. The dielectric layer 3 dielectrically isolates the semiconductor substrate 1 from the $n^-$ type semiconductor layer 2. The $n^-$ type semiconductor layer 2 is delineated by an insulation film 9 into a predetermined region.

In the top surface of the $n^-$ type semiconductor layer 2 at the delineated predetermined region, an $n^+$ type semiconductor region 4 having a lower resistance than the $n^-$ type semiconductor layer 2 is formed as if surrounded by a $p^+$ type semiconductor region 5. The $n^+$ type semiconductor region 4 and the $p^+$ type semiconductor region 5 are connected respectively to a cathode electrode 6 and an anode electrode 7 which are insulated from each other by an insulation film 11.

FIG. 54 is a cross sectional view showing operations of the conventional dielectric element isolated semiconductor device 200. When the anode electrode 7 and the back surface electrode 8 are kept at 0 V and a gradually increasing positive voltage is given to the cathode electrode 6, a depletion layer 41a grows from an pn junction between the $n^-$ type semiconductor layer 2 and the $p^+$ type semiconductor region 5. When this happens, since the semiconductor substrate 1 serves through the dielectric layer 3 as a field plate, in addition to the depletion layer 41a, another depletion layer 41b extends from an interface between the $n^-$ type semiconductor layer 2 and the dielectric layer 3 toward the top surface of the $n^-$ type semiconductor layer 2.

The growth of the depletion layer 41b facilitates the expansion of the depletion layer 41a, relieving an electric field at the pn junction between the $n^-$ type semiconductor layer 2 and the $p^+$ type semiconductor region 5. This phenomena is generally known as RESURF (reduced surface field) effect.

FIG. 55 shows dependence of the electric field strength in a downward direction traversing the thickness of the device on the thickness of the device, the dependence being taken at a point enough far from the $p^+$ type semiconductor region 5, i.e., at a G—G cross section of FIG. 54. In the graph, the thickness (growth) of the depletion layer 41b is x, the thickness of the dielectric layer 3 is $t_0$, and the origin of the lateral axis is the top surface of the $n^-$ type semiconductor layer 2.

At the G—G cross section, a full voltage drop V is expressed as:

$$V = q \cdot N/(\epsilon_2 \cdot \epsilon_0) \cdot (x^2/2 + \epsilon_2 \cdot t_0 \cdot x/\epsilon_3) \quad (1)$$

where N: impurity concentration of n type semiconductor layer $\epsilon_0$: specific inductive capacity in vacuum $\epsilon_2$: specific inductive capacity of $n^-$ type semiconductor layer 2

$\epsilon_3$: specific inductive capacity of dielectric layer 3

Eq. 1 indicates that when the full voltage drop V stays unchanged, as the thickness $t_0$ of the dielectric layer 3 increases, the growth x of the depletion layer 41b decreases. This means that the RESURF effect is weakened.

On the other hand, where there will not be avalanche breakdown due to neither field concentration at the pn junction between the $n^-$ type semiconductor layer 2 and the $p^+$ type semiconductor region 5 nor field concentration at an interface between the $n^-$ type semiconductor layer 2 and the $n^+$ type semiconductor region 4, it is the avalanche breakdown which is caused by field concentration at the interface between the $n^-$ type semiconductor layer 2 and the dielectric layer 3 immediately under the $n^+$ type semiconductor region 4 that eventually determines the breakdown voltage of the semiconductor device 200. To obtain the semiconductor device 200 which satisfies this condition, the distance L between the $p^+$ type semiconductor region 5 and the $n^+$ type semiconductor region 4 has to be long enough and the thickness d and the impurity concentration N of the $n^-$ type semiconductor layer 2 have to be optimum.

FIG. 56 is a cross sectional view showing operations of the conventional dielectric element isolated semiconductor device 200 which satisfies such a condition above. It is a general knowledge that field concentration created at the interface between the $n^-$ type semiconductor layer 2 and the dielectric layer 3 satisfies the avalanche condition precisely when the $n^-$ type semiconductor layer 2 has been depleted from its interface with the dielectric layer 3 to its surface. In FIG. 56, the depletion layer 41 has reached the $n^+$ type semiconductor region 4, completely depleting the $n^-$ type semiconductor layer When dielectric element isolated semiconductor device 200 assumes such a condition, where the thickness of the $n^{30}$ type semiconductor region 4 is not considered, the breakdown voltage V is expressed as:

$$V = E_{cr} \cdot (d/2 + \epsilon_2 \cdot t_0/\epsilon_3) \quad (2)$$

where $E_{cr}$: critical electrical field for causing avalanche

FIG. 57 shows dependence of the electric field strength in a downward direction traversing the thickness of the device on the thickness of the device, the dependence being taken immediately under the $n^+$ type semiconductor region 4, i.e., across an H—H section of FIG. 56. The graph indicates that critical electrical field $E_{cr}$ is reached at the interface between the $n^-$ type semiconductor layer 2 and the dielectric layer 3 (i.e., at a distance d from the origin toward the electrode 8).

The breakdown voltage of the dielectric element isolated semiconductor device 200 will now be calculated assuming that the $n^-$ type semiconductor layer 2 is made of silicon and the dielectric layer 3 is formed by a silicon oxide film. As is standard in the art, $d = 4 \times 10^-$ and $t_0 = 2 \times 10^-$. The critical electrical field $E_{cr}$, which is sensitive to the thickness d of the $n^-$ type semiconductor layer 2, is about $E_{cr} = 4 \times 10^5$ in this case. Substituting these values, $\epsilon_2 = 11.7$ and $\epsilon_3 = 3.9$ in Eq. 2, the breakdown voltage V is:

$$V = 320 \, [V] \quad (3)$$

Hence, if the thickness d of the n⁻ type semiconductor layer 2 increases 1 μm, the breakdown voltage increases by:

$$\Delta V = E_{cr} \times 0.5 \times 10^{-4} = 20 \; [V] \quad (4)$$

On the other hand, with a 1 μm increase in the thickness $t_0$ of the dielectric layer 3, the breakdown voltage increases by:

$$\Delta V = E_{cr} \times 11.7 \times 1 \times 10^{-4}/3.9 = 120 \; [V] \quad (5)$$

It then follows that greater improvement in the breakdown voltage would be attained if the dielectric layer 3 is thickened than if the n⁻ type semiconductor layer 2 is thickened. Thus, to form the dielectric layer 3 thick is effective in enhancing the breakdown voltage. Equally important, increase in the thickness of the n⁻ type semiconductor layer 2 is not desirable also in terms of ease of forming the insulation film 9.

However, when the thickness $t_0$ of the dielectric layer 3 is increased, the growth x of the depletion layer 41b and hence the RESURF effect would be suppressed. In other words, when the dielectric layer 3 gains thickness, the field concentration at the pn junction between the n⁻ type semiconductor layer 2 and the p⁺ type semiconductor region 5 increased, causing avalanche breakdown thereat which would limit the breakdown voltage.

Since the conventional semiconductor device has such a construction, the breakdown voltage of the semiconductor device is limited by the thickness of the dielectric layer 3 and the thickness of the n⁻ type semiconductor layer 2.

SUMMARY OF THE INVENTION

According to a first aspect, a dielectric element isolated semiconductor device comprises: an electrode body; a dielectric layer formed on the electrode body and including a first region and a second region, the first region having a first specific inductive capacity and a first thickness, the second region having a second specific inductive capacity and a second thickness; a first semiconductor layer of a first conductivity type formed on the dielectric layer, the first semiconductor layer having a relatively high resistance; a second semiconductor layer of the first conductivity type selectively formed in the top surface of the first semiconductor layer above the first region, the second semiconductor layer having a relatively low resistance; a third semiconductor layer of a second conductivity type selectively formed in the top surface of the first semiconductor layer above the second region; a first electrode electrically connected to the second semiconductor layer; and a second electrode electrically connected to the third semiconductor layer. The semiconductor device is characterized in that a value obtainable by dividing the first thickness by the first specific inductive capacity is greater than a value obtainable by dividing the second thickness by the second specific inductive capacity.

In the first aspect, the the second region preferably surrounds the first region.

In the first aspect, the third semiconductor layer preferably penetrates the second semiconductor layer.

According to a second aspect, a dielectric element isolated semiconductor device comprises: an electrode body; a dielectric layer formed on the electrode body and including a relatively thick first region and a relatively thin second region; a first semiconductor layer of a first conductivity type formed on the dielectric layer, the first semiconductor layer having a relatively high resistance; a second semiconductor layer of the first conductivity type selectively formed in the top surface of the first semiconductor layer above the first region, the second semiconductor layer having a relatively low resistance; a third semiconductor layer of a second conductivity type selectively formed in the top surface of the first semiconductor layer above the second region; a first electrode electrically connected to the second semiconductor layer; and a second electrode electrically connected to the third semiconductor layer.

In the second aspect, the electrode body preferably includes: a fourth semiconductor layer having a first major surface and a second major surface at which the fourth semiconductor layer abuts the dielectric layer; and a conductive layer abutting the first major surface of the fourth semiconductor layer.

In the second aspect, the second region preferably surrounds the first region.

In the second aspect, the dielectric layer preferably has an even top surface.

In the second aspect, the third semiconductor layer preferably penetrates the second semiconductor layer.

According to a third aspect, a dielectric element isolated semiconductor device comprises: an electrode body; a dielectric layer formed on the electrode body and including a first region having a relatively low specific inductive capacity and a second region having a relatively high specific inductive capacity; a first semiconductor layer of a first conductivity type formed on the dielectric layer, the first semiconductor layer having a relatively high resistance; a second semiconductor layer of the first conductivity type selectively formed in the top surface of the first semiconductor layer above the first region, the second semiconductor layer having a relatively low resistance; a third semiconductor layer of a second conductivity type selectively formed in the top surface of the first semiconductor layer above the second region; a first electrode electrically connected to the second semiconductor layer; and a second electrode electrically connected to the third semiconductor layer.

In the third aspect, the specific inductive capacity at the first region of the dielectric layer preferably has a distribution along its thickness.

In the third aspect, the dielectric layer may be formed at the first region by a stacked structure in which a plurality of dielectric element strips having different specific inductive capacities are superimposed one atop the other.

In the third aspect, one of the plurality of the dielectric element strips may have a specific inductive capacity which is equal to the specific inductive capacity the dielectric layer has at the second region.

In the third aspect, at the first region, one of the dielectric element strips having a lower specific inductive capacity than the specific inductive capacity at the second region may be included in the dielectric layer as an intermediate layer.

In the third aspect, the electrode body preferably includes: a fourth semiconductor layer having a first major surface and a second major surface at which the fourth semiconductor layer abuts the dielectric layer; and a conductive layer abutting the first major surface of the fourth semiconductor layer.

In the third aspect, the second region preferably surrounds the first region.

In the third aspect, the third semiconductor layer preferably penetrates the second semiconductor layer.

According to a fourth aspect, in the device structure of the third aspect, the dielectric layer may be relatively thin at the second region and relatively thick at the first region.

In the fourth aspect, the dielectric layer preferably has an even top surface.

According to a fifth aspect, the dielectric element isolated semiconductor device of the second aspect may further comprise: a fourth semiconductor layer of the first conductivity type selectively formed in the top surface of the third semiconductor layer and electrically connected to the second electrode together with the third semiconductor layer; and a control electrode formed on a side of the second electrode nearer to the first electrode, the control electrode being located above the first, the third and the fourth semiconductor layers in a faced relationship therewith but electrically insulated therefrom.

According to a sixth aspect, the dielectric element isolated semiconductor device of the second aspect may alternatively further comprise: a fourth semiconductor layer of the first conductivity type selectively formed in the top surface of the third semiconductor layer; and a third electrode formed on a side of the second electrode nearer to the first electrode and electrically connected to the fourth semiconductor layer.

According to a seventh aspect, the dielectric element isolated semiconductor device of the second aspect may alternatively further comprise: a fourth semiconductor layer of the second conductivity type selectively formed in the top surface of the second semiconductor layer and electrically connected to the first electrode together with the second semiconductor layer; a fifth semiconductor layer of the second conductivity type formed in the top surface of the first semiconductor layer to extend from the third semiconductor layer to the vicinity of the second semiconductor layer, the fifth semiconductor layer having a higher resistance than the third semiconductor layer; and a control electrode formed on a side of the first electrode nearer to the second electrode, the control electrode being located above the first, the second, the fourth and the fifth semiconductor layers in a faced relationship therewith but electrically insulated therefrom.

According to an eighth aspect, a dielectric element isolated semiconductor device comprises: an electrode body; a dielectric layer formed on the electrode body and including a first region having a first specific inductive capacity and a first thickness and a second region having a second specific inductive capacity and a second thickness; a first semiconductor layer of a first conductivity type formed on the dielectric layer, the first semiconductor layer having a relatively high resistance; a second semiconductor layer of the first conductivity type selectively formed in the top surface of the first semiconductor layer above the first region, the second semiconductor layer having a relatively low resistance; a third semiconductor layer of a second conductivity type selectively formed in the top surface of the first semiconductor layer above the second region; a fourth semiconductor layer of the first conductivity type selectively formed in the top surface of the third semiconductor layer; a fifth semiconductor layer of the second conductivity type selectively formed in the top surface of the second semiconductor layer; a first electrode electrically connected to the fifth semiconductor layer; a second electrode electrically connected to the third and the fourth semiconductor layers; and a control electrode formed on a side of the second electrode nearer to the first electrode, the control electrode being located above the first, the third and the fourth semiconductor layers in a faced relationship therewith but electrically insulated therefrom. In the semiconductor device, a value obtainable by dividing the first thickness by the first specific inductive capacity is greater than a value obtainable by dividing the second thickness by the second specific inductive capacity.

According to a ninth aspect, in the dielectric element isolated semiconductor device of the eighth aspect, the first electrode may be electrically connected also to the second semiconductor layer.

According to a tenth aspect, a dielectric element isolated semiconductor device comprises: an electrode body; a dielectric layer formed on the electrode body and including a first region having a first specific inductive capacity and a first thickness and a second region having a second specific inductive capacity and a second thickness; a first semiconductor layer of a first conductivity type formed on the dielectric layer, the first semiconductor layer having a relatively high resistance; a second semiconductor layer of the first conductivity type selectively formed in the top surface of the first semiconductor layer above the first region, the second semiconductor layer having a relatively low resistance; a third semiconductor layer of a second conductivity type selectively formed in the top surface of the first semiconductor layer above the second region; a fourth semiconductor layer of the first conductivity type selectively formed in the top surface of the third semiconductor layer; a fifth semiconductor layer of the second conductivity type formed in the top surface of the second semiconductor layer; a sixth semiconductor layer of the first conductivity type formed in the top surface of the third semiconductor layer on a side of the fourth semiconductor layer nearer to the first electrode; a first electrode electrically connected to the fifth semiconductor layer; a second electrode electrically connected to the third and the fourth semiconductor layers; a first control electrode formed on a side of the second electrode nearer to the first electrode, the first control electrode being located above the third, the fourth and the sixth semiconductor layers in a faced relationship therewith but electrically insulated therefrom; and a second control electrode formed on a side of the first control electrode nearer to the first electrode, the second control electrode being located above the first, the third and the sixth semiconductor layers in a faced relationship therewith but electrically insulated therefrom. In the semiconductor device, a value obtainable by dividing the first thickness by the first specific inductive capacity is greater than a value obtainable by dividing the second thickness by the second specific inductive capacity.

According to an eleventh aspect, a dielectric element isolated semiconductor device, comprising: an electrode body; a dielectric layer formed on the electrode body and including a first region having a first specific inductive capacity and a first thickness and a second region having a second specific inductive capacity and a second thickness; a first semiconductor layer of a first conductivity type formed on the dielectric layer, the first semiconductor layer having a relatively high resistance; a second semiconductor layer of the first conductivity type selectively formed in the top surface of the first semiconductor layer above the first region, the second semiconductor layer having a relatively low resistance; a third semiconductor layer of a second conductivity type selectively formed in the top surface of the first semiconductor layer above the second region; a fourth semiconductor layer of the second conductivity type selectively formed in the top surface of the second semiconductor layer; a fifth semiconductor layer of the second conductivity type formed in the top surface of the first semiconductor layer to extend from the third semiconductor layer to the vicinity of the second semiconductor layer, the fifth semiconductor layer having a higher resistance than the third semiconductor layer; a sixth semiconductor layer of the first conductivity type selectively formed in the top surface of the third semiconductor layer above the second region; a first electrode electrically connected to the second and the fourth semiconductor layers; a second electrode electrically connected to the sixth semiconductor layer; and a control electrode formed on a side of the first electrode nearer to the second electrode, the control electrode being located above the first, the second, the fourth and the fifth semiconductor layers in a faced relationship therewith but electrically insulated therefrom. In the semiconductor device, a value obtainable by dividing the first thickness by the first specific inductive capacity is greater than a value obtainable by dividing the second thickness by the second specific inductive capacity.

According to a twelfth aspect, a dielectric element isolated semiconductor device, comprising: an electrode body; a dielectric layer formed on the electrode body and including a first region having a first specific inductive capacity and a first thickness and a second region having a second specific inductive capacity and a second thickness; a first semiconductor layer of a first conductivity type formed on the dielectric layer, the first semiconductor layer having a relatively high resistance; a second semiconductor layer of the first conductivity type selectively formed in the top surface of the first semiconductor layer above the first region, the second semiconductor layer having a relatively low resistance; a third semiconductor layer of a second conductivity type selectively formed in the top surface of the first semiconductor layer above the second region; a fourth semiconductor layer of the second conductivity type selectively formed in the top surface of the second semiconductor layer; a fifth semiconductor layer of the second conductivity type formed in the top surface of the first semiconductor layer, the fifth semiconductor layer being located on a side of the third semiconductor layer nearer to the first electrode; a sixth semiconductor layer of the first conductivity type selectively formed in the top surface of the fifth semiconductor layer above the second region; a control electrode disposed above the first, the third, the fifth and the sixth semiconductor layers in a faced relationship therewith but electrically insulated therefrom; a first electrode electrically connected to the fourth semiconductor layer; a second electrode electrically connected to the third semiconductor layer; and a third electrode electrically connected to the sixth semiconductor layer. In the semiconductor device, a value obtainable by dividing the first thickness by the first specific inductive capacity is greater than a value obtainable by dividing the second thickness by the second specific inductive capacity.

A thirteenth aspect of the invention relates to a method of manufacturing a dielectric element isolated semiconductor device. The method comprises the steps of: (a) preparing a first substrate having a first major surface and a second major surface and a second substrate of a first conductivity type, the second substrate having a first and a second major surfaces and a relatively high resistance; (b) forming a first dielectric layer on the first major surface of the first substrate so that the first dielectric layer includes a relatively thick first region and a relatively thin second region surrounding the first region; (c) forming a second dielectric layer in the first major surface of the second substrate; (d) joining the first and the second substrates at the first major surfaces with the first and the dielectric layers in; (e) forming a first semiconductor layer of a relatively low resistance and a second semiconductor layer in the second major surface of the second substrate from a second major surface side of the second substrate so that the first semiconductor layer is in an opposed relationship with the first region and the second semiconductor layer is in an opposed relationship with the second region; and (f) forming a first electrode and a second electrode which are electrically connected to the first semiconductor layer and the second semiconductor layer, respectively.

According to a fourteenth aspect of the invention, a method of manufacturing a dielectric element isolated semiconductor device comprises the steps of: (a) preparing a first substrate having a first major surface and a second major surface and a second substrate of a first conductivity type, the second substrate having a first and a second major surfaces and a relatively high resistance; (b) forming a first dielectric layer on the first major surface of the first substrate; (c) forming a second dielectric layer on the first major surface of the second substrate, the second dielectric layer including a first region of a relatively low specific inductive capacity and a second region of a relatively high specific inductive capacity surrounding the first region; (d) joining the first and the second substrates at the first major surfaces with the first and the second dielectric layers in; (e) forming a first semiconductor layer of a relatively low resistance and a second semiconductor layer in the second major surface of the second substrate from a second major surface side of the second substrate so that the first semiconductor layer is in an opposed relationship with the first region and the second semiconductor layer is in an opposed relationship with the second region; and (f) forming a first electrode and a second electrode which are electrically connected to the first semiconductor layer and the second semiconductor layer, respectively.

In the method of the fourteenth aspect of the invention, the second dielectric layer is formed to include at the first region a dielectric element strip which is thinner than the second dielectric layer.

According to a fifteenth aspect of the invention, a method of manufacturing a dielectric element isolated semiconductor device comprises the steps of: (a) preparing a first substrate having a first and a second major surfaces and including in the first major surface thereof a relatively thin first region and a relatively thick second region surrounding the first region; (b) preparing a second substrate of a first conductivity having a first and a second major surfaces, the second substrate having a relatively high resistance; (c) forming a first dielectric layer having a relatively high specific inductive capacity on the first major surface of the first substrate so that the first dielectric layer forms a concave portion in the first region; (d) filling the concave portion with a third dielectric layer having a relatively low specific inductive capacity; (e) forming a second dielectric layer having a relatively high specific inductive capacity on the first major surface of the second substrate; (f) joining the first and the second substrates at the first major surfaces with the first to the third dielectric layers in; (g) forming a first semiconductor layer of a relatively low resistance and a second semiconductor layer in the second major surface of the second substrate from a second major surface side of the second substrate so that the first semiconductor layer is in an opposed relationship with the first region and the second semiconductor layer is in an opposed relationship with the second region; and (h) forming a first electrode and a second electrode which are electrically connected to the first semiconductor layer and the second semiconductor layer, respectively.

In the method of the fifteenth aspect of the invention, the third dielectric layer is an air layer.

According to a sixteenth aspect of the invention, a method of manufacturing a dielectric element isolated semiconductor device comprises the steps of: (a) preparing a first substrate having a first and a second major surfaces and a second substrate of a first conductivity type having a first and a second major surfaces and a relatively high resistance; (b) forming a first dielectric layer on the first major surface of the first substrate, the first dielectric layer including a relatively thick first region, a relatively thin second region surrounding the first region and a relatively thick third region which is disposed outside the second region; (c) forming a second dielectric layer on the first major surface of the second substrate; (d) joining the first and the second substrates at the first major surfaces with the first and the second dielectric layers in; (e) selectively removing the second substrate, the first dielectric layer and the second dielectric layer and thereby exposing the first dielectric layer in the third region; and (f) forming a first semiconductor layer of a relatively low resistance and a second semiconductor layer in the second major surface of the second substrate from a second major surface side of the second substrate using the first dielectric layer in the third region as a reference patterning position so that the first semiconductor layer is in an opposed relationship with the first region and the second semiconductor layer is in an opposed relationship with the second region.

According to a seventeenth aspect of the invention, a method of manufacturing a dielectric element isolated semiconductor device comprises the steps of: (a) preparing a first substrate having a first and a second major surfaces and a second substrate of a first conductivity type, the second substrate having a first and a second major surfaces and a relatively high resistance; (b) forming a first dielectric layer on the first major surface of the first substrate; (c) forming on the first major surface of the second substrate a second dielectric layer which includes a relatively thin first region, a relatively thick second region surrounding the first region and a relatively thin third region which is disposed outside the second region so that the second dielectric layer forms a concave portion in the first and the third regions; (d) joining the first and the second substrates at the first major surfaces with the first and the second dielectric layers in; (e) selectively removing the second substrate, the first dielectric layer and the second dielectric layer and thereby exposing the first dielectric layer in the third region; and (f) forming a first semiconductor layer of a relatively low resistance and a second semiconductor layer in the second major surface of the second substrate from a second major surface side of the second substrate using the first dielectric layer in the third region as a reference patterning position so that the first semiconductor layer is in an opposed relationship with the first region and the second semiconductor layer is in an opposed relationship with the second region.

According to an eighteenth aspect of the invention, a method of manufacturing a dielectric element isolated semiconductor device comprises the steps of: (a) preparing a first substrate having a first and a second major surfaces and including in the first major surface thereof a relatively thin first region, a relatively thick second region surrounding the first region and a relatively thin third region which is disposed outside the second region; (b) preparing a second substrate of a first conductivity type having a first and a second major surfaces and a relatively high resistance; (c) forming a first dielectric layer on the first major surface of the first substrate so that the first dielectric layer forms a concave portion in the first and the third regions; (d) forming a second dielectric layer on the first major surface of the second substrate; (e) joining the first and the second substrates at the first major surfaces with the first and the second dielectric layers in; (f) selectively removing the second substrate, the first dielectric layer and the second dielectric layer and thereby exposing the first dielectric layer in the third region; and (g) forming a first semiconductor layer of a relatively low resistance and a second semiconductor layer in the second major surface of the second substrate from a second major surface side of the second substrate using the first dielectric layer in the third region as a reference patterning position so that the first semiconductor layer is in an opposed relationship with the first region and the second semiconductor layer is in an opposed relationship with the second region.

Thus, the dielectric layer ensures a large voltage drop at its first region which determines the breakdown voltage of the semiconductor device. At its second region which affects RESURF effect, the dielectric layer relieves field concentration created between the first and the third semiconductor layers.

The third region serves as an alignment mark for use during fabrication of the first semiconductor layer on the first region.

Hence, according to the aspects of devices of the present invention, it is possible to prevent punctuation of RESURF effect and increase voltage drop. As a result, the breakdown voltage of the semiconductor device is improved.

According to the aspects of methods of the present invention, the dielectric element isolated semiconductor devices according to the aspects of devices are obtainable. It is particularly to be noted that formation of the first semiconductor layer in an opposed relationship with the first region of the dielectric layer is easy.

Accordingly, it is an object of the present invention to eliminate a limit on the breakdown voltage of the semiconductor device imposed by the thicknesses of the dielectric element layer and the first semiconductor layer so that the dielectric element isolated semiconductor device having a high breakdown voltage is obtained. Another object of the present invention is to offer a method suitable for manufacturing such a dielectric element isolated semiconductor device.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 6 and 7 are graphs for explaining the first preferred embodiment of the present invention;

DESCRIPTION OF THE PREFERRED EMBODIMENTS

Preferred Embodiments of Dielectric Element Isolated Semiconductor Device

First Preferred Embodiment

Figure 1:
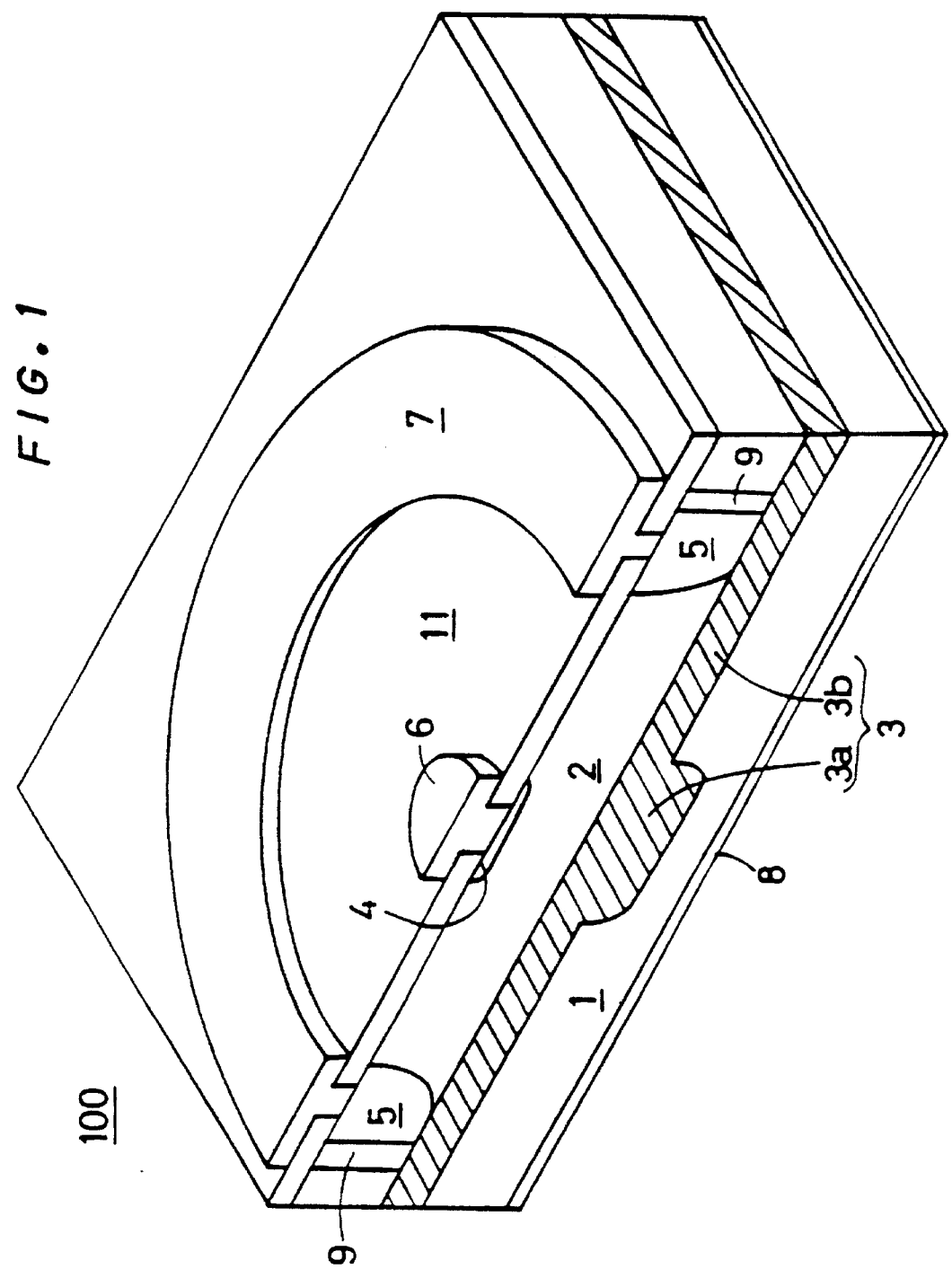
FIG. 1 is a perspective cross sectional view showing a first preferred embodiment of the present invention.
Figure 2:
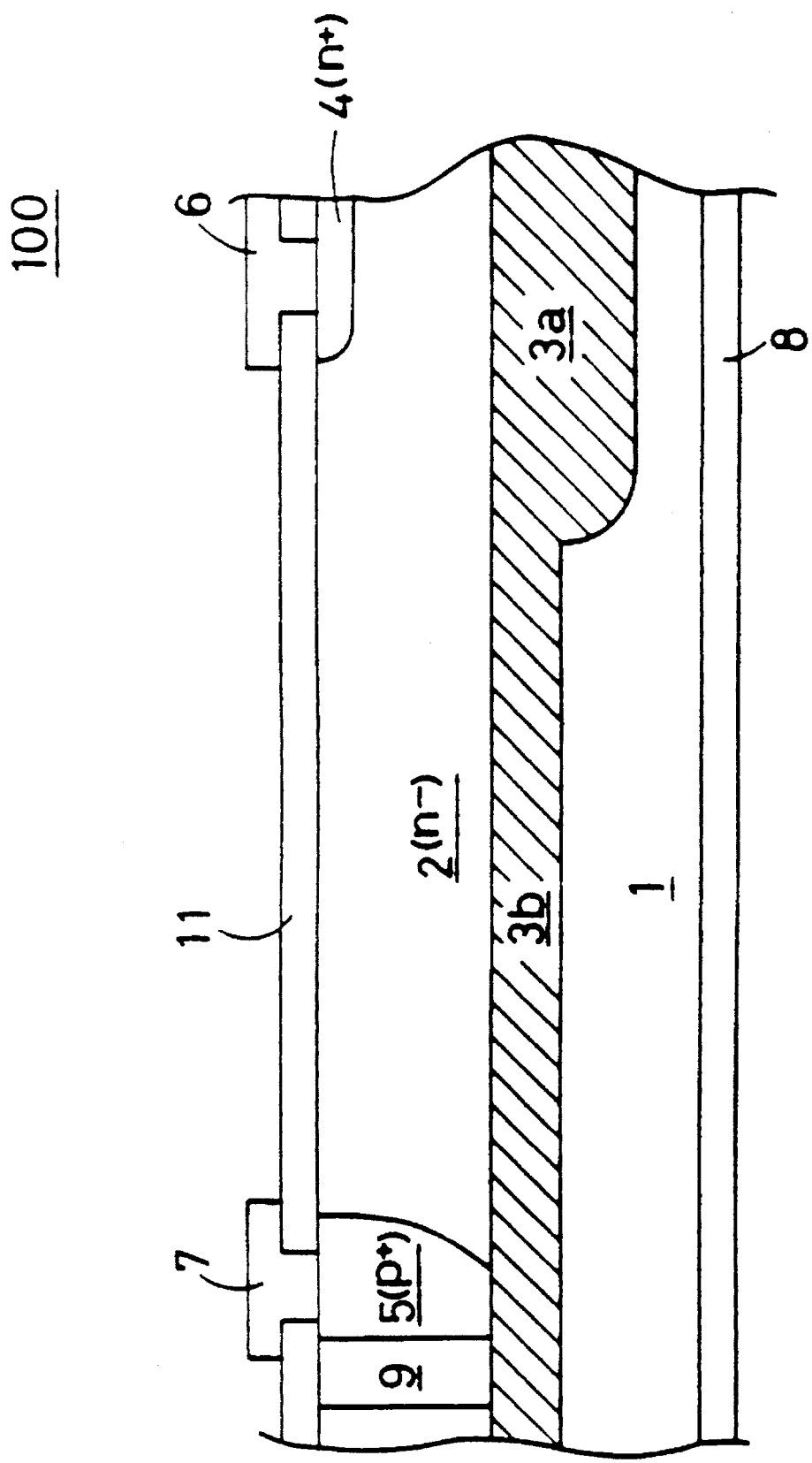
FIG. 2 is a cross sectional view showing the first preferred embodiment of the present invention.

FIGS. 1 and 2 are a perspective cross sectional view and a cross sectional view, respectively, of a dielectric element isolated semiconductor device 100 according to a first preferred embodiment of the present invention. On the top and the bottom surfaces of a semiconductor substrate 1, a dielectric layer 3 and a back surface electrode 8 are disposed, respectively. An $n^-$ type semiconductor layer 2 is formed on the top surface of the dielectric layer 3. The dielectric layer 3 dielectrically isolates the semiconductor substrate 1 from the $n^-$ type semiconductor layer 2. The $n^-$ type semiconductor layer 2 is delineated by an insulation film 9 into a predetermined region.

In the top surface of the $n^-$ type semiconductor layer 2 at the delineated predetermined region, an $n^+$ type semiconductor region 4 having a lower resistance than the $n^-$ type semiconductor layer 2 is formed as if surrounded by a $p^+$ type semiconductor region 5. The $p^+$ type semiconductor region 5 is selectively formed in the top surface of the $n^-$ type semiconductor layer 2.

The $n^+$ type semiconductor region 4 and the $p^+$ type semiconductor region 5 are connected respectively to an electrode 6 and an electrode 7. The electrodes 6 and 7 are insulated from each other by an insulation film 11. Functioning in this preferred embodiment as a cathode electrode and an anode electrode, respectively, the electrodes 6 and 7 will be herein termed "the cathode electrode 6" and "the anode electrode 7."

The dielectric layer 3 consists of a relatively thick first region 3a and a relatively thin second region 3b. The $n^+$ type semiconductor region 4 is situated above the first region 3a and occupies a narrower area than the first region 3a.

Figure 3:
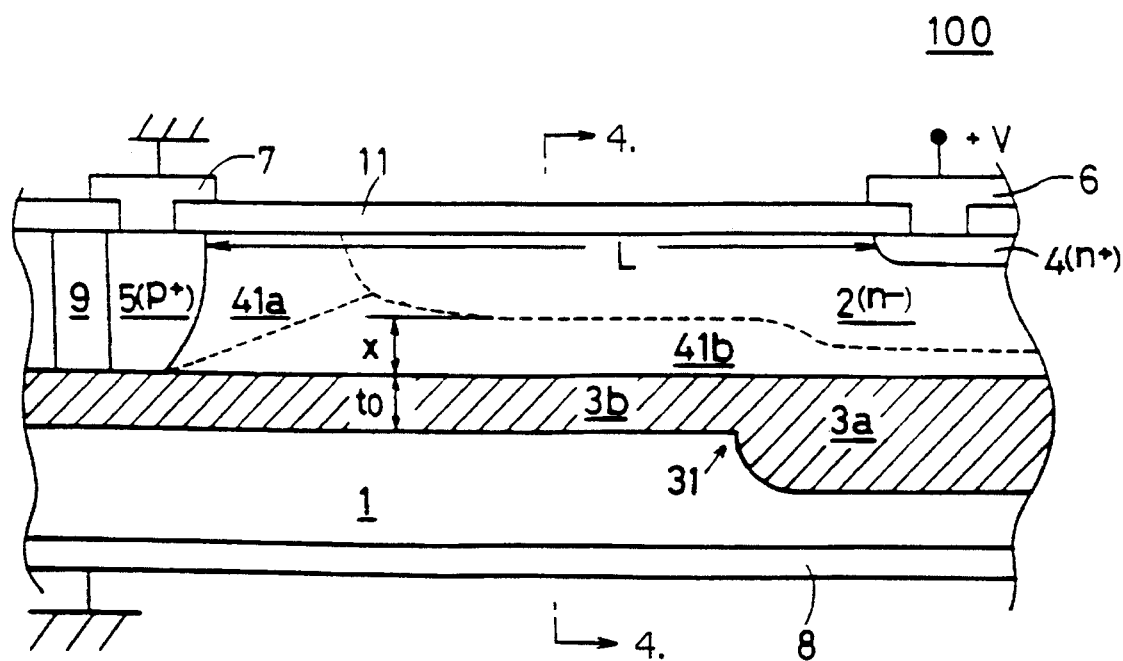
FIG. 3 is a cross sectional view for explaining the first preferred embodiment of the present invention.

FIG. 3 is a cross sectional view showing operations of the dielectric element isolated semiconductor device 100. When the anode electrode 7 and the back surface electrode 8 are both kept at 0 V and a gradually increasing positive voltage is applied to the cathode electrode 6, a depletion layer 41a grows from a pn junction between the $n^-$ type semiconductor layer 2 and the $p^+$ type semiconductor region 5. When this happens, since the semiconductor substrate 1 serves through the dielectric layer 3 as a field plate, in addition to the depletion layer 41a, another depletion layer 41b extends from an interface between the $n^-$ type semiconductor layer 2 and the dielectric layer 3 toward the top surface of the $n^-$ type semiconductor layer 2. Hence, the RESURF effect arises which relieves field concentration at the pn junction between the $n^-$ type semiconductor layer 2 and the $p^+$ type semiconductor region 5. In order to obviate field concentration, the dielectric layer 3 preferably has a smooth edge at a boundary 31 between the first and the second regions 3a and 3b.

Figure 4:
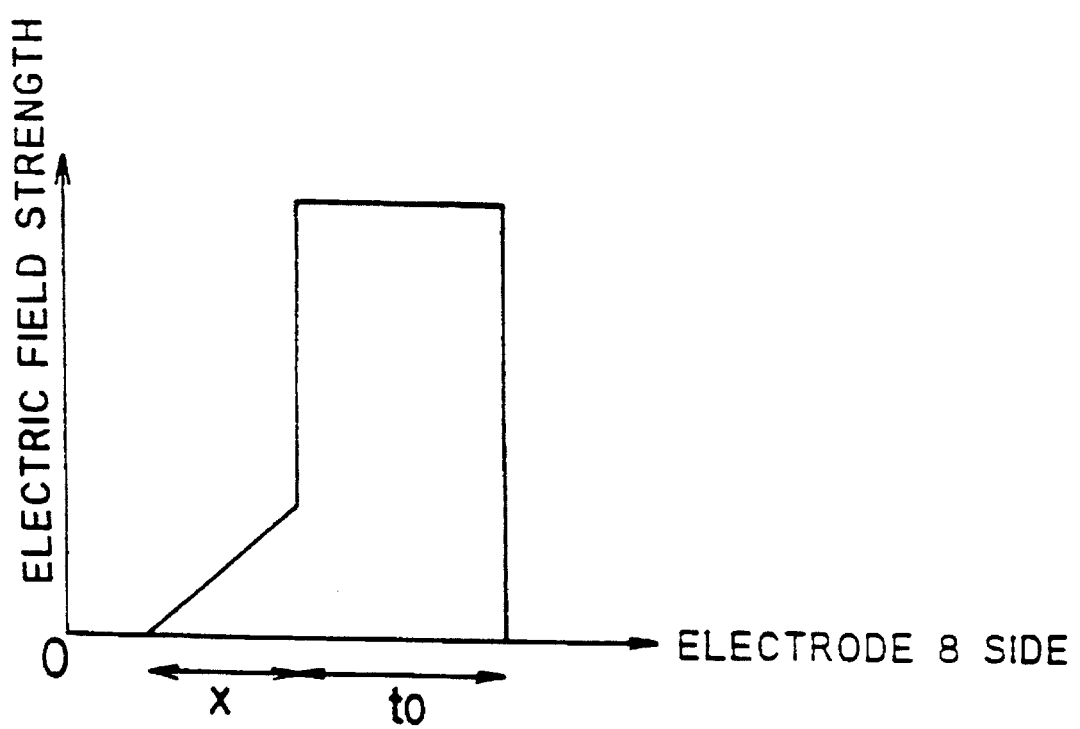
FIG. 4 is a graph for explaining the first preferred embodiment of the present invention.

FIG. 4 shows dependence of the electric field strength in a downward direction traversing the thickness of the semiconductor device on the thickness of the device, the dependence being taken at a point enough far from the $p^+$ type semiconductor region 5, i.e., at an A—A cross section of FIG. 3. In the graph, the thickness (growth) of the depletion layer 41b is x, the thickness of the dielectric layer 3 is $t_0$, and the origin of the lateral axis is the top surface of the n⁻ type semiconductor layer 2.

Likewise in the dielectric element isolated semiconductor device 200, the full voltage drop V at the A—A cross section is expressed as Eq. 1. That is, even if the full voltage drop V is equal, as the thickness $t_0$ of the dielectric layer 3 increases, the growth x of the depletion layer 41b becomes small, puncturing the RESURF effect.

On the other hand, under a condition where there will not be avalanche breakdown due to neither field concentration at the pn junction between the n⁻ type semiconductor layer 2 and the p⁺ type semiconductor region 5 nor field concentration at an interface between the n⁻ type semiconductor layer 2 and the n⁺ type semiconductor region 4, it is the avalanche breakdown which is caused by field concentration at the interface between the n⁻ type semiconductor layer 2 and the dielectric layer 3 immediately under the n⁺ type semiconductor region 4 that eventually determines the breakdown voltage of the semiconductor device 100. To obtain the semiconductor device 100 which satisfies this condition, the distance L between the p⁺ type semiconductor region 5 and the n⁺ type semiconductor region 4 has to be long enough and the thickness d and the impurity concentration N of the n⁻ type semiconductor layer 2 have to be optimum. For example, the distance L is set at 100 to 300 μm.

Figure 5:
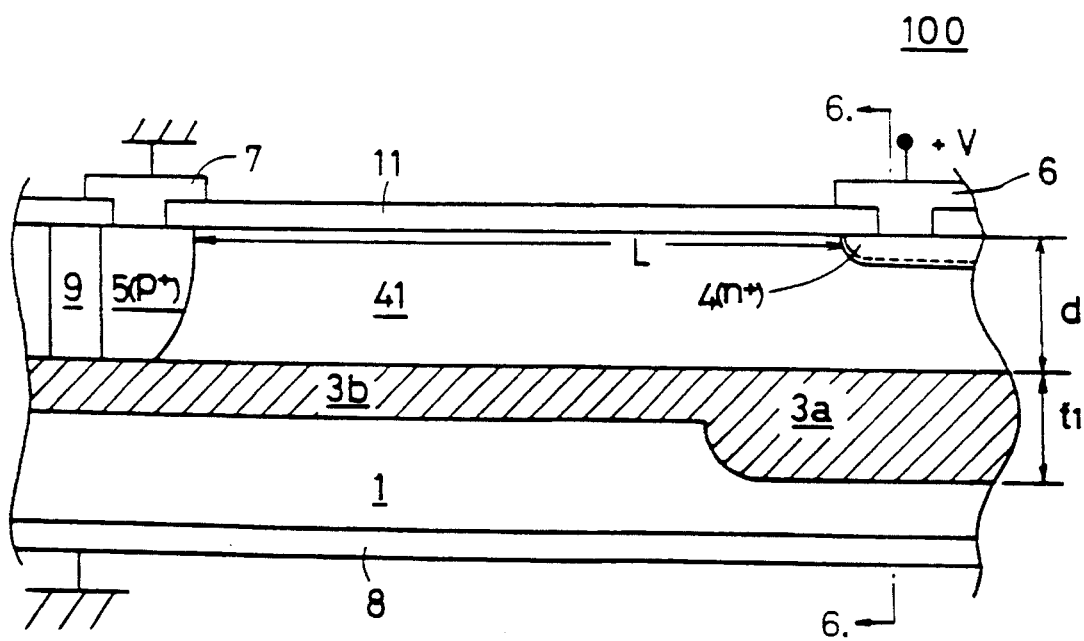
FIG. 5 is a cross sectional view for explaining the first preferred embodiment of the present invention.

FIG. 5 is a cross sectional view showing operations of the dielectric element isolated semiconductor device 100 which satisfies such a condition above. It is a general knowledge that field concentration created at the interface between the n⁻ type semiconductor layer 2 and the dielectric layer 3 satisfies the avalanche condition precisely when the n⁻ type semiconductor layer 2 has been depleted from its interface with the dielectric layer 3 to its surface. In FIG. 5, the depletion layer 41 has reached the n⁺ type semiconductor region 4, completely depleting the n⁻ type semiconductor layer 2.

The breakdown voltage V under such a condition is a full voltage drop of a direction of the thickness taken immediately under the n⁺ type semiconductor region 4, i.e., at a B—B cross section of FIG. 5. That is, where the thickness of the n⁺ type semiconductor region 4 is not considered, the breakdown voltage V is given as:

$$V=E_{cr} \cdot (d/2 + \epsilon_2 \cdot t_1 / \epsilon_3) \quad (6)$$

where $t_1$: thickness of dielectric layer at first region 3a [cm]

This relation is equivalent to Eq. 2, which concerns the conventional dielectric element isolated semiconductor device 200, as modified by substituting $t_0$ with $t_1$.

Figure 6:
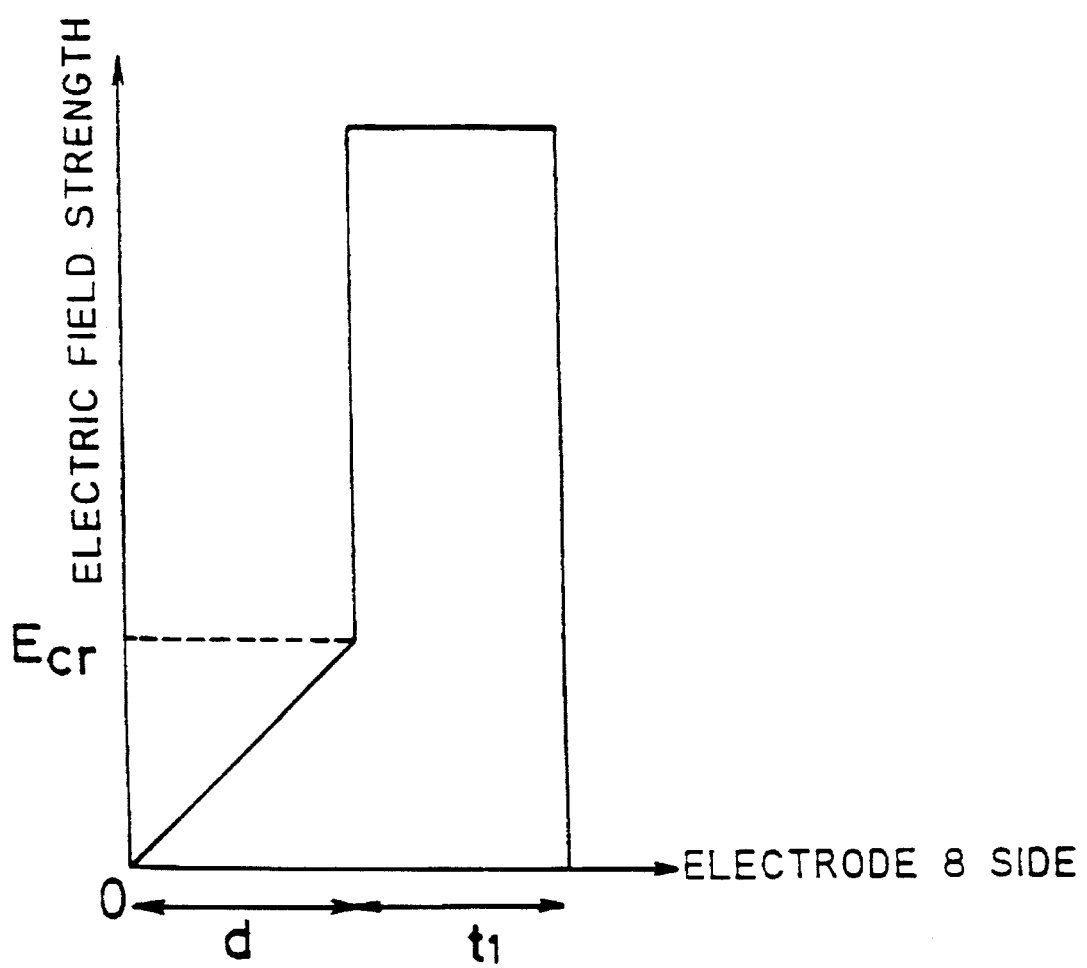

FIG. 6 shows dependence of the electric field strength in a downward direction traversing the thickness of the device on the thickness of the device taken at the B—B cross section. As shown in the graph, the critical electrical field $E_{cr}$ is reached at the interface between the n⁻ type semiconductor layer 2 and the dielectric layer 3 (i.e., at a distance d from the origin toward the electrode 8).

Thus, as can be understood from Eqs. 1 and 6, by setting the thickness $t_0$ of the dielectric layer 3 relatively thin at the second region 3b aiming at no punctuation of the RESURF effect and by setting the thickness $t_1$ of the dielectric layer 3 relatively thick at the first region 3a aiming at increasing voltage drop, the breakdown voltage is better enhanced than in the conventional device.

FIG. 7 is a graph showing simulation of an increase in the breakdown voltage with an increase in the thickness of the dielectric layer 3 at the first region 3a. The thickness $t_i$ of the dielectric layer 3 at the second region 3b is fixed at 4 μm and the specific inductive capacity $\epsilon_3$, thereat is fixed at 3.9 (which corresponds to that of a silicon oxide film). As to the n⁻ type semiconductor layer 2, the thickness d and the specific inductive capacity $\epsilon_2$ are fixed at 4 μm and 11.7 (which corresponds to that of silicon). The first region 3a is assumed to be a circle radius of which is 40 μm and the n⁺ type semiconductor region 4 immediately on the first region 3a is assumed to be a circle having a radius of 10 μm. If the thickness $t_1$ at the first region 3a is 4 μm, the dimensions correspond to those of the conventional dielectric element isolated semiconductor device.

As readily seen in the graph, as the thickness $t_1$ of the dielectric layer 3 at the first region 3a increases, the breakdown voltage exhibits an approximately linear increase. This is a proof of the effect of the first preferred embodiment.

Second Preferred Embodiment

Figure 8:
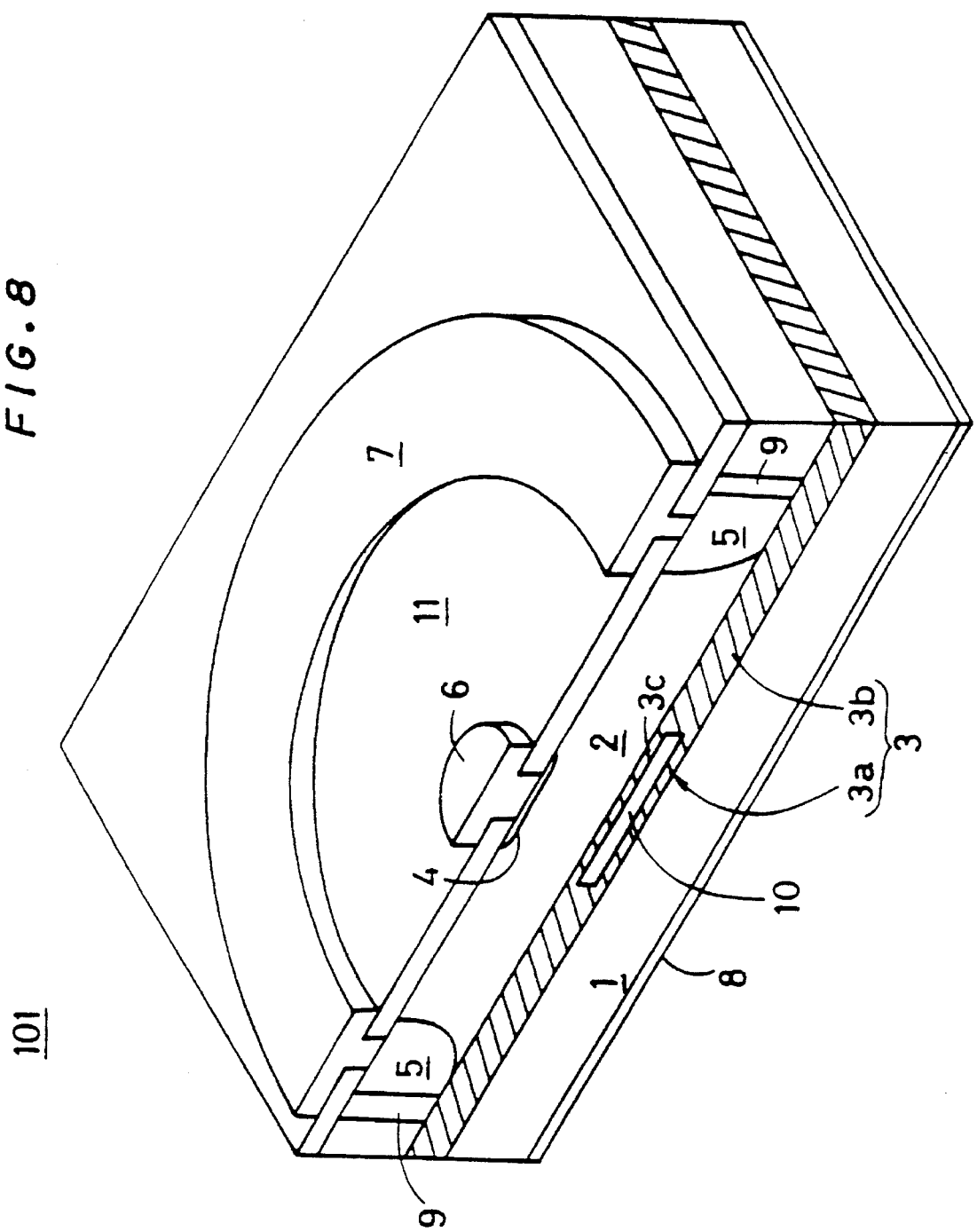
FIG. 8 is a perspective cross sectional view showing a second preferred embodiment of the present invention.
Figure 9:
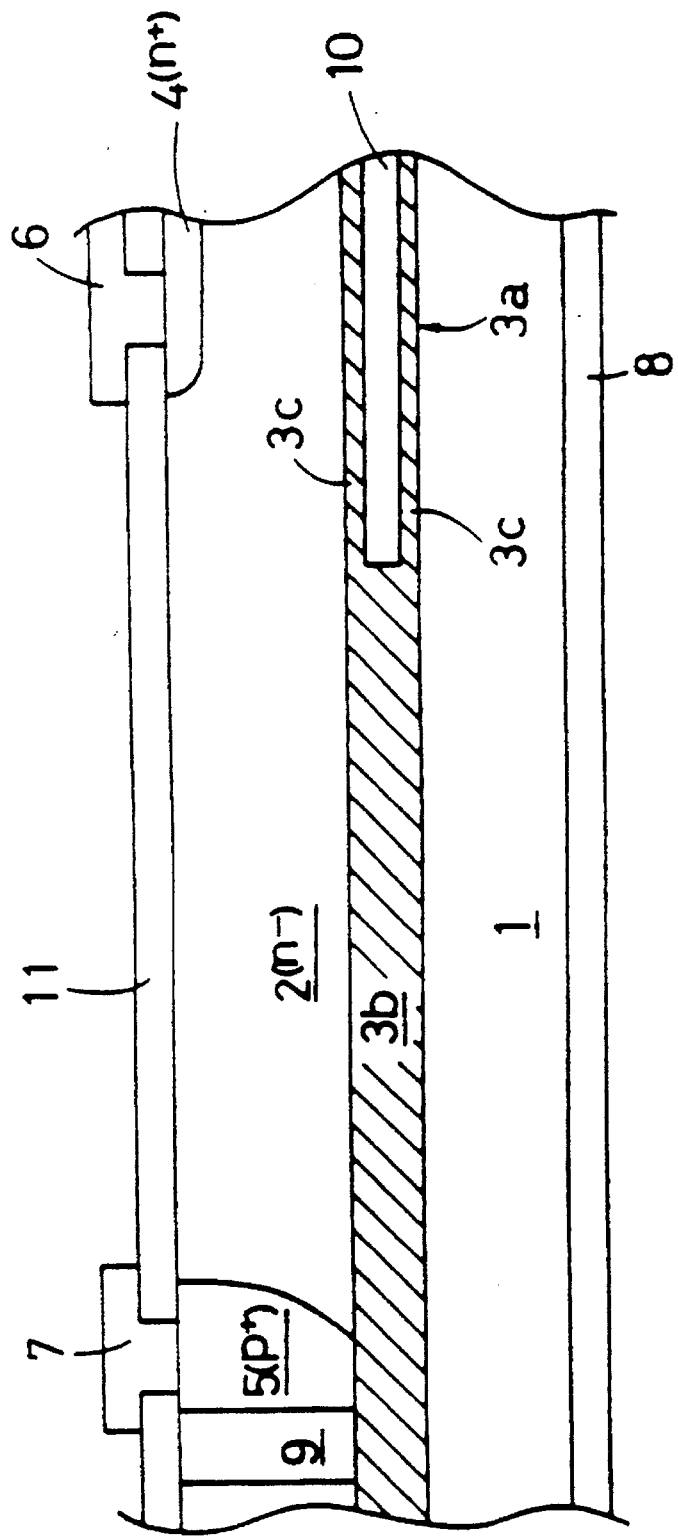
FIG. 9 is a cross sectional view showing the second preferred embodiment of the present invention.

FIGS. 8 and 9 are a perspective cross sectional view and a cross sectional view, respectively, of a dielectric element isolated semiconductor device 101 according to a second preferred embodiment of the present invention. The semiconductor substrate 1, the n⁻ type semiconductor layer 2, the dielectric layer 3, both as it is and in terms of its first and second regions 3a and 3b, the n⁺ type semiconductor region 4, the p⁺ type semiconductor region 5, the electrodes 6 and 7, the back surface electrode 8 and the insulation film 9 are located as they are disposed in the first preferred embodiment. In this preferred embodiment, too, the electrodes 6 and 7 serve respectively as a cathode electrode and an anode electrode, and therefore, the electrodes 6 and 7 will be referred to as "the cathode electrode 6" and "the anode electrode 7."

In the first region 3a, the dielectric layer 3 includes a stack structure in which dielectric element strips 3c and 10 are stacked one atop the other. In the second preferred embodiment, the dielectric element strip 10 is an air-filled hollow or a vacuumed hollow.

Figure 10:
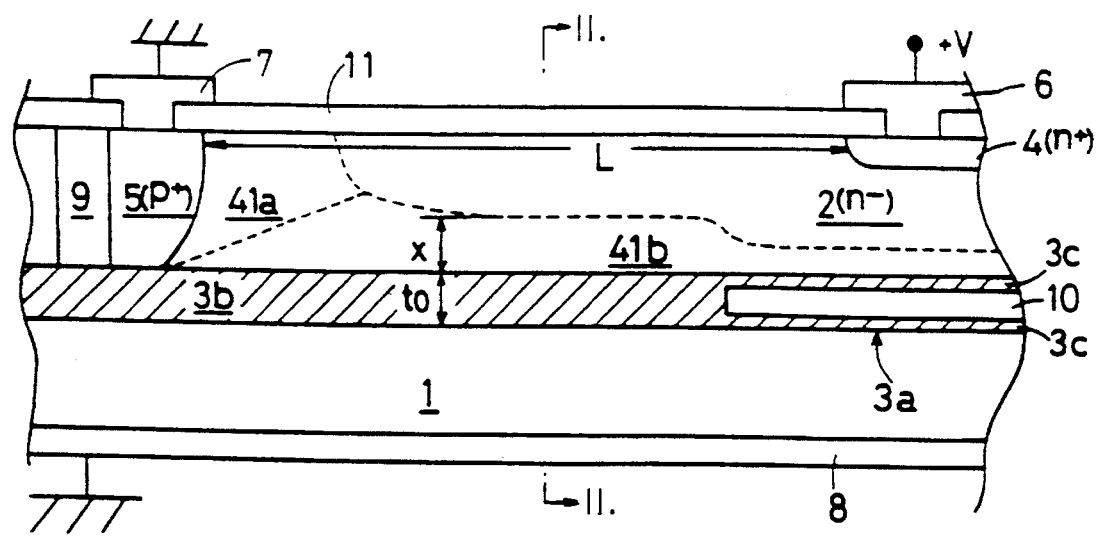
FIG. 10 is a cross sectional view for explaining the second preferred embodiment of the present invention.

FIG. 10 is a cross sectional view showing operations of the dielectric element isolated semiconductor device 101. When the anode electrode 7 and the back surface electrode 8 are both kept at 0 V and a gradually increasing positive voltage is given to the cathode electrode 6, similarly to the first preferred embodiment, due to the RESURF effect, electric field at the pn junction between the n⁻ type semiconductor layer 2 and the p⁺ type semiconductor region 5 is relieved.

Figure 11:
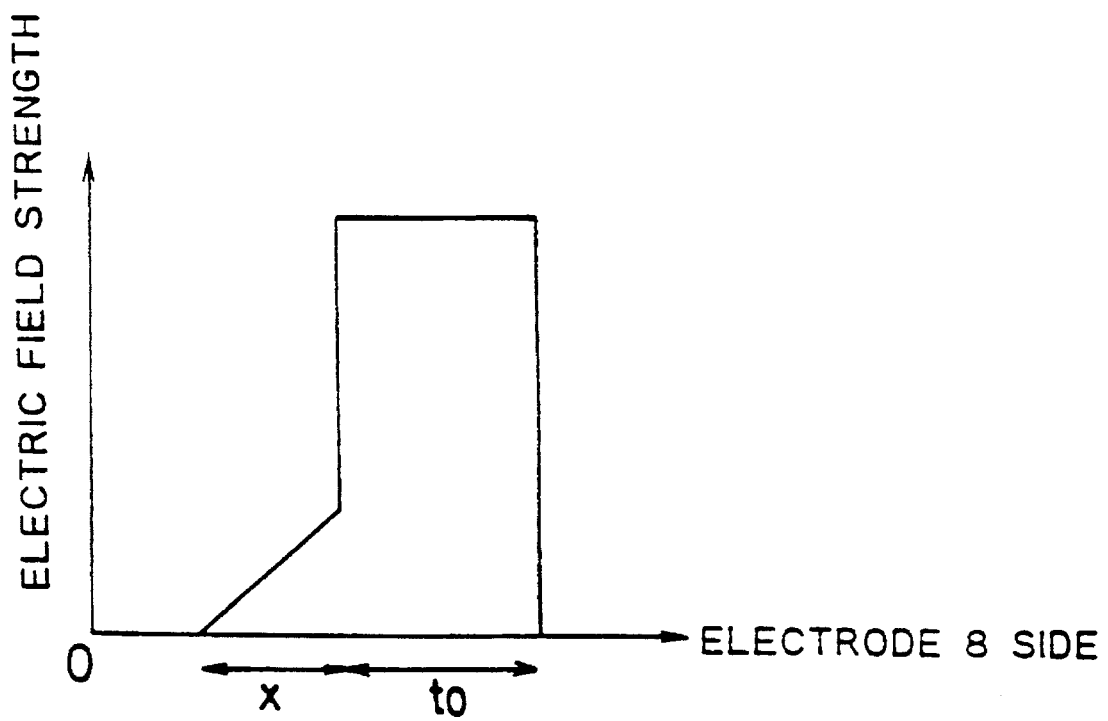
FIG. 11 is a graph for explaining the second preferred embodiment of the present invention.
Figure 55:
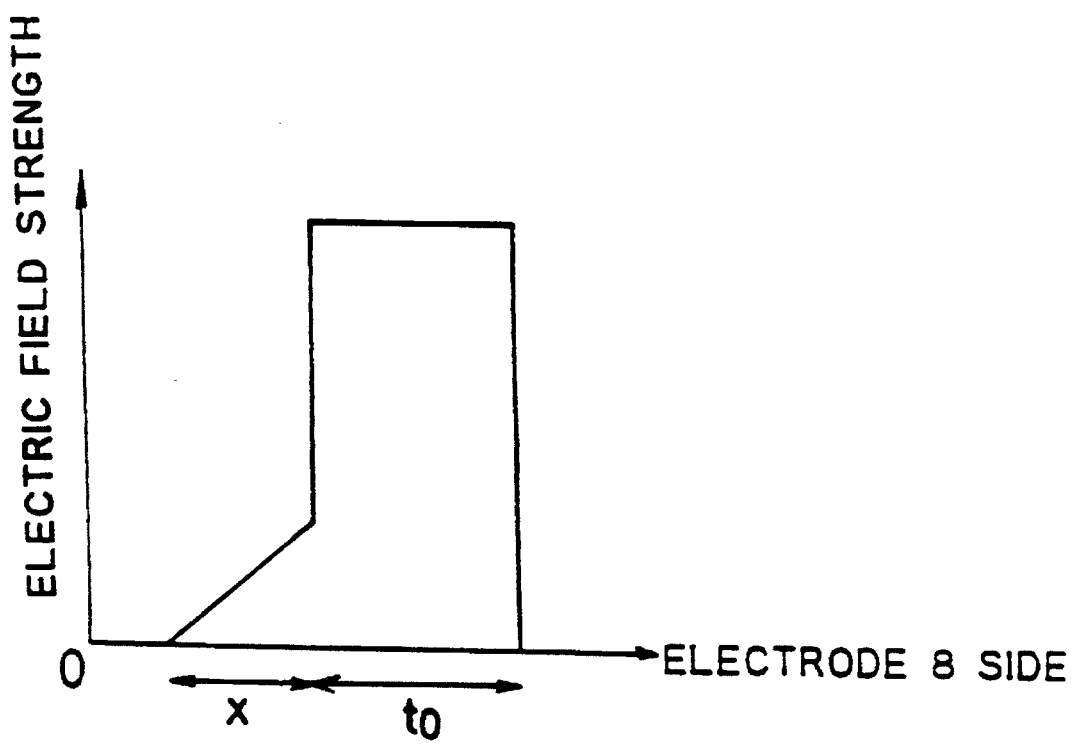
FIG. 55 is a graph showing the conventional technique.
Figure 56:
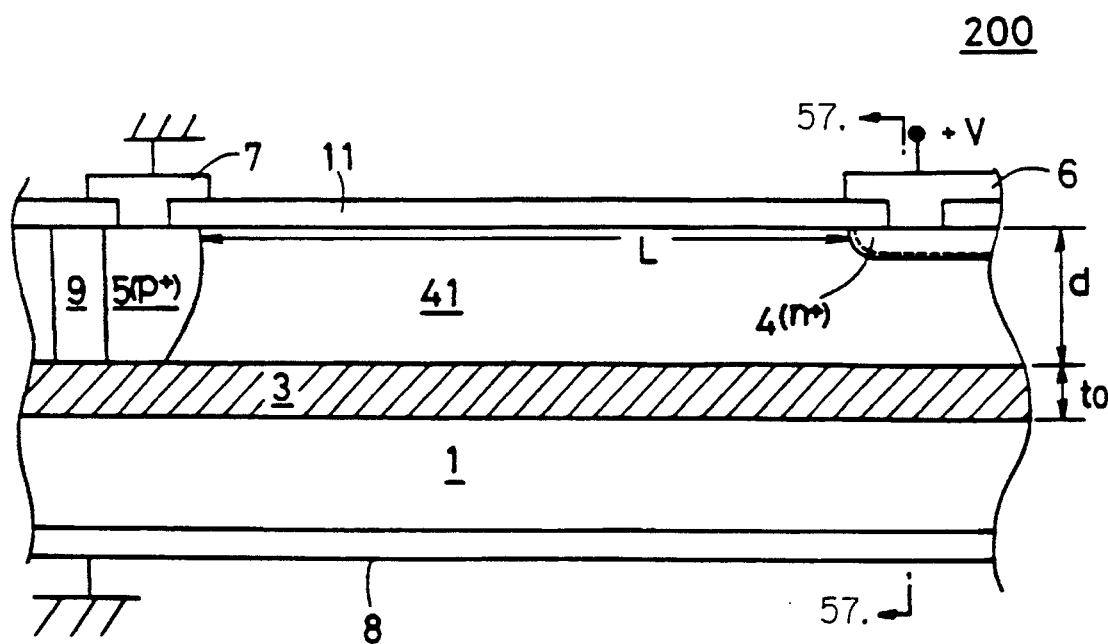
FIG. 56 is a cross sectional view showing the conventional technique.
Figure 57:
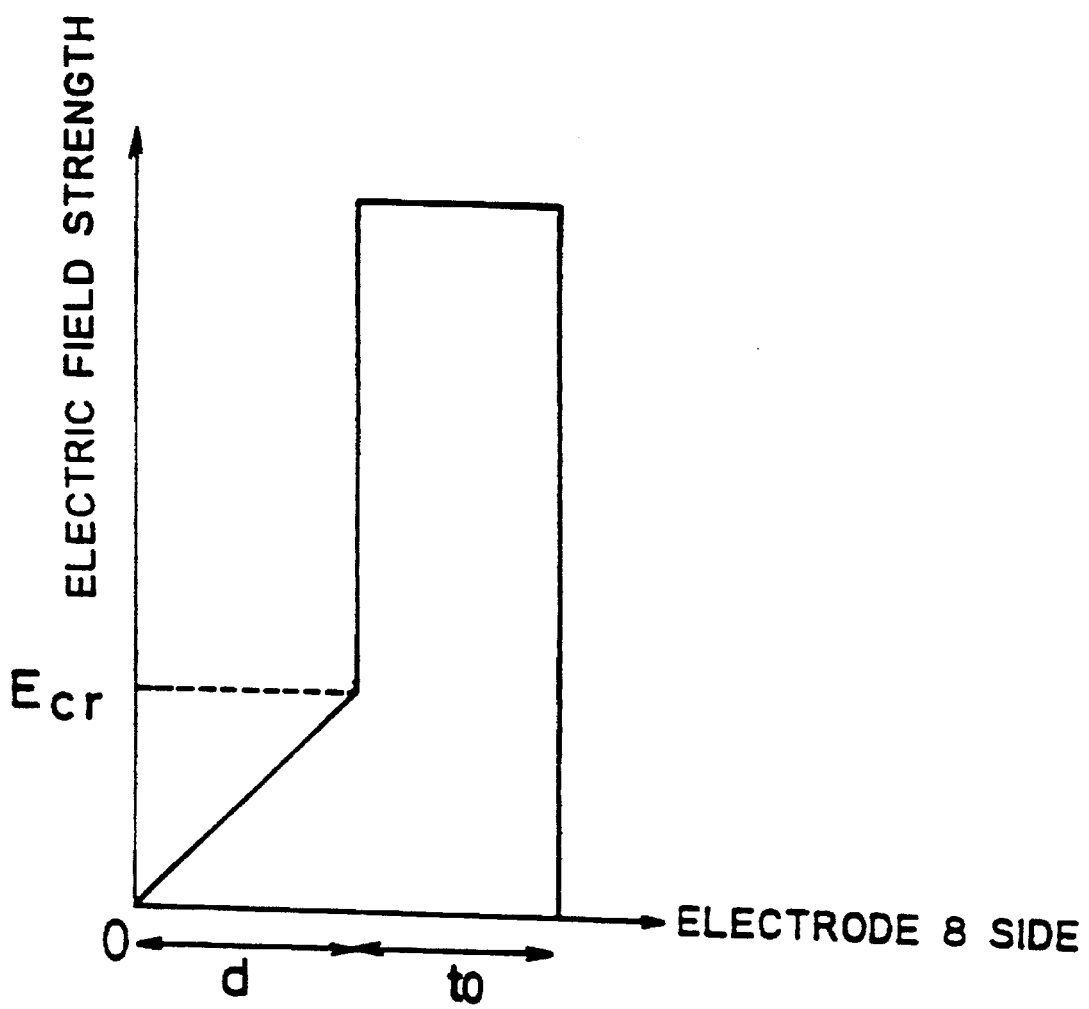
FIG. 57 is a graph showing the conventional technique.

FIG. 11 shows dependence of the electric field strength in a downward direction traversing the thickness of the semiconductor device on the thickness of the device, the dependence being taken at a point enough far from the p⁺ type semiconductor region 5, i.e., at a C—C cross section of FIG. 10. Likewise in the dielectric element isolated semiconductor device 200, the full voltage drop V at the C—C cross section is expressed as Eq. 1. Therefore, the graphs of FIGS. 11 and 55 are the same.

As is done in the first preferred embodiment, by separating the p⁺ type semiconductor region 5 from the n⁺ type semiconductor region 4 by a sufficiently long distance L and by optimizing the thickness d and the impurity concentration N of the n⁻ type semiconductor layer 2, avalanche breakdown is prevented which would be otherwise caused because of the field concentration at the pn junction between the n⁻ type semiconductor layer 2 and the p⁺ type semiconductor region 5 and the field concentration at an interface between the n⁻ type semiconductor layer 2 and the n⁺ type semiconductor region 4. Hence, it is possible that the breakdown voltage of the dielectric element isolated semiconductor device 101 is determined eventually by avalanche breakdown which is caused by the field concentration at the interface between the n⁻ type semiconductor layer 2 and the dielectric layer 3 immediately under the n⁺ type semiconductor region 4.

Figure 12:
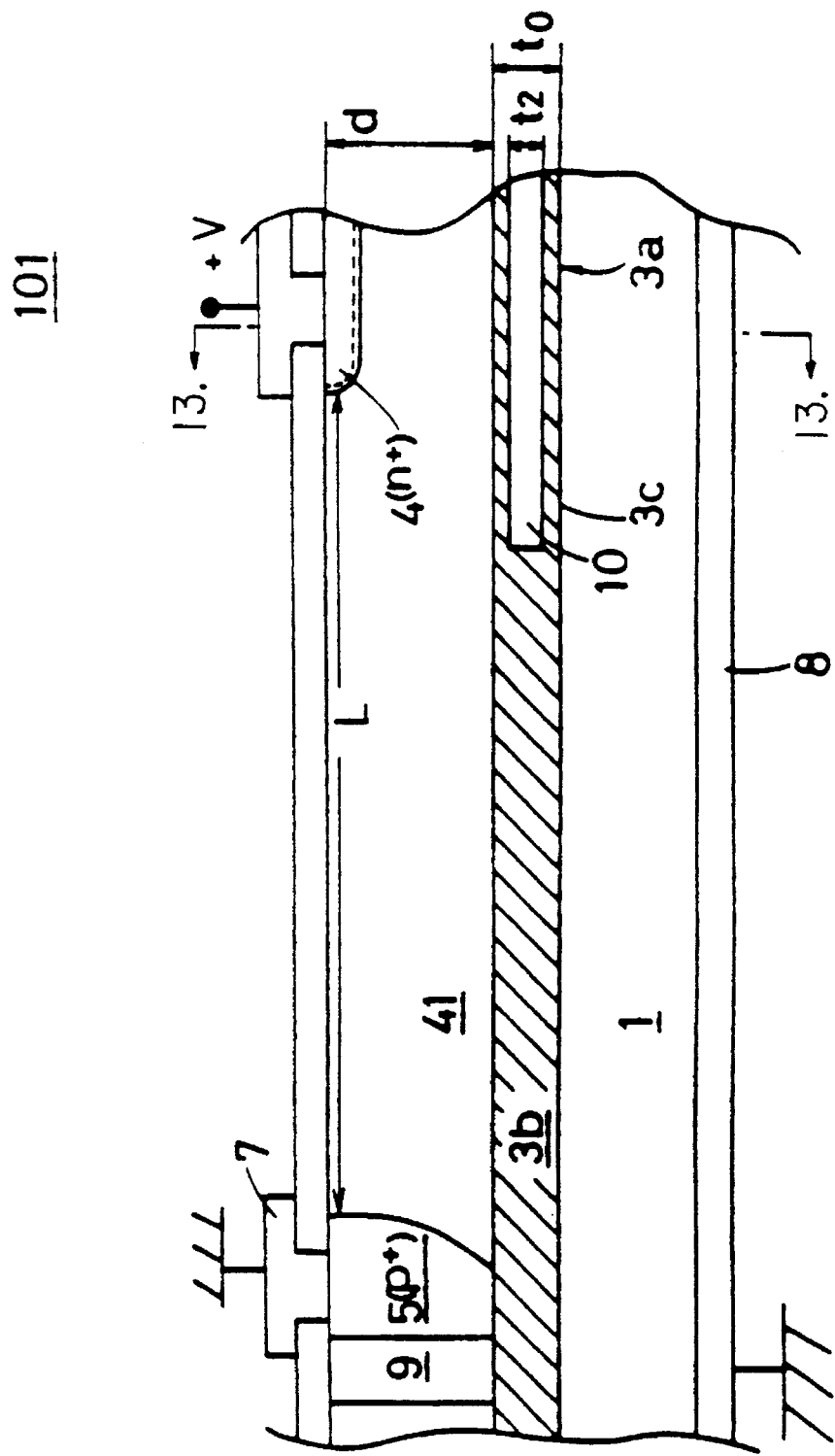
FIG. 12 is a cross sectional view for explaining the second preferred embodiment of the present invention.

FIG. 12 is a cross sectional view showing operations of the dielectric element isolated semiconductor device 101 under the condition above. As mentioned earlier in relation to the first preferred embodiment, it is known that where the n⁻ type semiconductor layer 2 has been depleted from its interface with the dielectric layer 3 to its surface, conditions determining the breakdown voltage become optimum if the field concentration created at the interface between the n⁻ type semiconductor layer 2 and the dielectric layer 3 precisely satisfies the avalanche condition, in which case, the breakdown voltage V is given as:

$$V = E_{cr} \cdot (d/2 + \epsilon_2 \cdot t_1/\epsilon_3 + \epsilon_2 \cdot t_2/\epsilon_{10}) \quad (7)$$

where $t_1 (= t_0 - t_2)$: thickness of dielectric element strip 3 at first region 3a $t_2$: thickness of dielectric element strip 10 [cm]

$\epsilon_{10}$: specific inductive capacity of dielectric element strip 10

Eq. 7 assumes that the thickness $t_1$ of the dielectric element strip 3c is the sum of the thicknesses of its two portions sandwitching the dielectric element strip 10.

Figure 13:
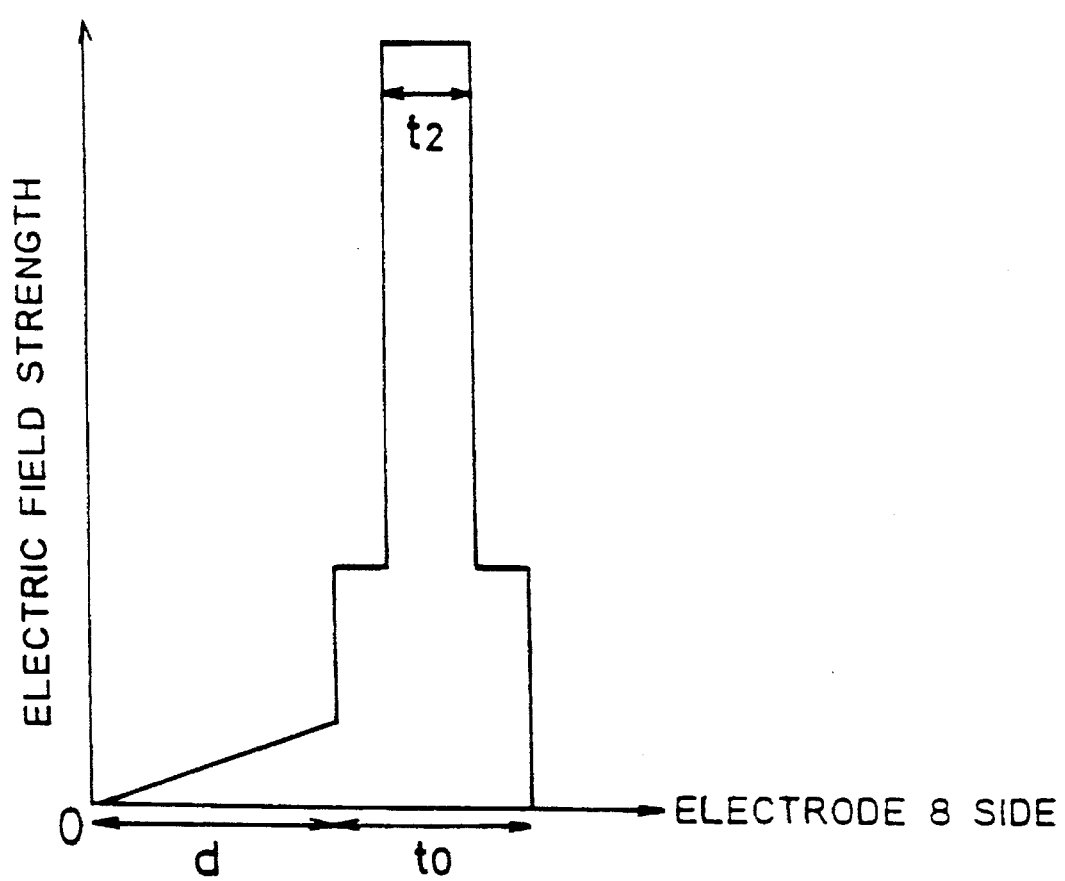
FIGS. 13 and 14 are graphs for explaining the second preferred embodiment of the present invention.

FIG. 13 shows dependence of the electric field strength in a downward direction traversing the thickness of the semiconductor device on the thickness of the device, the dependence being taken immediately under the n⁺ type semiconductor region 4, i.e., at a D—D cross section of FIG. 12. Since the specific inductive capacity $\epsilon_{10}$ within the dielectric element strip 10 (the portion with a width $t_2$) is lower than the specific inductive capacity $e_3$ of the dielectric element strip 3c, the electric field strength becomes high. Hence, even if the sum of the thicknesses of the dielectric element strips 3c and 10 ($t_1 + t_2$) at the first region 3a is equal to the thickness to at the second region 3b, that is, even if the dielectric element isolated semiconductor device 101 seems identical to the conventional dielectric element isolated semiconductor device 200 in regard with the thickness alone, the dielectric element isolated semiconductor device 101 has an enhanced breakdown voltage.

In other words, as Eqs. 1 and 7 indicate, by setting the specific inductive capacity of the dielectric layer 3 relatively high at the second region 3b to thereby ensure no reduction of the RESURF effect and by setting the substantial specific inductive capacity of the dielectric layer 3 relatively low at the first region 3a, voltage drop is enhanced, and therefore, the breakdown voltage is better enhanced than in the conventional semiconductor device.

From comparison of Eq. 2 with Eq. 6 or Eq. 2 with Eq. 7, the invention takes effect when a value obtained by dividing the thickness of the dielectric layer 3 by the specific inductive capacity of the dielectric layer 3 taken at the first region 3a is greater than the one taken at the second region 3b. This is verified by studying the simulation result about the second preferred embodiment in light of the simulation result about the first preferred embodiment (FIG. 7).

Figure 14:
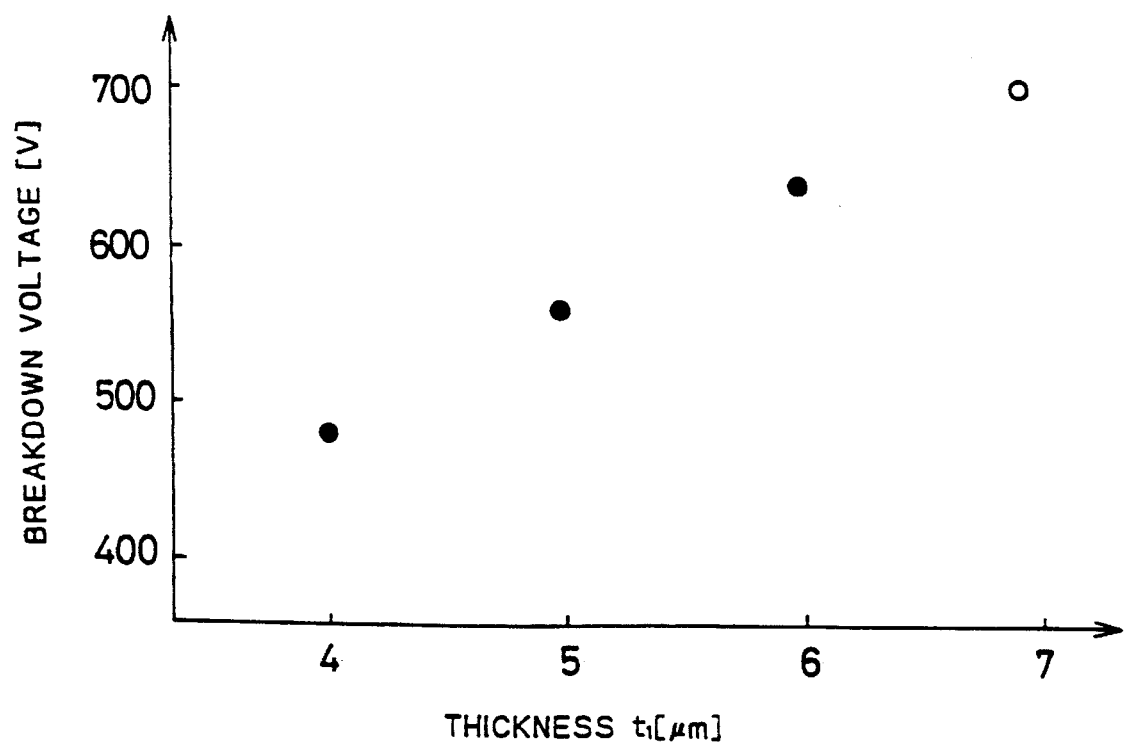

FIG. 14 is a graph showing simulated effects of the second preferred embodiment together with simulated effects of the first preferred embodiment shown in FIG. 7. The simulated effects of the first preferred embodiment are indicated at black dots and those of the second preferred embodiment are indicated a white dot. The thickness $t_0$ and the specific inductive capacity $\epsilon_3$ of the dielectric layer 3 at the second region 3b are fixed as those shown in FIG. 7 and so are the thickness d and the specific inductive capacity $e_2$ of the n⁻ type semiconductor layer 2. The first region 3a is assumed to be a circle having a radius of 40 μ, the thickness of the dielectric element strip 10 is assumed 1 μm, and the thickness of the dielectric element strips 3c are assumed 3 μm. The n⁺ type semiconductor region 4 immediately on the first region 3a is assumed to be a circle having a radius of 10 μm.

Applying the simulated results to where the specific inductive capacity of the dielectric element strip 10 is 1 (that is, the dielectric element strip 10 is a hollow space) and the dielectric layer 3 is formed at any portion thereof by a silicon oxide film which has a specific inductive capacity of 3.9, from Eq. 7, the thickness of the dielectric layer 3 at the first region 3a is found 3+(1×3.9)=6.9 [μm]. This means that the second preferred embodiment corresponds to the first preferred embodiment as modified such that the thickness $t_1$ of the dielectric layer 3 at the first region 3a is 6.9 μm. This is why the simulated effects of the second preferred embodiment are plotted in FIG. 14 at a point at which the thickness $t_1$ is 69 μm (white dot). In FIG. 14, the simulated effects of the second preferred embodiment are approximately on a line drawn through the simulated effects of the first preferred embodiment (black dots), supporting the conclusion above that it is possible to verify the effects of the present invention by finding the value obtained by dividing the thickness of the dielectric layer 3 by the specific inductive capacity of the dielectric layer 3.

Third Preferred Embodiment

As explained in relation to the second preferred embodiment in the end, the effects of the present invention are better realized by reducing the specific inductive capacity in the first region 3a while increasing the thickness in the first region 3a.

Figure 15:
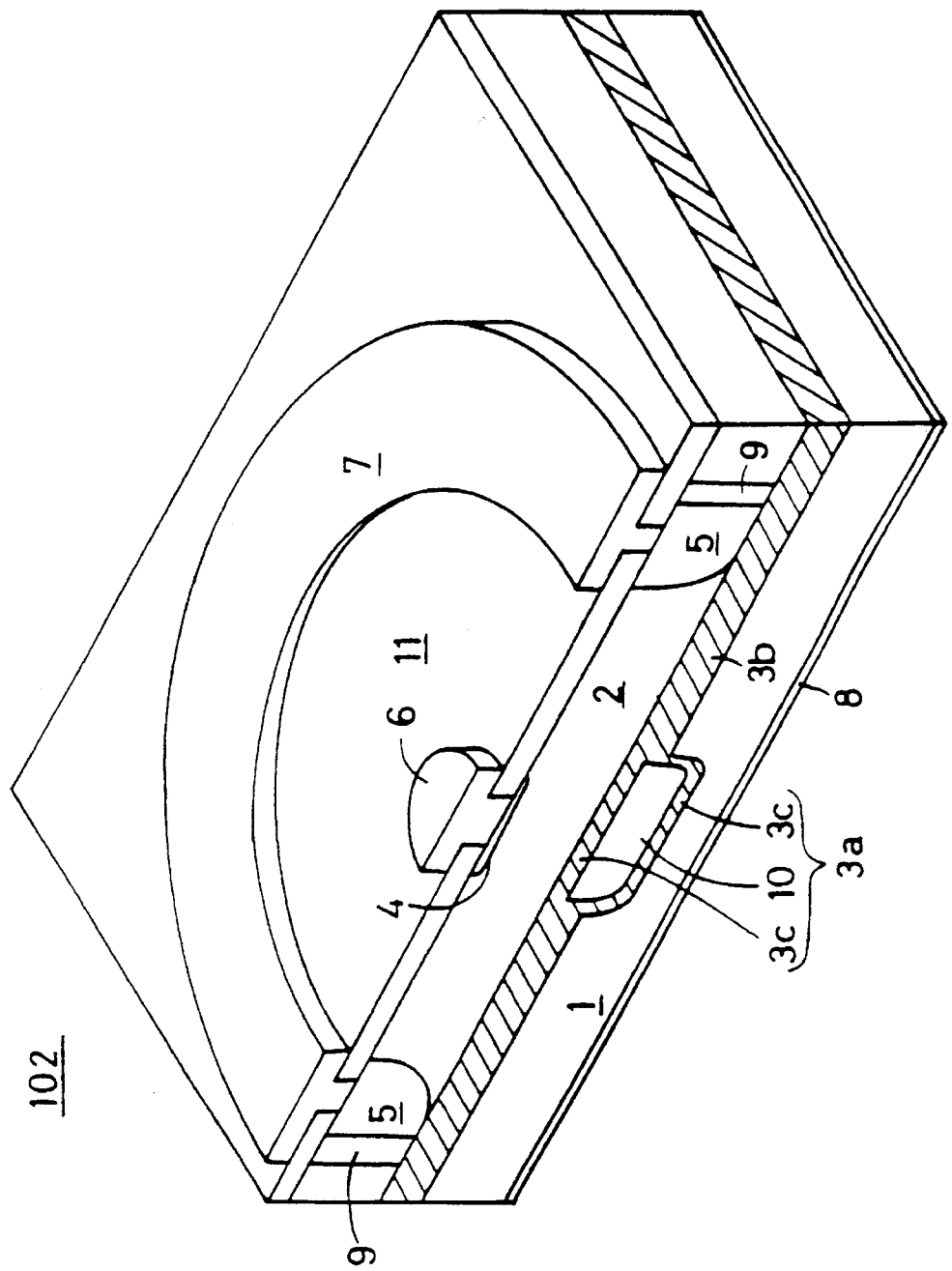
FIG. 15 is a perspective cross sectional view showing a third preferred embodiment of the present invention.
Figure 16:
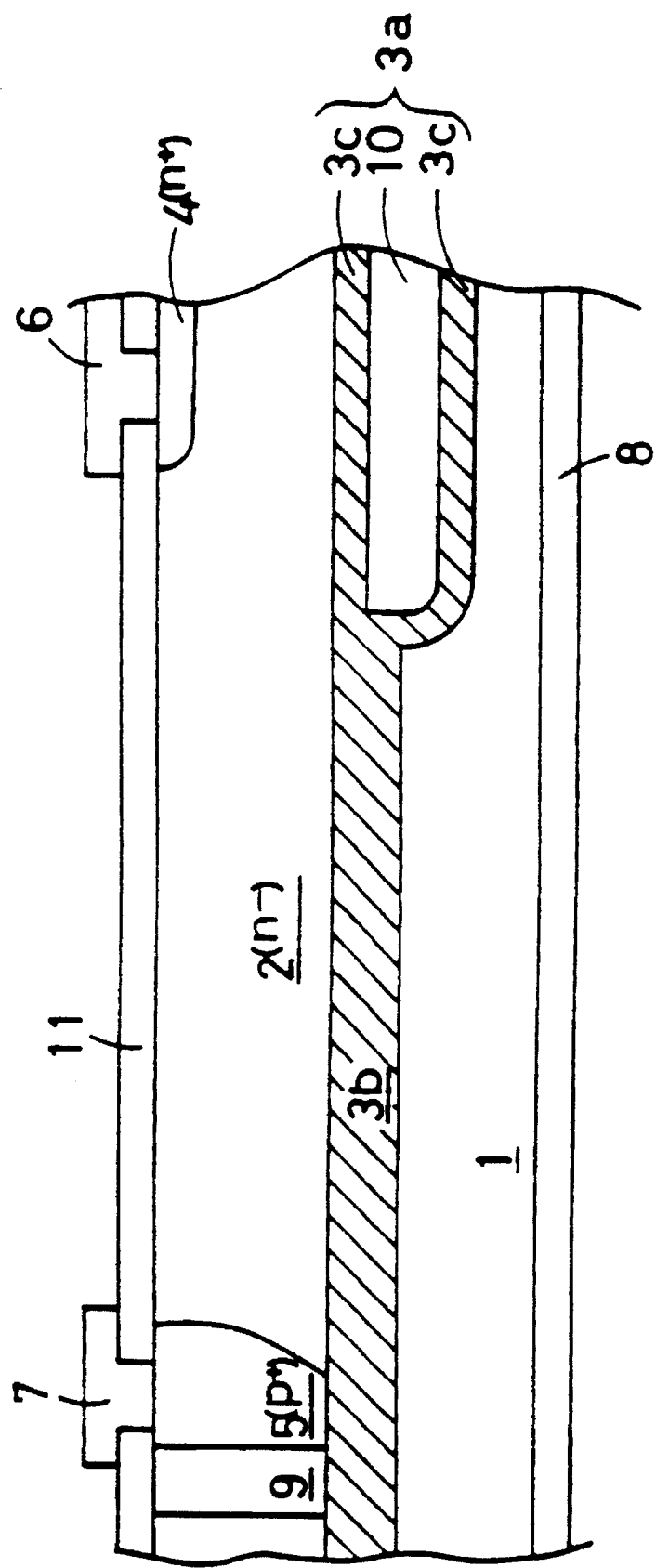
FIG. 16 is a cross sectional view showing the third preferred embodiment of the present invention.

FIGS. 15 and 16 are a perspective cross sectional view and a cross sectional view, respectively, of a dielectric element isolated semiconductor device 102 according to a third preferred embodiment of the present invention. The dielectric element strip 10 is a hollow formed inside the dielectric layer 3 immediately under the n⁺ type semiconductor region 4 in such a manner that the dielectric element strip 10 occupies a larger space than the n⁺ type semiconductor region 4. The semiconductor substrate 1, the n⁻ type semiconductor layer 2 the dielectric layer 3, both as it is and in terms of its first and second regions 3a and 3b, the n⁺ type semiconductor region 4, the p⁺ type semiconductor region 5, the electrodes 6 and 7, the back surface electrode 8 and the insulation film 9 are located as they are disposed in the first and the second preferred embodiments. In the third preferred embodiment, too, the electrodes 6 and 7 serve respectively as a cathode electrode and an anode electrode.

The third preferred embodiment requires that the dielectric layer 3 includes at the first region 3a a stack structure in which dielectric element strips 3c and 10 are superimposed one atop the other so that the sum of the thicknesses of the dielectric element strips 3c and 10 ($t_1 + t_2$) is greater than the thickness $t_0$ of the dielectric layer 3 at the second region 3b.

Hence, the semiconductor device according to the third preferred embodiment operates in the same manner as the semiconductor device according to the second preferred embodiment operates. Since the sum of the thicknesses ($t_1 + t_2$) is larger than the thickness to, the dielectric element isolated semiconductor device 102 has a breakdown voltage equal to or larger than that of the dielectric element isolated semiconductor device 101.

Preferred Embodiments of Manufacturing Method of Dielectric Element Isolated Semiconductor Device During fabrication of any of the dielectric element isolated semiconductor devices of the first to the third preferred embodiments, the $n^+$ type semiconductor region 4 has to be formed above the first region 3a. However, because of the existence of the $n^-$ type semiconductor layer 2, it is difficult to align the first region 3a while directly observing the same. According to fourth to sixth preferred embodiments, a third region is formed which has a similar structure to that of the first region 3a. By exposing the third region and using the same as a reference element for alignment, the first region 3a is registered with the $n^+$ type semiconductor region 4 in an easy manner.

Fourth Preferred Embodiment

The fourth preferred embodiment aims at offering a method of first preferred embodiment. FIGS. 17 to 22 are cross sectional views of the manufacturing the dielectric element isolated semiconductor device 100 of the dielectric element isolated semiconductor device 100 during successive stages in the process of fabrication therefor.

First, the semiconductor substrate 1 is selectively etched to form concave surfaces 1a and 1d. The semiconductor substrate 1 is then joined, the concave surfaces 1a and 1d in, to an $n^-$ type semiconductor substrate 30. To join the substrates, boron or other suitable low-melting-point glass is deposited on at least one of the surfaces to be joined.

During thermal treatment for joining the substrates, the dents of the concave surfaces 1a and 1d are filled with boron glass 21, thereby the first region 3a being formed on the concave surface 1a. The concave surface 1d corresponds to the third region mentioned earlier. Because of the boron glass 21 on the concave surface 1d, in the third region, the boron glass 21 is selectively deposited thick as the first region 3a is formed thick.

Figure 17:
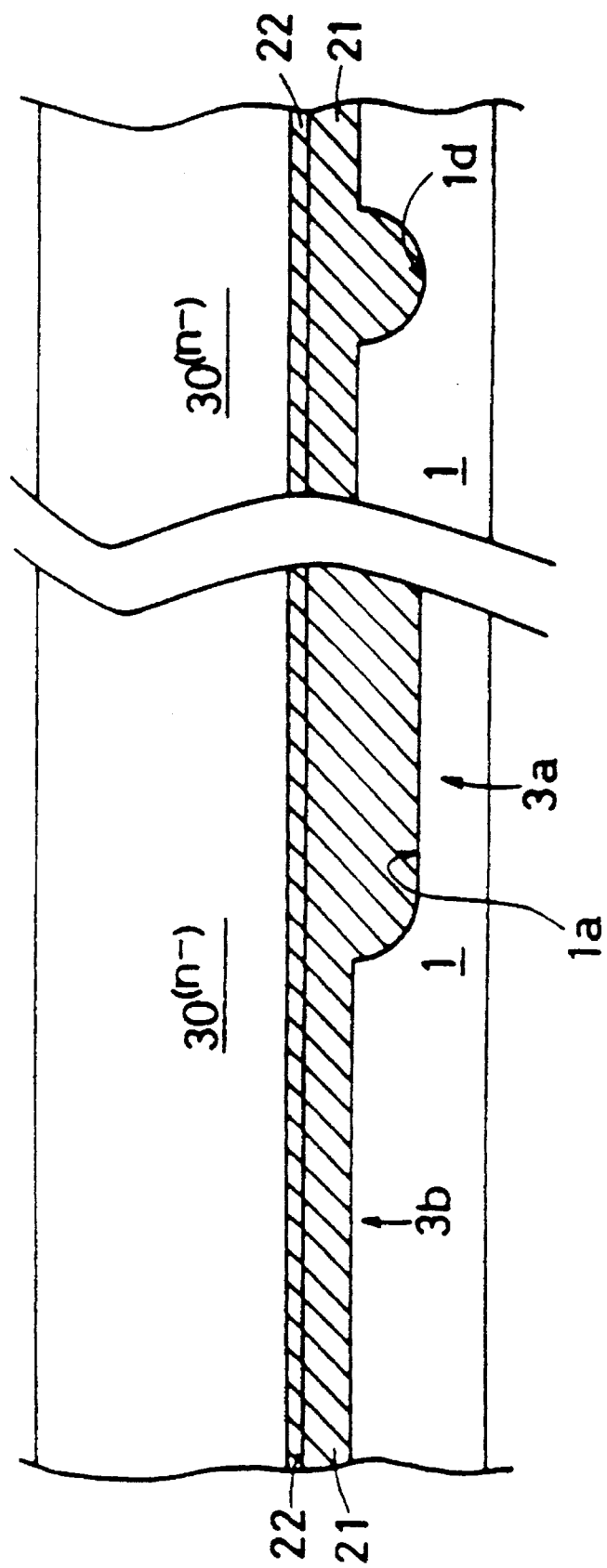
FIGS. 17 to 22 are cross sectional views showing a fourth preferred embodiment of the present invention.

If a thermal oxide film is formed on the surface-to-be-joined of the $n^-$ type semiconductor substrate 30, borons contained in the boron glass 21 would not diffuse into the $n^-$ type semiconductor substrate 30. Thus, the structure shown in FIG. 17 is obtained.

Figure 18:
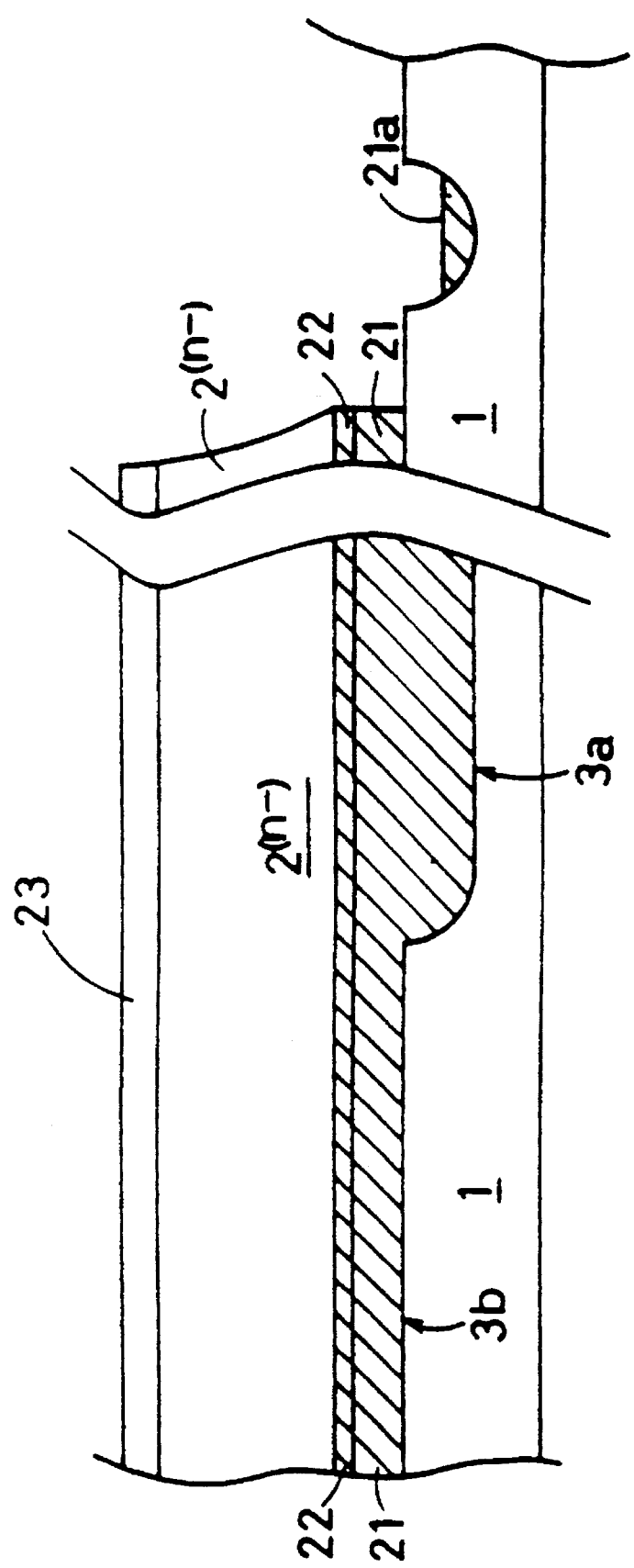

Next, the $n^-$ type semiconductor substrate 30 is polished to a desired thickness, thereby defining the $n^-$ type semiconductor layer 2. An oxide film 23 is then deposited and patterned to include an opening above the concave surface 1d. Through the patterned oxide film 23 to have the opening, the $n^-$ type semiconductor layer 2 is etched until the oxide film 22 is exposed. Further, the oxide films 22 and 21 are etched appropriately to expose the remainder portion 21a of the boron glass 21. Thus, the structure shown in FIG. 18 is obtained.

Figure 19:
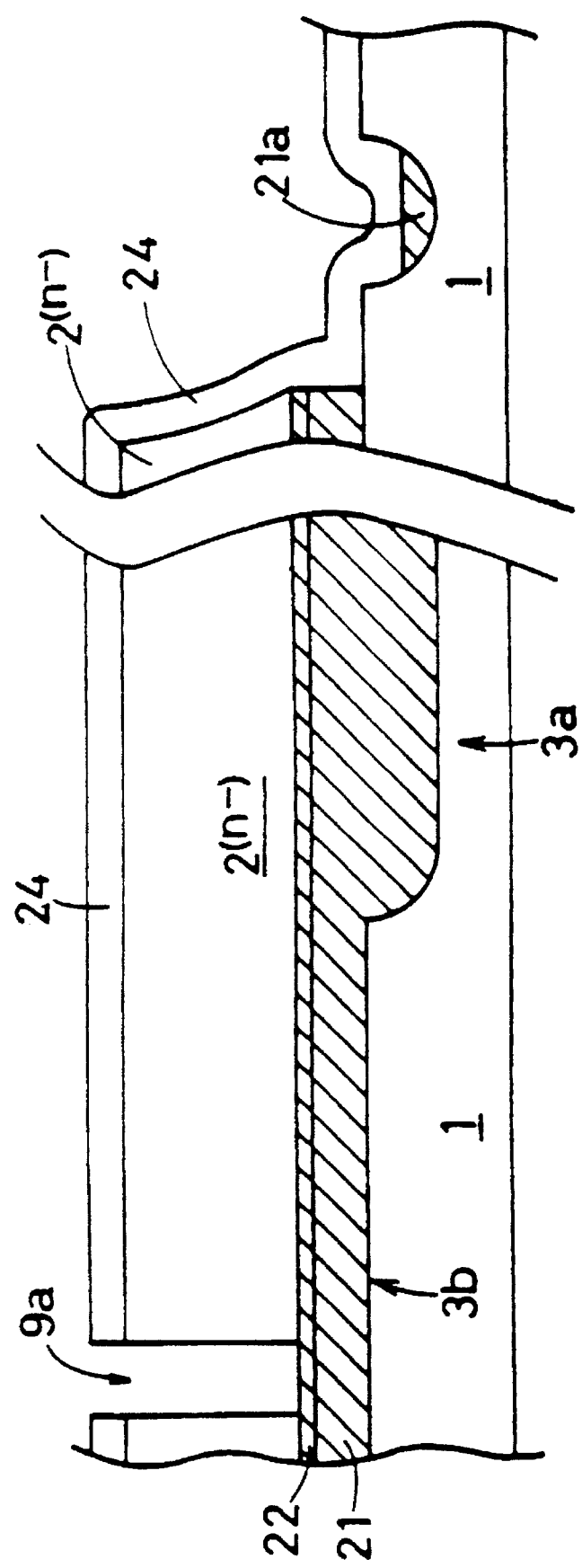

An oxide film 24 is then deposited, aligned using the remainder 21a, and patterned. Through the oxide film 24 as it is patterned, the $n^-$ type semiconductor layer 2 is selectively etched to form a groove 9a which reaches the thermal oxide film 22. Thus, the structure shown in FIG. 19 is obtained.

Figure 20:
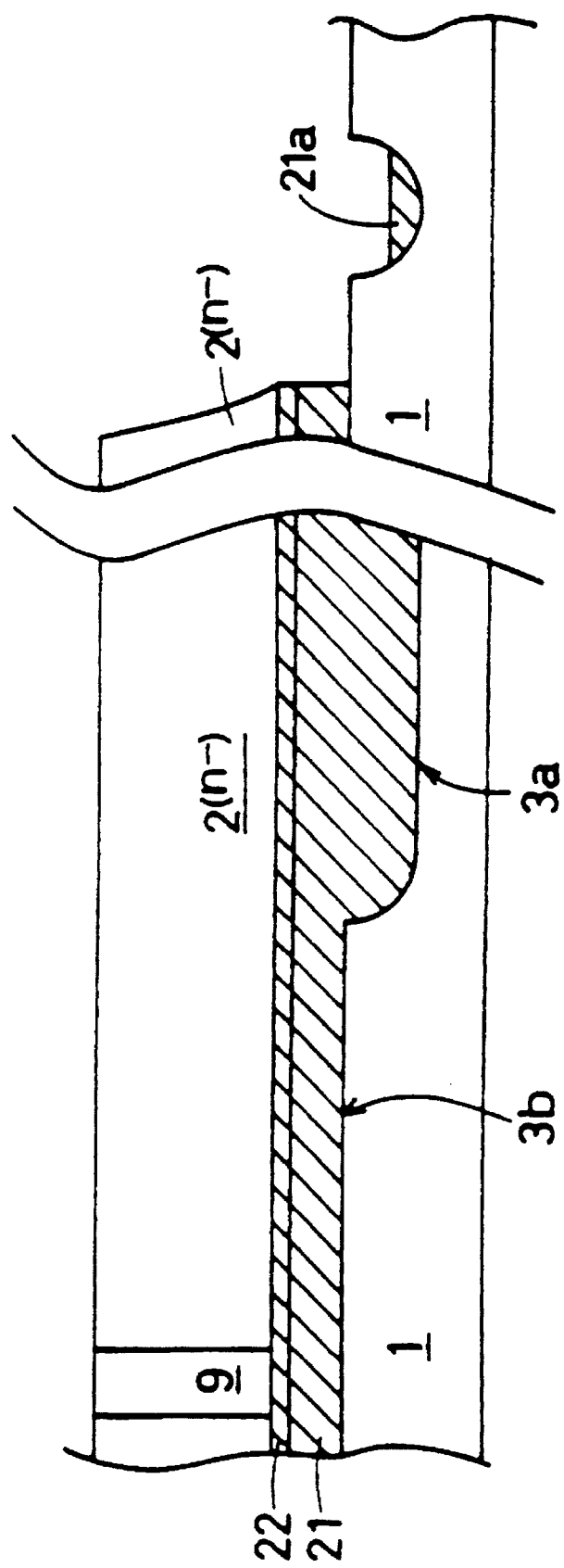

The oxide film 24 is removed, followed by deposition of another oxide film by thermal oxidation. By etching back the newly deposited oxide film, the groove 9a is filled with the insulation film 9. Thus, the structure shown in FIG. 20 is obtained.

Figure 21:
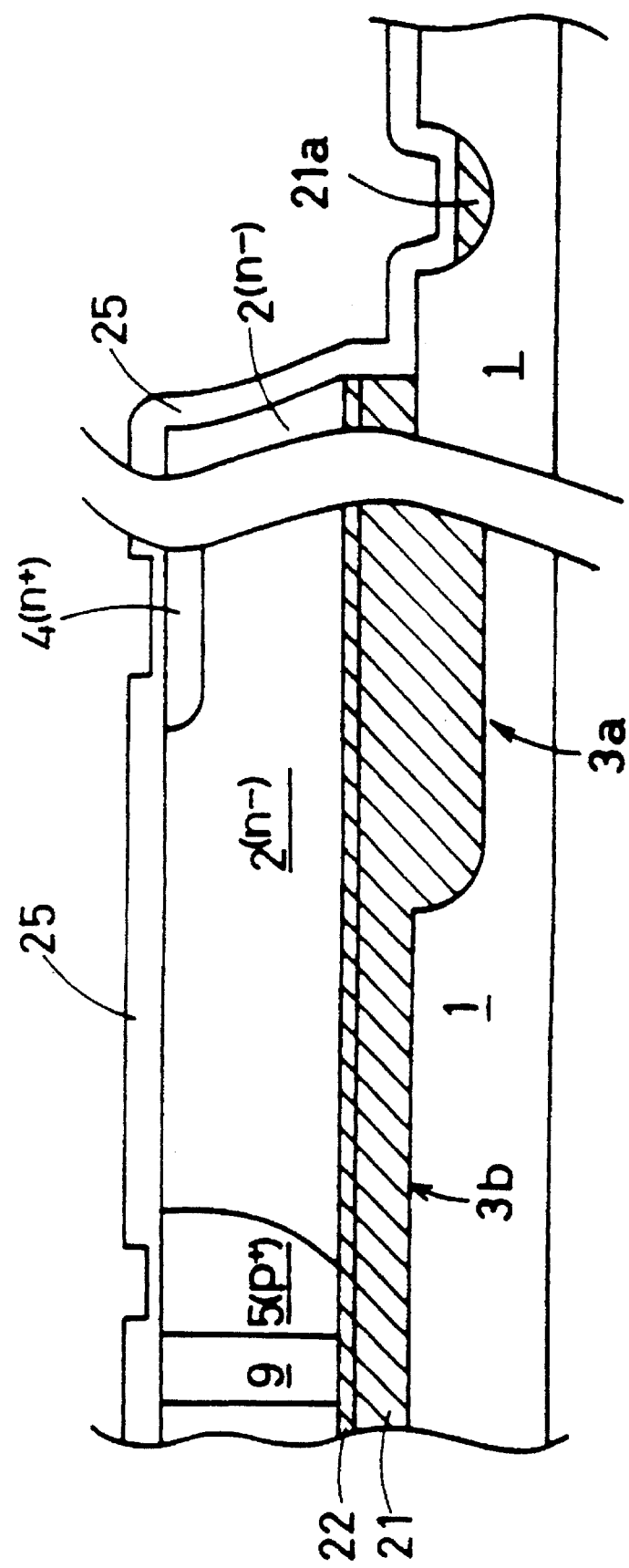

Another thermal oxide film 25 is grown, aligned using the remainder 21a, and patterned. Using the patterned thermal oxide film 25 as a mask, borons are implanted and annealed to define the $p^+$ type semiconductor region 5. By similar ion implantation and annealing of dopant impurities, the $n^+$ type semiconductor region 4 is formed. Thus, the structure shown in FIG. 21 is obtained.

Figure 22:
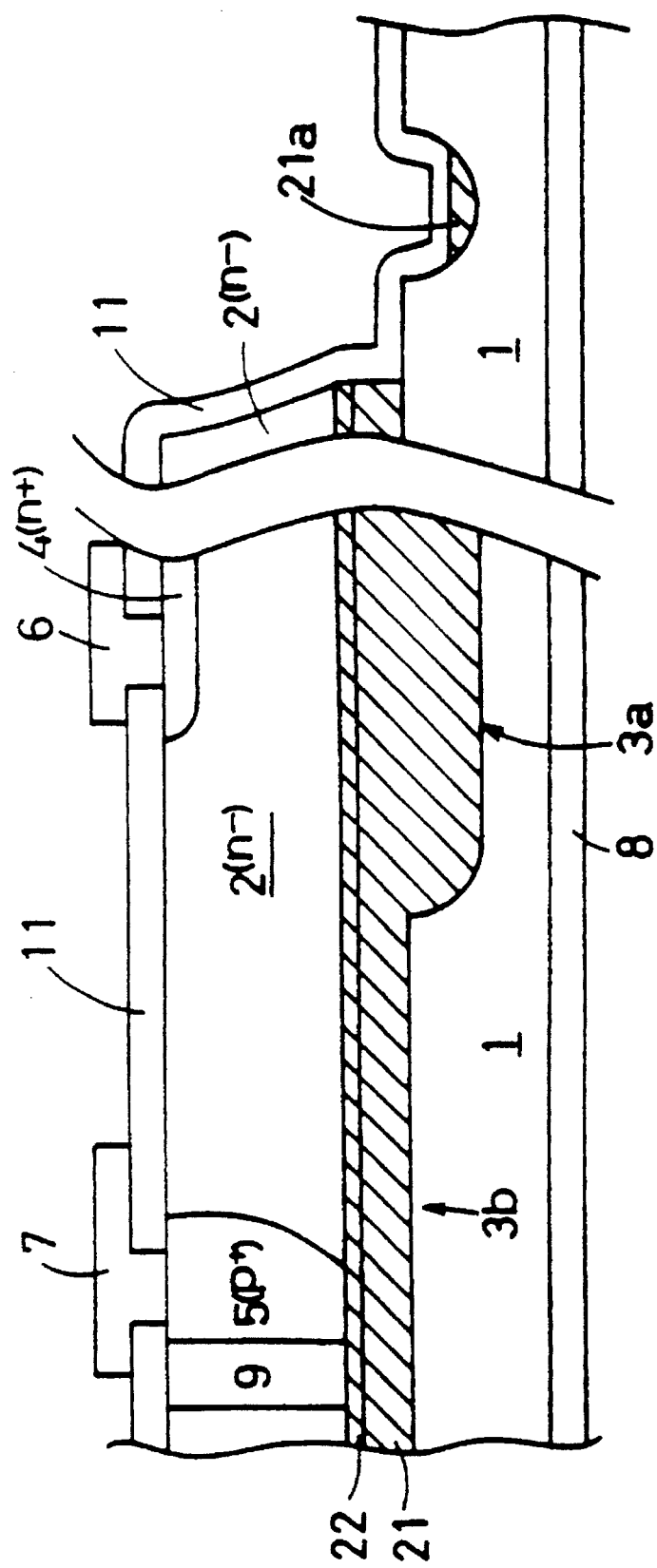

The oxide film 25 is removed and the insulation film 11 is deposited. After aligned using the remainder 21a, the insulation film 11 is patterned. As a result, the $n^+$ type semiconductor region 4 and the $p^+$ type semiconductor region 5 are exposed. Following this, by Al-Si spattering, the cathode electrode 6 and the anode electrode 7 are formed. The back surface electrode 8 is then formed by vacuum evaporation of metal onto the back surface of the semiconductor substrate 1. Thus, the structure shown in FIG. 22 is obtained, which completes fabrication of the dielectric element isolated semiconductor device 100.

Fifth Preferred Embodiment

Figure 23:
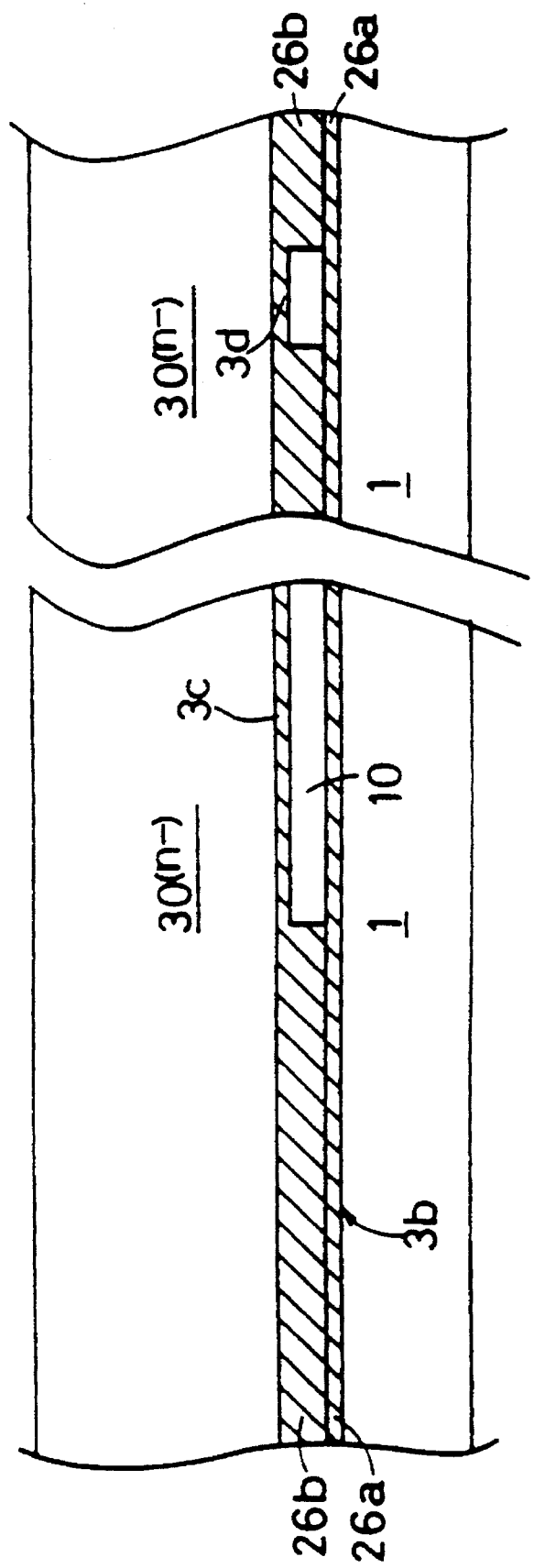
FIGS. 23 to 25 are cross sectional views showing a fifth preferred embodiment of the present invention.
Figure 24:
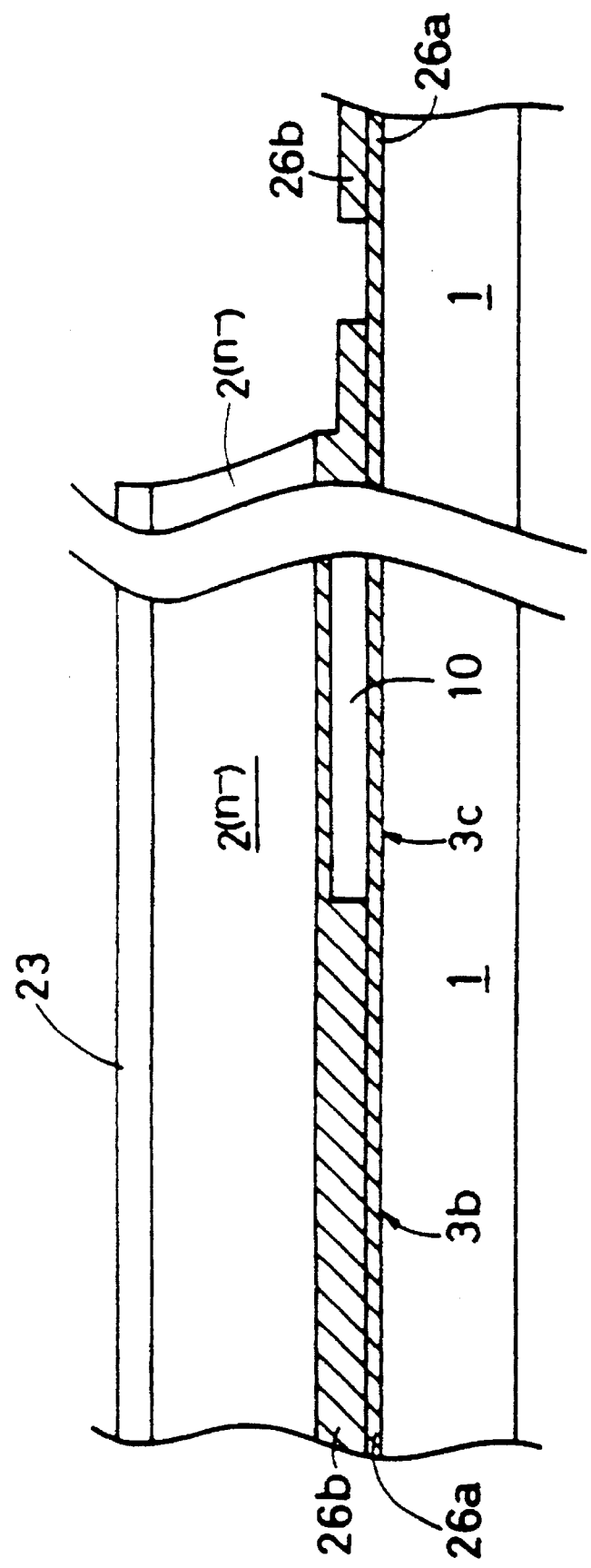
Figure 25:
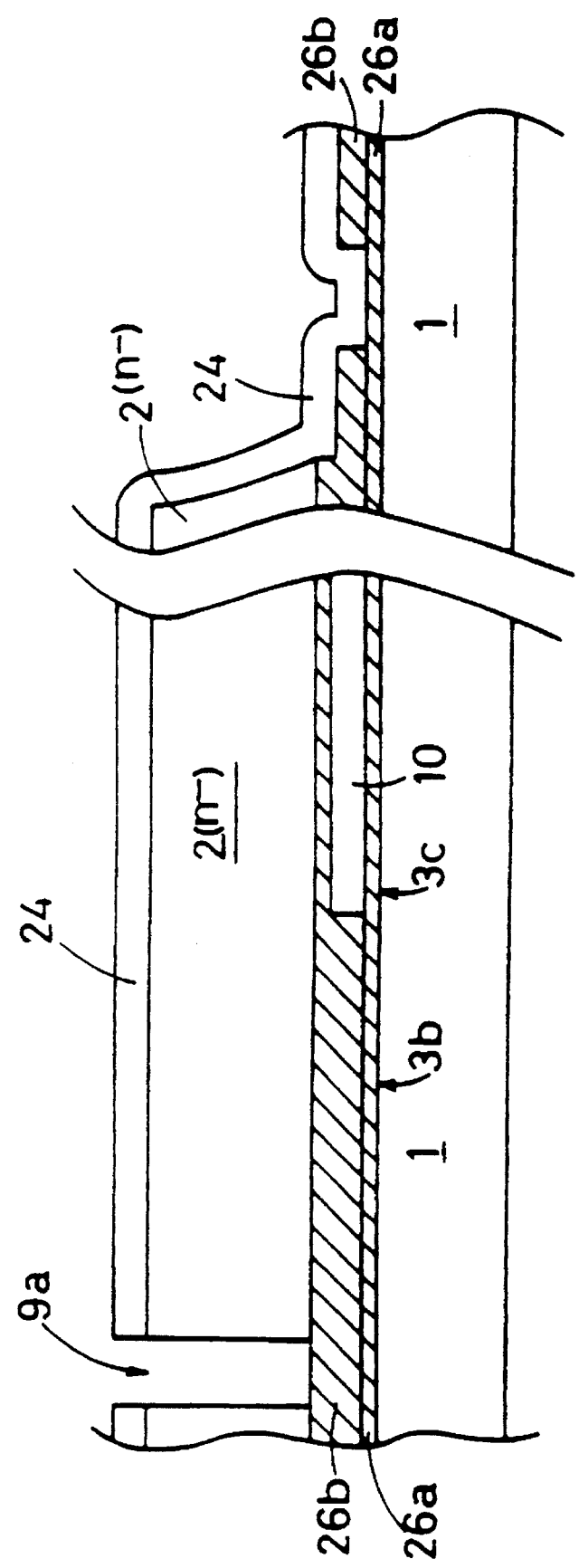

The fifth preferred embodiment aims at offering a method of manufacturing the dielectric element isolated semiconductor device 101 of the second preferred embodiment. FIGS. 23 to 25 are cross sectional views of the dielectric element isolated semiconductor device 101 during successive stages in the process of fabrication therefor.

The semiconductor substrate 1 comprising an oxide film 26a which is thermally grown on the semiconductor substrate 1 is joined to the $n^-$ type semiconductor substrate 30 which comprises an oxide film 26b which includes a selectively etched thin portion. The etched thin portion of the oxide film 26b corresponds to the dielectric element strip 3c of the dielectric element isolated semiconductor device 101. Of the oxide films 26a and 26b, the portions which correspond to the dielectric element strip 3c sandwich a hollow region which corresponds to the dielectric element strip 10 of the dielectric element isolated semiconductor device 101. It is to be noted here that the oxide film 26b is etched thin where it would not be a part of the dielectric element isolated semiconductor device 101. This particular thin portion of the oxide film 26b serves as a dielectric element strip 3d. The oxide film 26a immediately under the dielectric element strip 3d corresponds to the third region which was mentioned earlier. Thus, the structure shown in FIG. 23 is obtained.

Next, the $n^-$ type semiconductor substrate 30 is polished to a desired thickness, thereby defining the $n^-$ type semiconductor layer 2. An oxide film 23 is then deposited and patterned to include an opening above the dielectric element strip 3d. Through the patterned oxide film 23, the $n^-$ type semiconductor layer 2 is etched until the oxide film 26b is exposed. Further, the dielectric element strip 3d is etched appropriately to expose the oxide film 26b. Thus, the structure shown in FIG. 24 is obtained.

The oxide film 23 is removed, and then an oxide film 24 is deposited, aligned using the step-like configuration formed by the oxide films 26a and 26b, and patterned. Through the oxide film 24 as it is thus patterned, the $n^-$ type semiconductor layer 2 is selectively etched to form a groove 9a which reaches the oxide film 26b. Thus, the structure shown in FIG. 25 is obtained.

Following this, the steps as those shown in FIGS. 20 to 22 are performed, whereby the dielectric element isolated semiconductor device 101 is completed.

Sixth Preferred Embodiment

Figure 26:
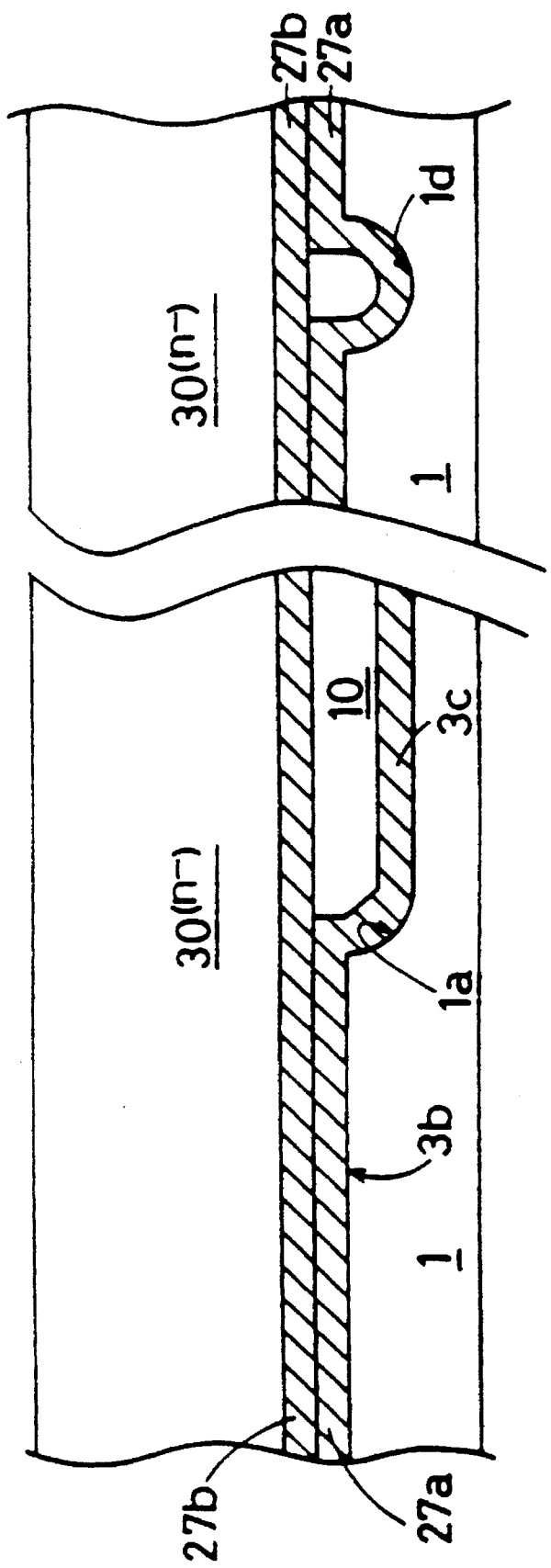
FIGS. 26 to 28 are cross sectional views showing a sixth preferred embodiment of the present invention.
Figure 27:
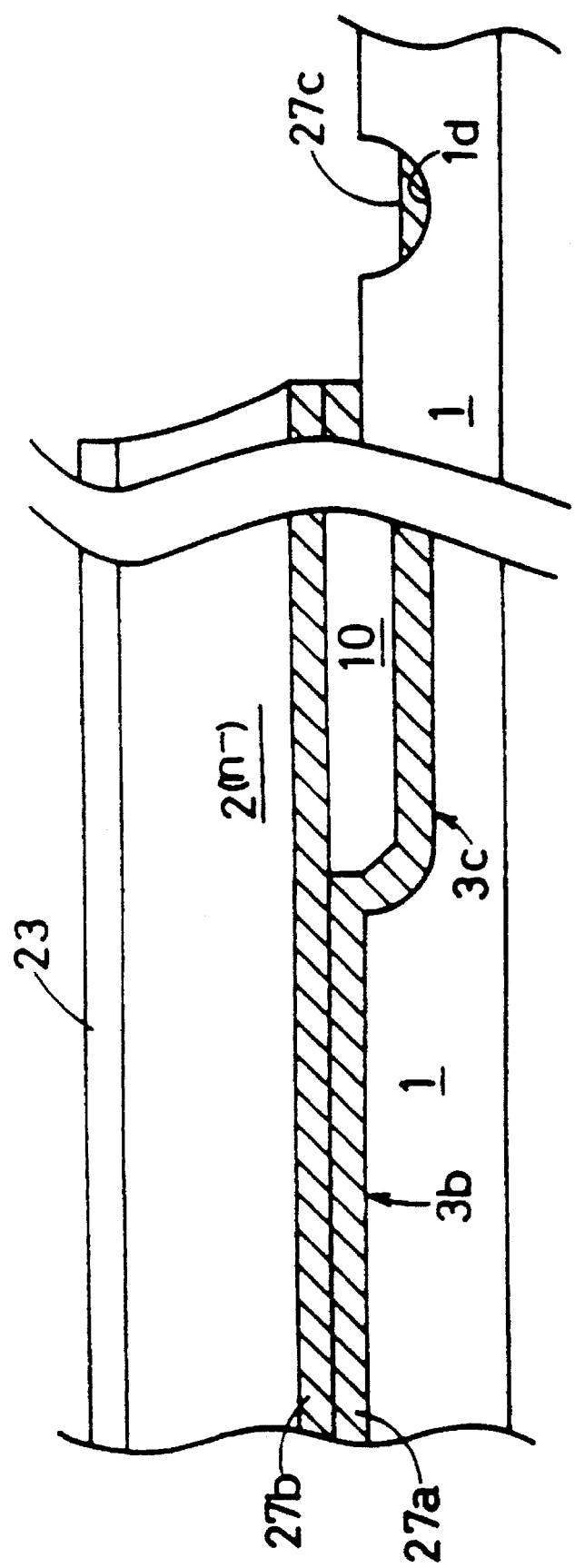
Figure 28:
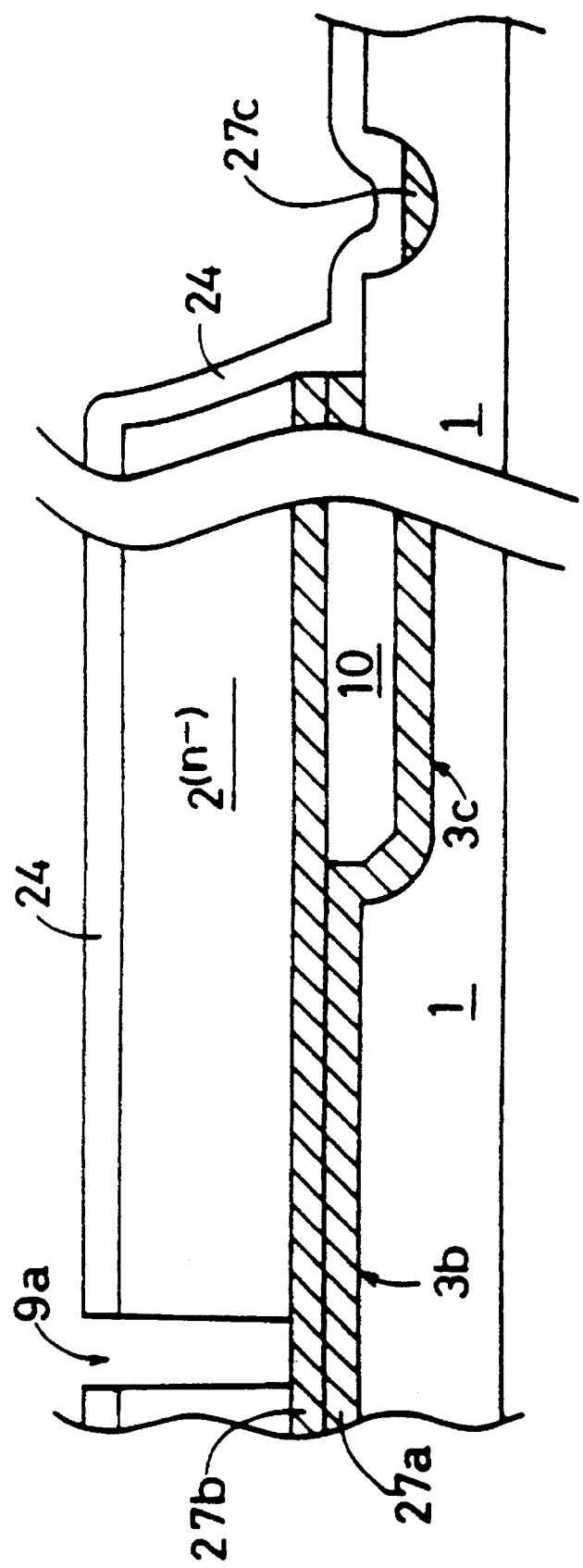

The sixth preferred embodiment aims at offering a method of manufacturing the dielectric element isolated semiconductor device 102 of the third preferred embodiment. FIGS. 26 to 28 are cross sectional views of the dielectric element isolated semiconductor device 102 during successive stages in the process of fabrication therefor.

First, the semiconductor substrate 1 is selectively etched to form concave surfaces 1a and 1d. The semiconductor substrate 1 is then thermally oxidized at the surface which includes the concave surfaces 1a and 1d to thereby form an oxide film 27a. The portion of the oxide film 27a on the concave surface 1a corresponds to the dielectric element strip 3c of the dielectric element isolated semiconductor device 102. The portion of the oxide film 27a on the concave surface 1d corresponds to the third region mentioned earlier.

The $n^-$ type semiconductor substrate 30 comprising an oxide film 27b which is formed by thermal oxidization is joined, the oxide films 27a and 27b in, to the semiconductor substrate 1. As a result, a hollow space corresponding to the dielectric element strip 10 is created above the concave surface 1a. Thus, the structure shown in FIG. 26 is obtained.

Next, the $n^-$ type semiconductor substrate 30 is polished to a desired thickness, thereby defining the $n^-$ type semiconductor layer 2. An oxide film 23 is then deposited and patterned to include an opening above the dielectric element strip 3d. Through the patterned oxide film 23 as it is thus patterned, the $n^-$ type semiconductor layer 2 is etched until the oxide film 27b is exposed. Further, the oxide film 27b is etched appropriately so that a remainder 27c of the oxide film 27a is left on the concave surface 1d. Thus, the structure shown in FIG. 27 is obtained.

After the oxide film 23 is removed, an oxide film 24 is then deposited, aligned using the remainder portion 27c of the oxide film, and patterned. Through the oxide film 24 as it is thus patterned, the $n^-$ type semiconductor layer 2 is selectively etched to form a groove 9a which reaches the oxide film 27b. Thus, the structure shown in FIG. 28 is obtained.

By performing the steps as those shown in FIGS. 20 to 22 after this, the dielectric element isolated semiconductor device 102 is completed.

Applications of Dielectric Element Isolated Semiconductor Device

Although having been described in relation to the first to the third preferred embodiments in each of which a diode with an enhanced breakdown voltage is disclosed, the present invention is applicable not only to diodes but also to other types of semiconductor devices as described in the following.

Seventh Preferred Embodiment

Figure 29:
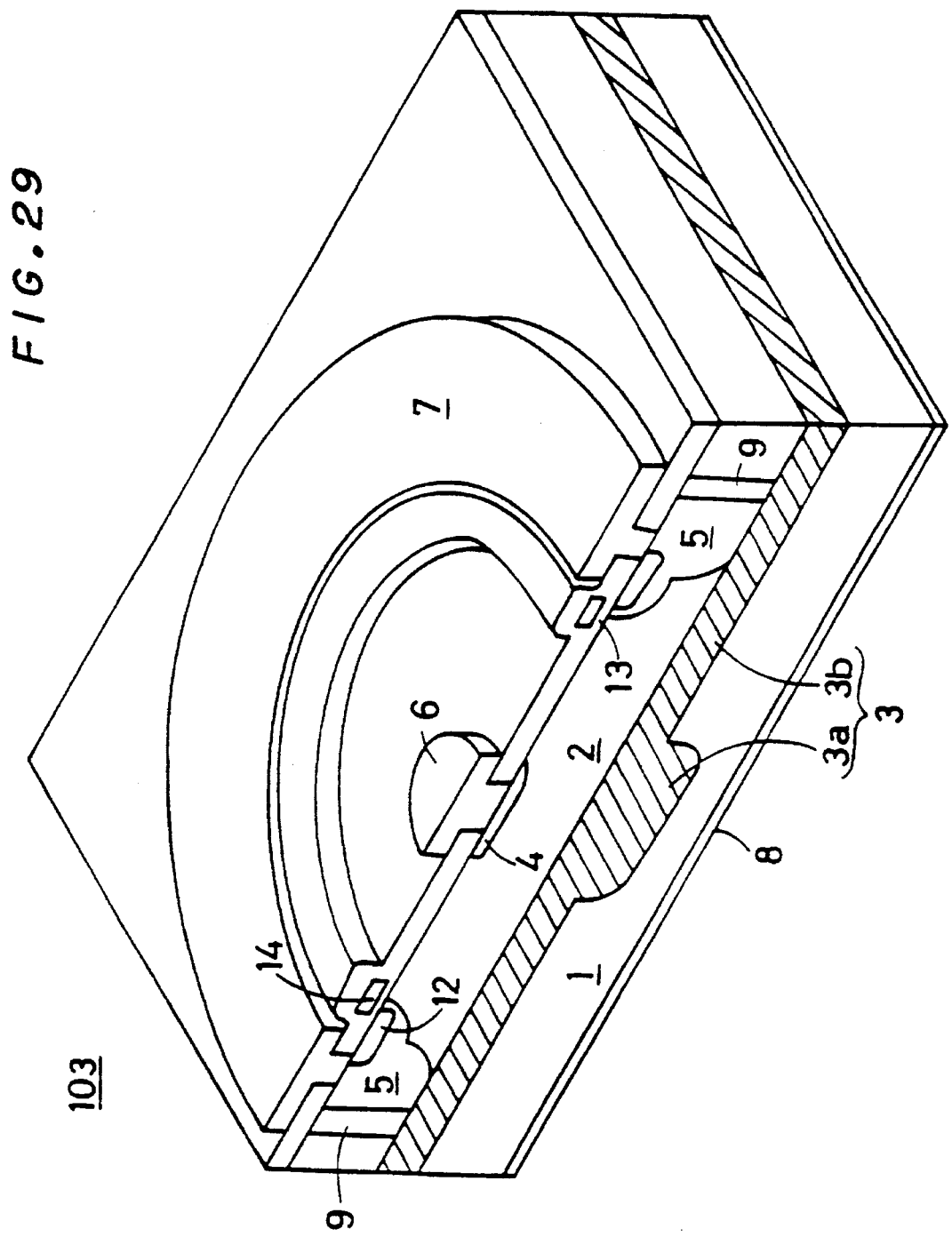
FIG. 29 is a perspective cross sectional view showing a seventh preferred embodiment of the present invention.
Figure 30:
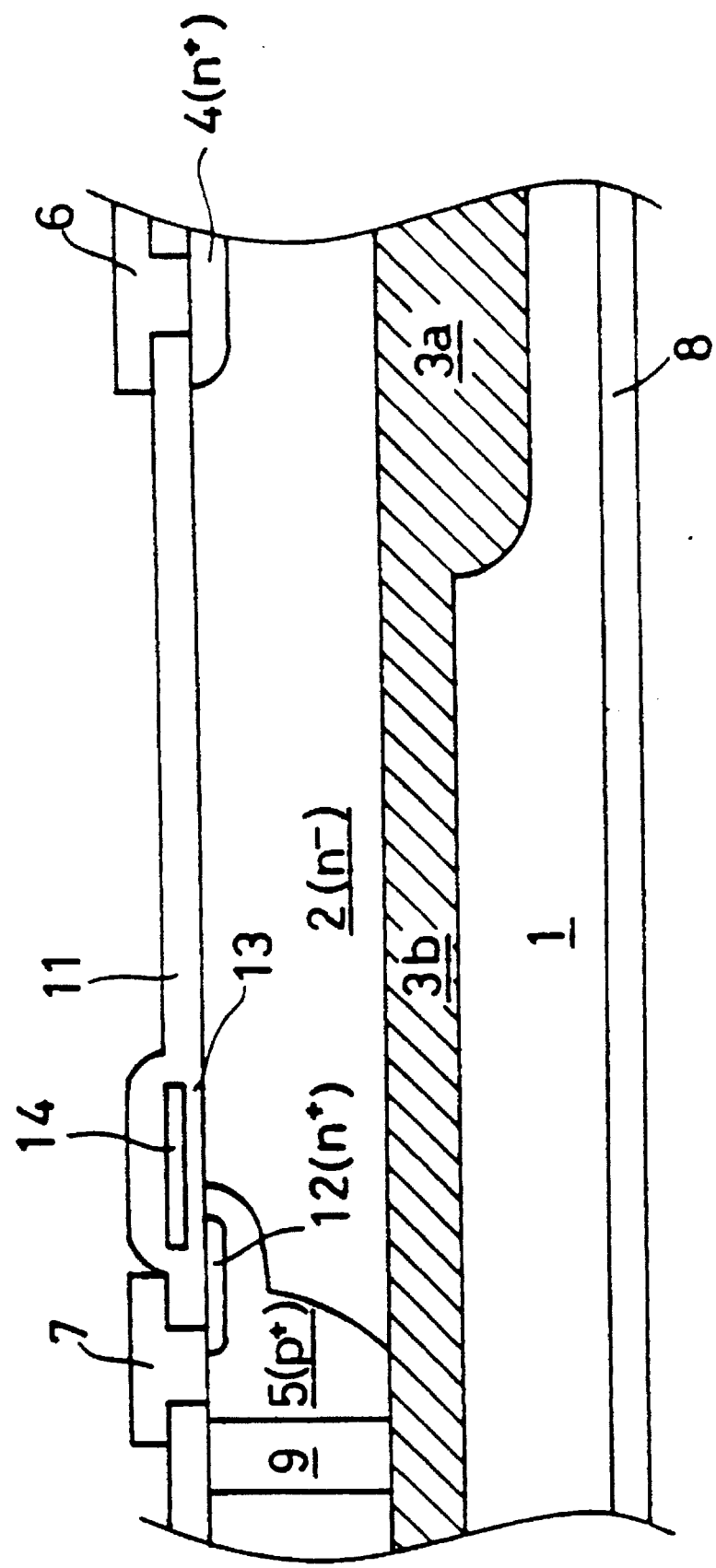
FIGS. 30 and 31 are cross sectional views showing the seventh preferred embodiment of the present invention.

FIGS. 29 and 30 are a perspective cross sectional view and a cross sectional view, respectively, of a dielectric element isolated semiconductor device 103 according to a seventh preferred embodiment of the present invention. The semiconductor substrate 1, the $n^-$ type semiconductor layer 2, the dielectric layer 3, both as it is and in terms of its first and second regions 3a and 3b, the $n^+$ type semiconductor region 4, the electrodes 6 and 7, the back surface electrode 8 and the insulation film 9 are located as they are disposed in the dielectric element isolated semiconductor device 100 of the first preferred embodiment.

The seventh preferred embodiment departs from the first preferred embodiment in that an $n^+$ type semiconductor region 12 is selectively formed in the top surface of the $p^+$ type semiconductor region 5 and connected to the electrode 7 as the $p^+$ type semiconductor region 5 is. In a portion in nearer to the electrode 6 than to the electrode 7, the insulation film 11 contains a gate electrode 14. The insulation film 11 is formed by an oxide film, for instance. Immediately under the gate electrode 14, the insulation film acts as a gate oxide film 13.

The gate electrode 14 faces the $p^+$ type semiconductor region 5, the $n^+$ type semiconductor region 12 and the $n^-$ type semiconductor layer 2 through the gate oxide film 13, allowing the dielectric element isolated semiconductor device 103 to function as an n-channel MOS transistor. Hence, the electrode 7 serves as a source electrode and the electrode 6 serves as a drain electrode, and therefore, these electrodes will be hereinafter referred to as "drain electrode 6" and "source electrode 7."

Figure 31:
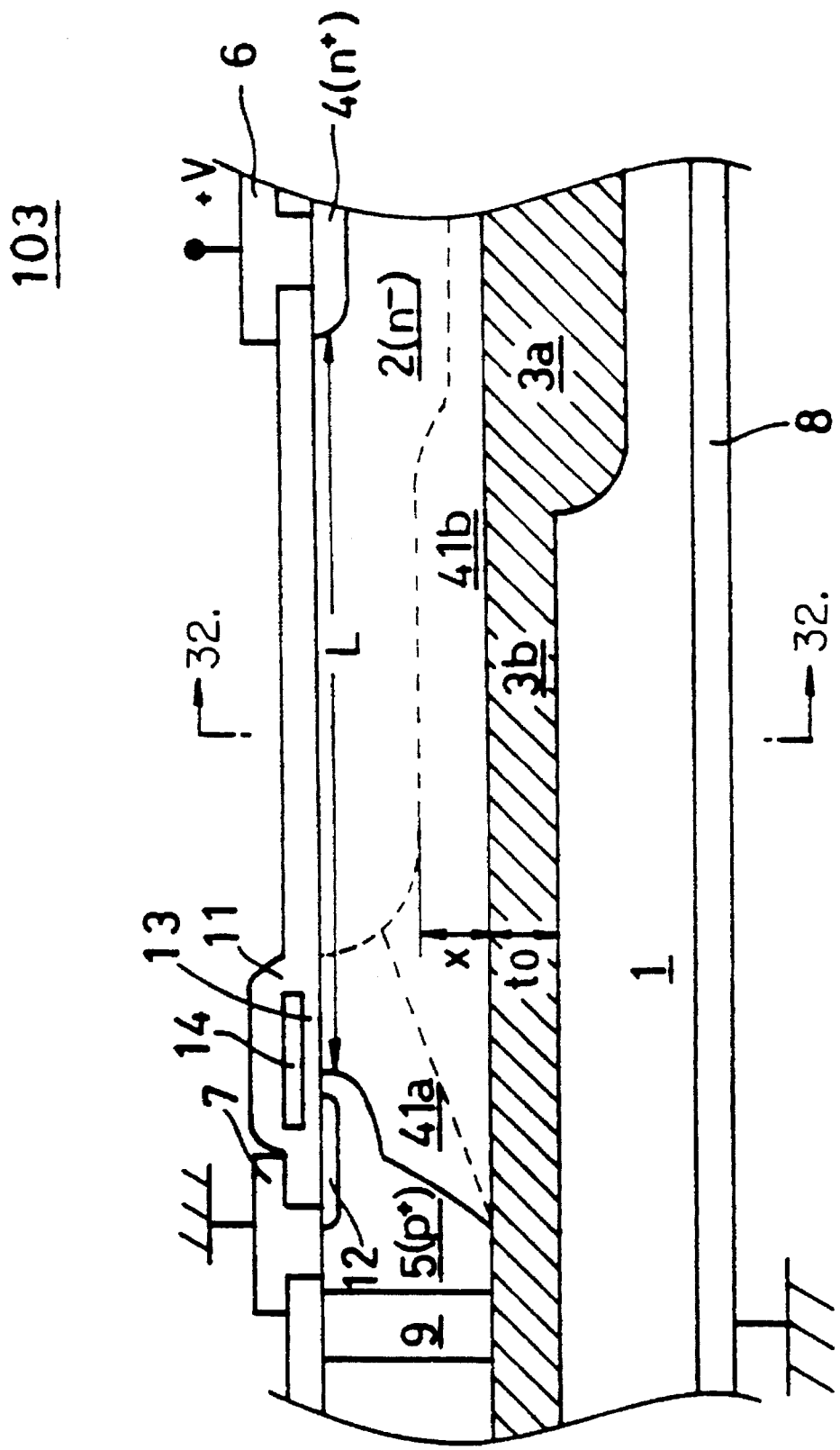

The operations of the n-channel MOS transistor in its OFF-state will be described first. FIG. 31 is a cross sectional view showing the operations of the dielectric element isolated semiconductor device 103. When the source electrode 7, the back surface electrode 8 and the gate electrode 14 are all kept at 0 V, of the $p^+$ type semiconductor region 5, the portion immediately under the gate electrode 14 would not invert into the n type so that the n-channel MOS transistor stays nonconductive.

When a gradually increasing positive voltage is applied to the drain electrode 6, due to the RESURF effect similarly to the first preferred embodiment, electric field at a pn junction between the $n^-$ type semiconductor layer 2 and the $p^+$ type semiconductor region 5 is relieved. Hence, likewise in the first preferred embodiment, by setting the thickness $t_0$ of the dielectric layer 3 relatively thin at the second region 3b to thereby ensure no curb to the RESURF effect and by setting the thickness $t_1$ of the dielectric layer 3 relatively thick at the first region 3a to thereby increase voltage drop, a breakdown voltage between the drain and the source electrode 6 and 7 is improved.

Figure 32:
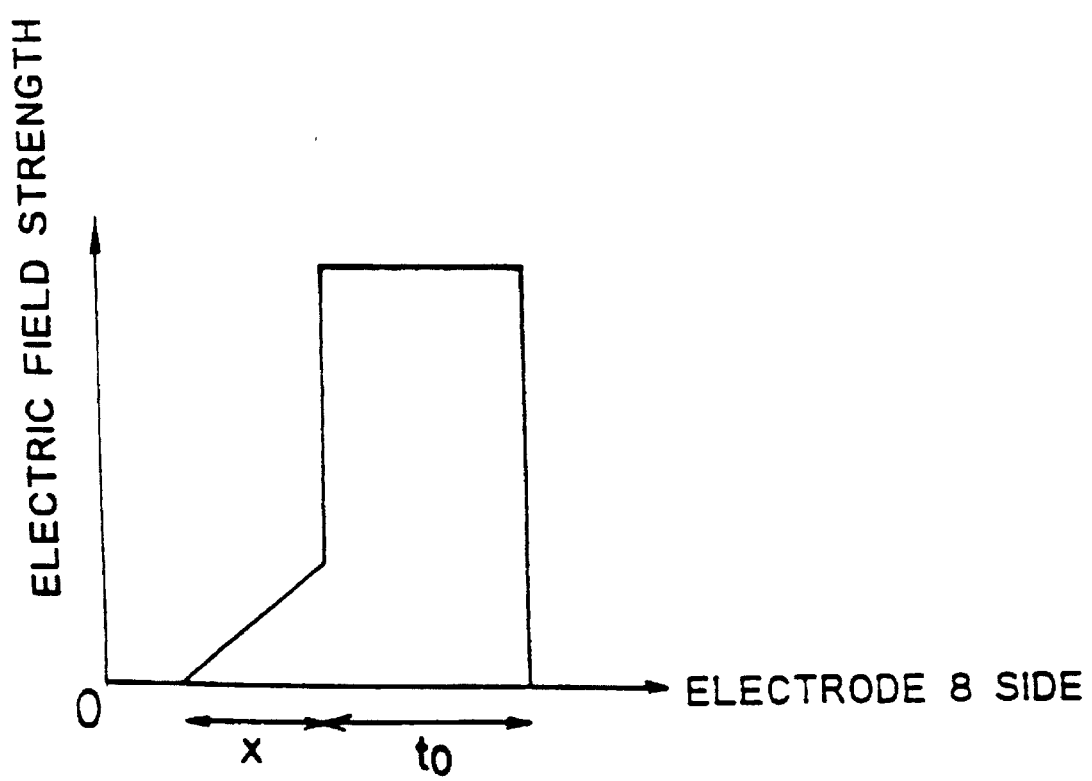
FIG. 32 is a graph showing the seventh preferred embodiment of the present invention.

FIG. 32 shows dependence of the electric field strength in a downward direction traversing the thickness of the device on the thickness of the semiconductor device, the dependence being taken at a point enough far from the $p^+$ type semiconductor region 5, i.e., at an E–E cross section of FIG. 31. The full voltage drop V at the E—E cross section is expressed as Eq. 1 likewise in the dielectric element isolated semiconductor device 200, and therefore, the graphs of FIGS. 32 and 55 are the same.

As is done in the first preferred embodiment, by separating the $p^+$ type semiconductor region 5 from the $n^+$ type semiconductor region 4 by an enough long distance L and by optimizing the thickness d and the impurity concentration N of the $n^-$ type semiconductor layer 2, avalanche breakdown is prevented which would otherwise occur because of field concentration at the pn junction between the $n^-$ type semiconductor layer 2 and the $p^+$ type semiconductor region 5 and field concentration at an interface between the $n^-$ type semiconductor layer 2 and the $n^+$ type semiconductor region 4. Hence, it is possible that the breakdown voltage of the dielectric element isolated semiconductor device 103 is eventually determined by avalanche breakdown which is caused by field concentration at an interface between the $n^-$ type semiconductor layer 2 and the dielectric layer 3 immediately under the $n^+$ type semiconductor region 4.

Figure 33:
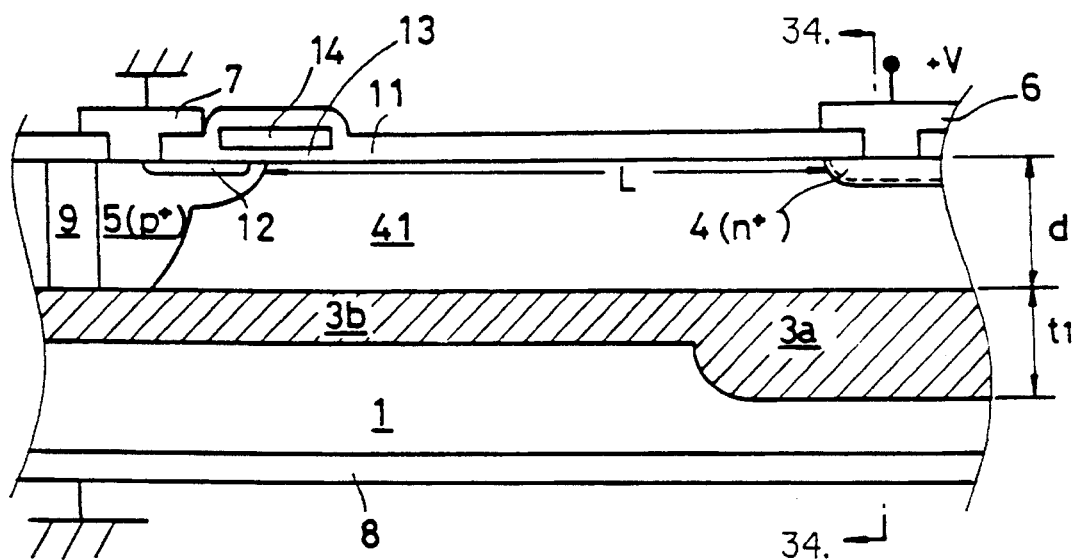
FIG. 33 is a cross sectional view showing the seventh preferred embodiment of the present invention.

FIG. 33 is a cross sectional view showing operations of the dielectric element isolated semiconductor device 103 under the condition above. As mentioned earlier in relation to the first preferred embodiment, it is known that where the $n^-$ type semiconductor layer 2 has been depleted from its interface with the dielectric layer 3 to its surface, conditions determining the breakdown voltage become optimum if the field concentration created at the interface between the n⁻ type semiconductor layer 2 and the dielectric layer 3 satisfies the avalanche condition.

Figure 34:
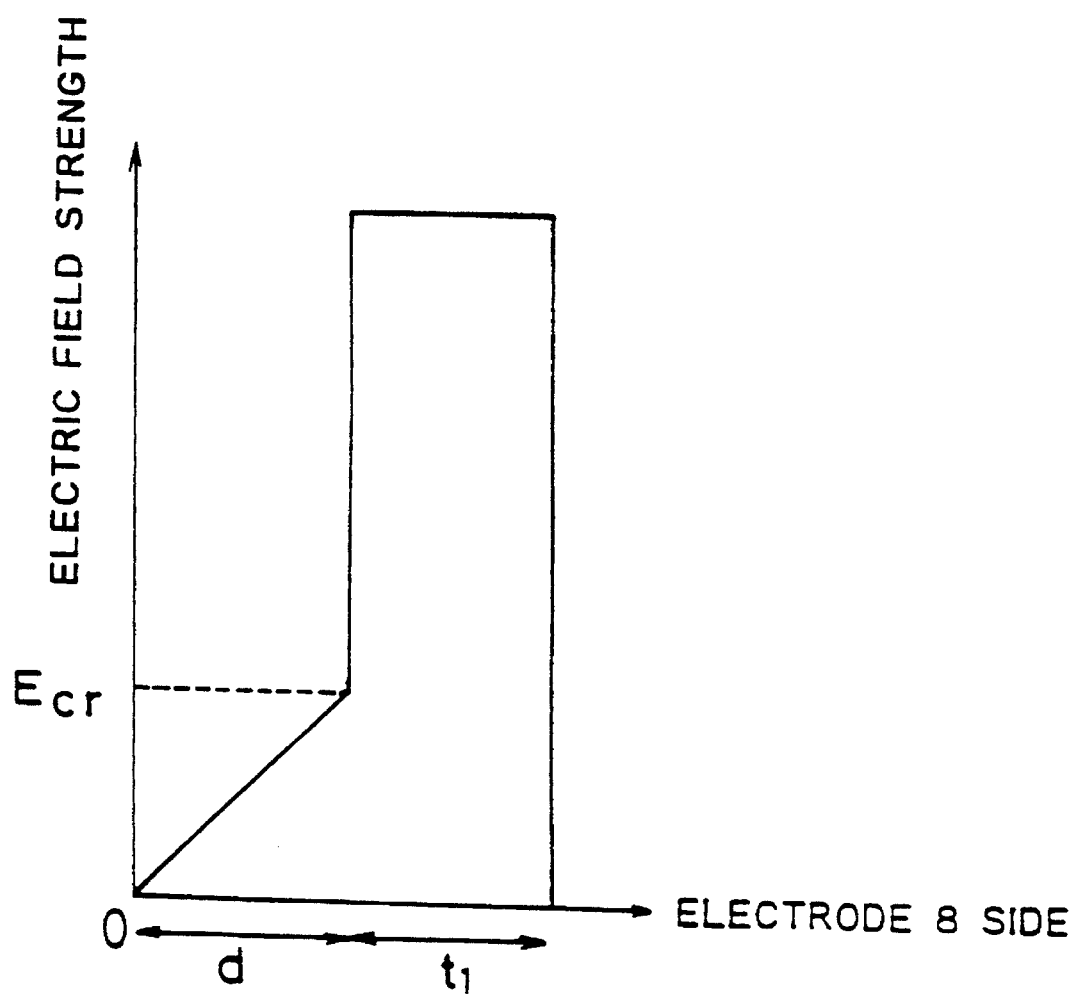
FIG. 34 is a graph showing the seventh preferred embodiment of the present invention.

The breakdown voltage V under such a condition is a full voltage drop of a direction of the thickness taken immediately under the n⁺ type semiconductor region 4, i.e., at an F-F cross section of FIG. 33, and therefore, is obtainable by Eq. 6 as in the first preferred embodiment. The distribution of the electric field strength in such a case is shown in FIG. 34, which shows a similar distribution to the distribution shown in FIG. 6.

On the other hand, when a positive voltage is applied to the gate electrode 14, of the p⁺ type semiconductor region 5, the portion immediately under the gate electrode 14 is inverted into the n type so that a channel is created thereat. This allows a flow of electrons from the n⁺ type semiconductor region 12 to the n⁺ type semiconductor region 4 through the channel created in the p⁺ type semiconductor region 5 and through the n⁻ type semiconductor layer 2, turning on the n-channel MOS transistor. If the potential at the gate electrode 14 is changed to 0 V, the n-channel MOS transistor would turn off once again.

Eighth Preferred Embodiment

Figure 35:
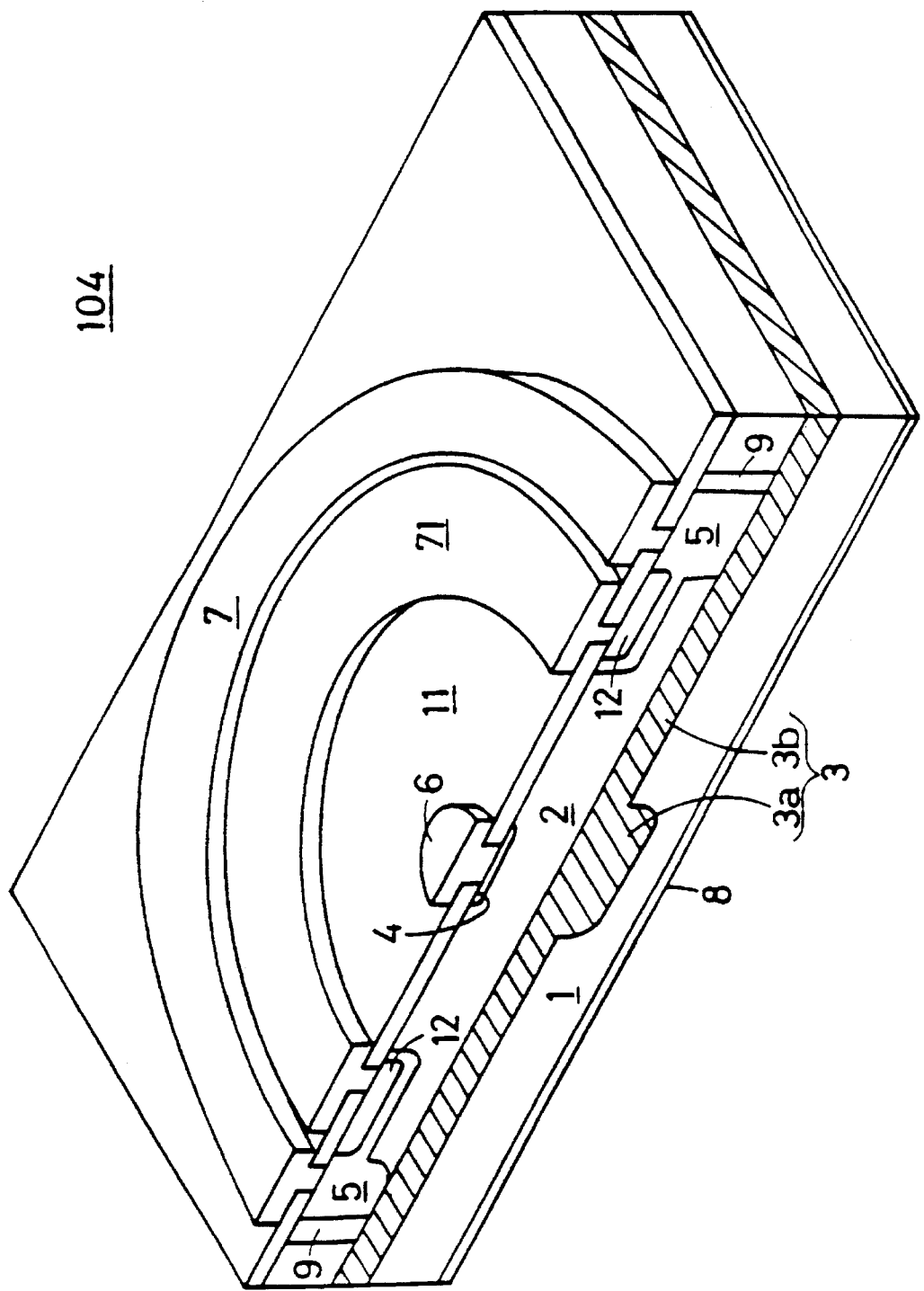
FIG. 35 is a perspective cross sectional view showing an eighth preferred embodiment of the present invention.
Figure 36:
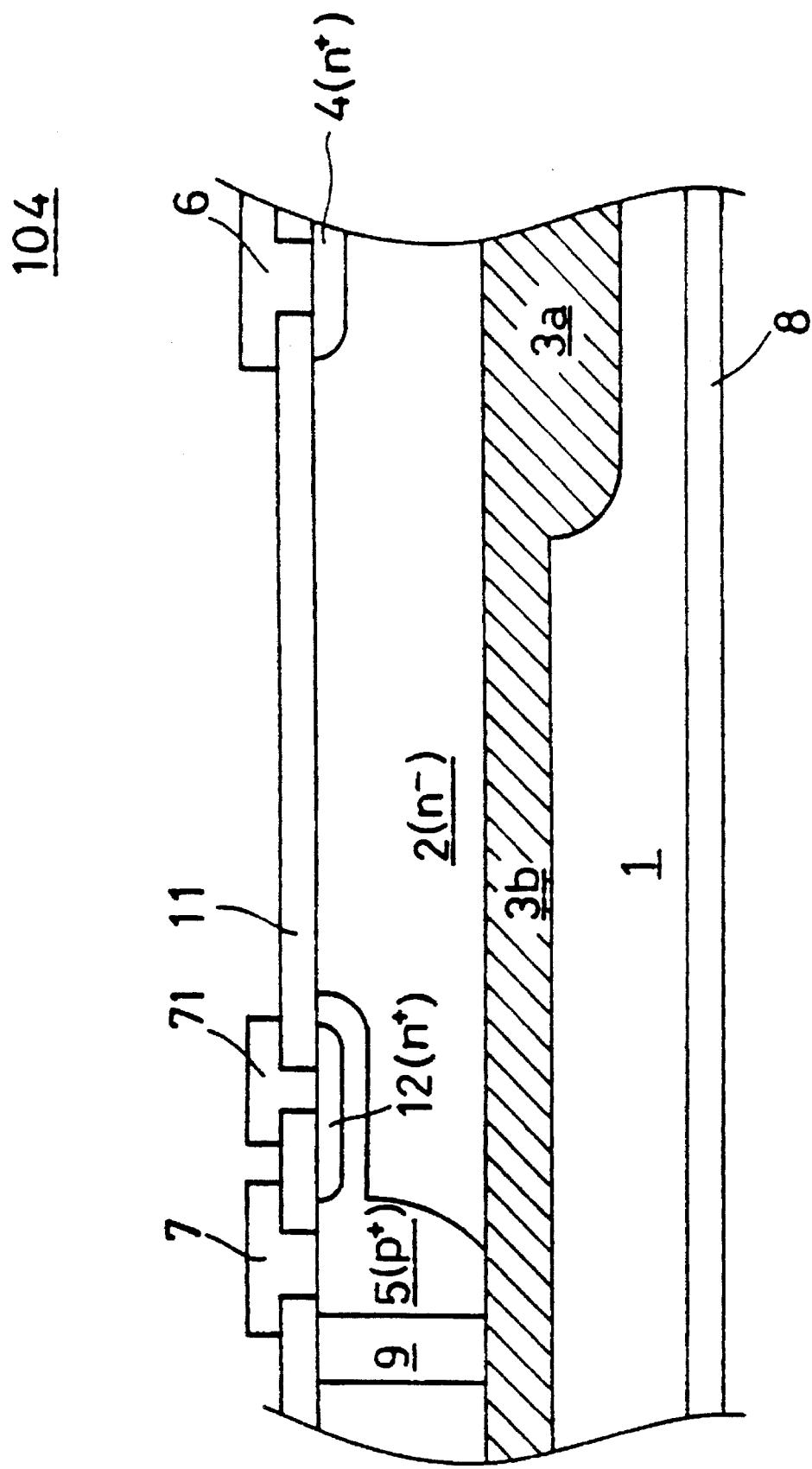
FIG. 36 is a cross sectional view showing the eighth preferred embodiment of the present invention.

FIGS. 35 and 36 are a perspective cross sectional view and a cross sectional view, respectively, of a dielectric element isolated semiconductor device 104 according to an eighth preferred embodiment of the present invention. The semiconductor substrate 1, the n⁻ type semiconductor layer 2, the dielectric layer 3, both as it is and in terms of its first and second regions 3a and 3b, the n⁺ type semiconductor region 4, the electrodes 6 and 7, the back surface electrode 8 and the insulation film 9 are located as they are disposed in the dielectric element isolated semiconductor device 100 of the first preferred embodiment.

As compared with the dielectric element isolated semiconductor device 100, the p⁺ type semiconductor region 5 of the eighth preferred embodiment extends further toward the electrode 6. In the extended surface of the p⁺ type semiconductor region 5, the n⁺ type semiconductor region 12 is selectively formed. The insulation film 11 includes an opening on a portion of the n⁺ type semiconductor region 12. Through the opening, an electrode 71 is disposed so as to be connected to the n⁺ type semiconductor region 12.

Hence, the n⁺ type semiconductor region 12, the p⁺ type semiconductor region 5 and the n⁺ type semiconductor region 4 form an npn transistor. In the npn transistor, the electrode 71 serves as an emitter electrode, the electrode 6 serves as a collector electrode, and the electrode 7 serves as a base electrode. Therefore, the terms "emitter electrode 71," "collector electrode 6" and "base electrode 7" will be herein used.

When the emitter and the base electrodes 71 and 7 and the back surface electrode 8 are each kept at 0 V and a positive potential given to the collector electrode 6 is gradually increased, due to the RESURF effect similarly to the first preferred embodiment, electric field at a pn junction between the n⁻ type semiconductor layer 2 and the p⁺ type semiconductor region 5 is relieved. Since holes would not migrate from the p⁺ type semiconductor region 5 into the n⁺ type semiconductor region 12 at this stage, the npn transistor stays nonconductive. Thus, an enhanced breakdown voltage is obtained likewise in the first preferred embodiment.

Upon supply of a positive potential to the base electrode 7, holes flow from the p⁺ type semiconductor region 5 into the n⁺ type semiconductor region 12, turning on the npn transistor. The npn transistor turns off again by returning the base electrode 7 to 0 V.

Ninth Preferred Embodiment

Figure 37:
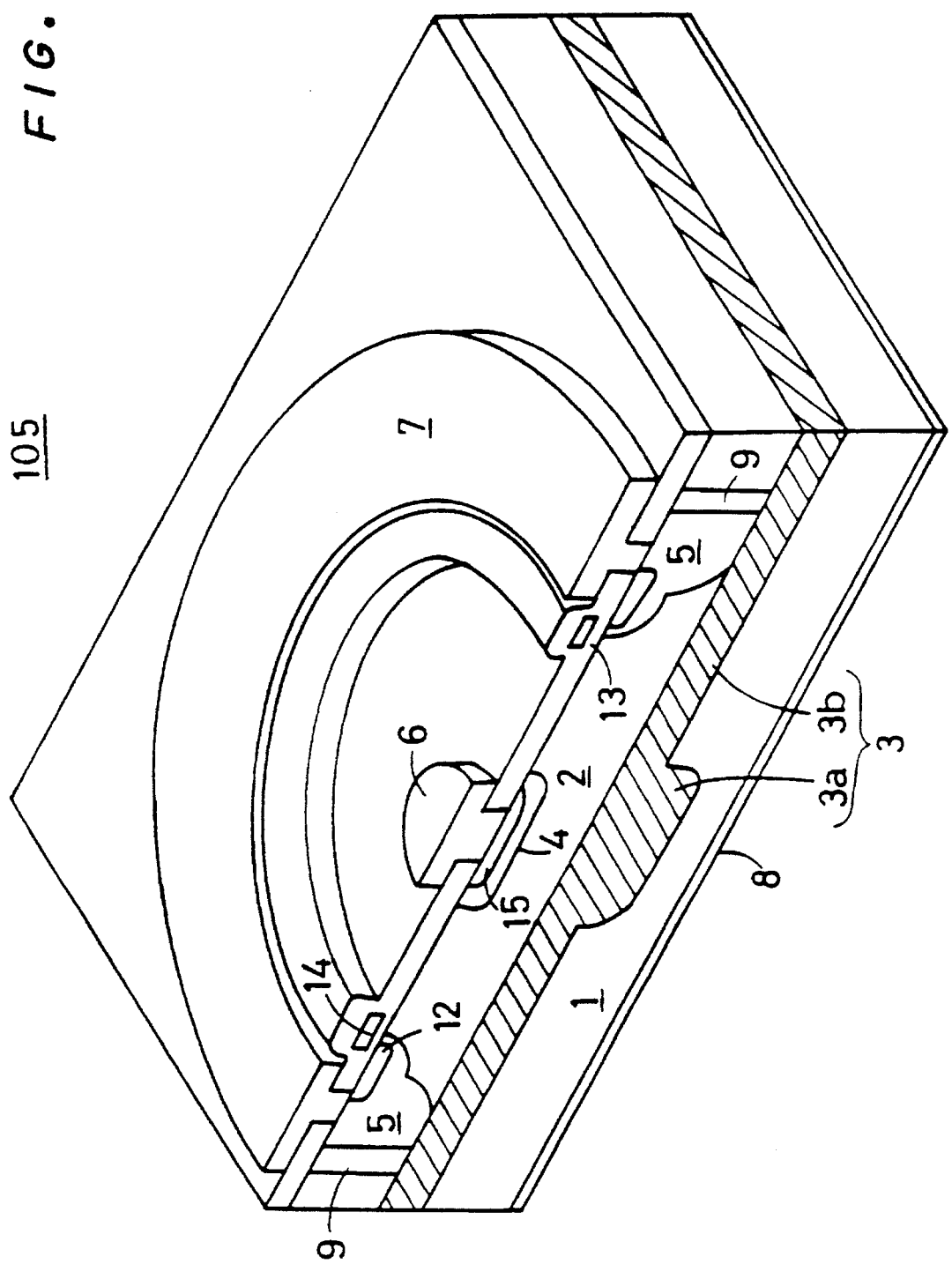
FIG. 37 is a perspective cross sectional view showing a ninth preferred embodiment of the present invention.
Figure 38:
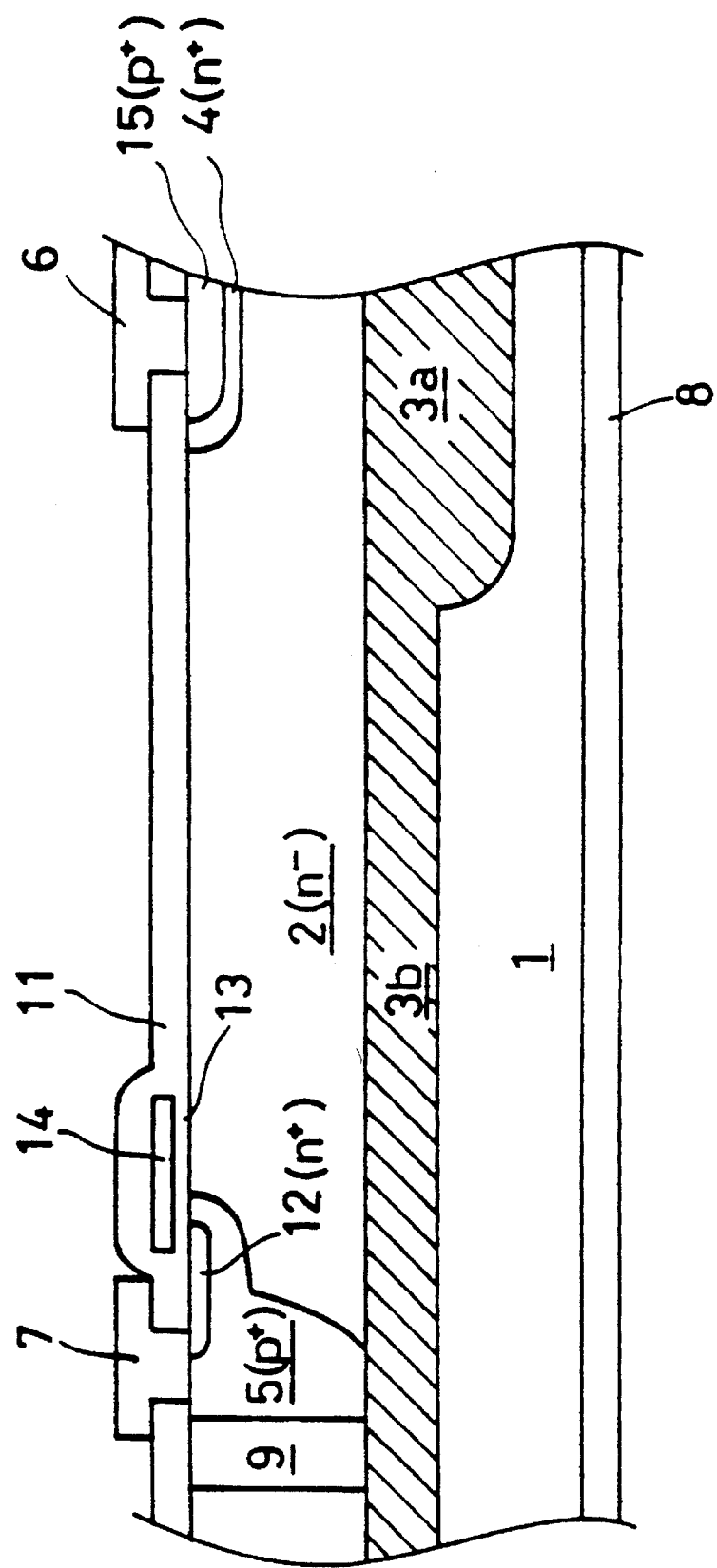
FIG. 38 is a cross sectional view showing the ninth preferred embodiment of the present invention.

FIGS. 37 and 38 are a perspective cross sectional view and a cross sectional view, respectively, of a dielectric element isolated semiconductor device 105 according to a ninth preferred embodiment of the present invention. The semiconductor substrate 1, the n⁻ type semiconductor layer 2, the dielectric layer 3, both as it is and in terms of its first and second regions 3a and 3b, the n⁺ type semiconductor region 12, the electrode 7, the gate electrode 14, the back surface electrode 8 and the insulation films 9 and 11 are located as they are disposed in the dielectric element isolated semiconductor device 103 of the seventh preferred embodiment.

In the ninth preferred embodiment, a p⁺ type semiconductor region 15 is selectively formed in the top surface of the n⁺ type semiconductor region 4 and the electrode 6 is connected not to the n⁺ type semiconductor region 4 through the p⁺ type semiconductor region 15. That is, the n⁺ type semiconductor region 12, the p⁺ type semiconductor region 5, the n⁺ type semiconductor region 4 and the p⁺ type semiconductor region 15, in combination with the gate electrode 14 and the gate oxide film 13, form an n-channel IGBT. In the n-channel IGBT, the electrode 7 serves as an emitter electrode and the electrode 6 serves as a collector electrode, and therefore, the electrode 7 and the electrode 6 will be herein referred to as "emitter electrode 7" and "collector electrode 6."

When the emitter electrode 7, the gate electrode 14 and the back surface electrode 8 are all kept at 0 V and a positive potential applied to the collector electrode 6 is gradually increased, due to the RESURF effect similarly to the first preferred embodiment, electric field at a pn junction between the n⁻ type semiconductor layer 2 and the p⁺ type semiconductor region 5 is relieved. A depletion layer extends from the pn junction. However, once reaching the n⁺ type semiconductor region 4, the depletion layer would not grow beyond the n⁺ type semiconductor region 4, which enables prevention of punch-through.

The p⁺ type semiconductor region 5 would not invert into the n type at its portion immediately under the gate electrode 14, causing that the n-channel IGBT transistor stays non-conductive. Hence, similarly to the first preferred embodiment, a breakdown voltage between the collector and the emitter electrode 6 and 7 is improved by setting the thickness to of the dielectric layer 3 relatively thin at the second region 3b to thereby ensure no punctuation of the RESURF effect and by setting the thickness $t_1$ of the dielectric layer 3 relatively thick at the first region 3a to thereby increase voltage drop.

On the other hand, when a positive voltage is applied to the gate electrode 14, the p⁺ type semiconductor region 5 is inverted into the n type at its portion immediately under the gate electrode 14 so that a channel is created thereat. This allows electrons to flow from the n⁺ type semiconductor region 12 to the p⁺ type semiconductor region 15 through the channel created in the p⁺ type semiconductor region 5 and through the n⁻ type semiconductor layer 2. As the electron flow emerges, implantation of holes from the p⁺ type semiconductor region 15 takes place, which in turn causes a modulation of conductivity of the n⁻ type semiconductor layer 2 and hence turning on of the n-channel IGBT. By changing the potential at the gate electrode 14 to 0 V once again, the n-channel IGBT would turn off.

Tenth Preferred Embodiment

Figure 39:
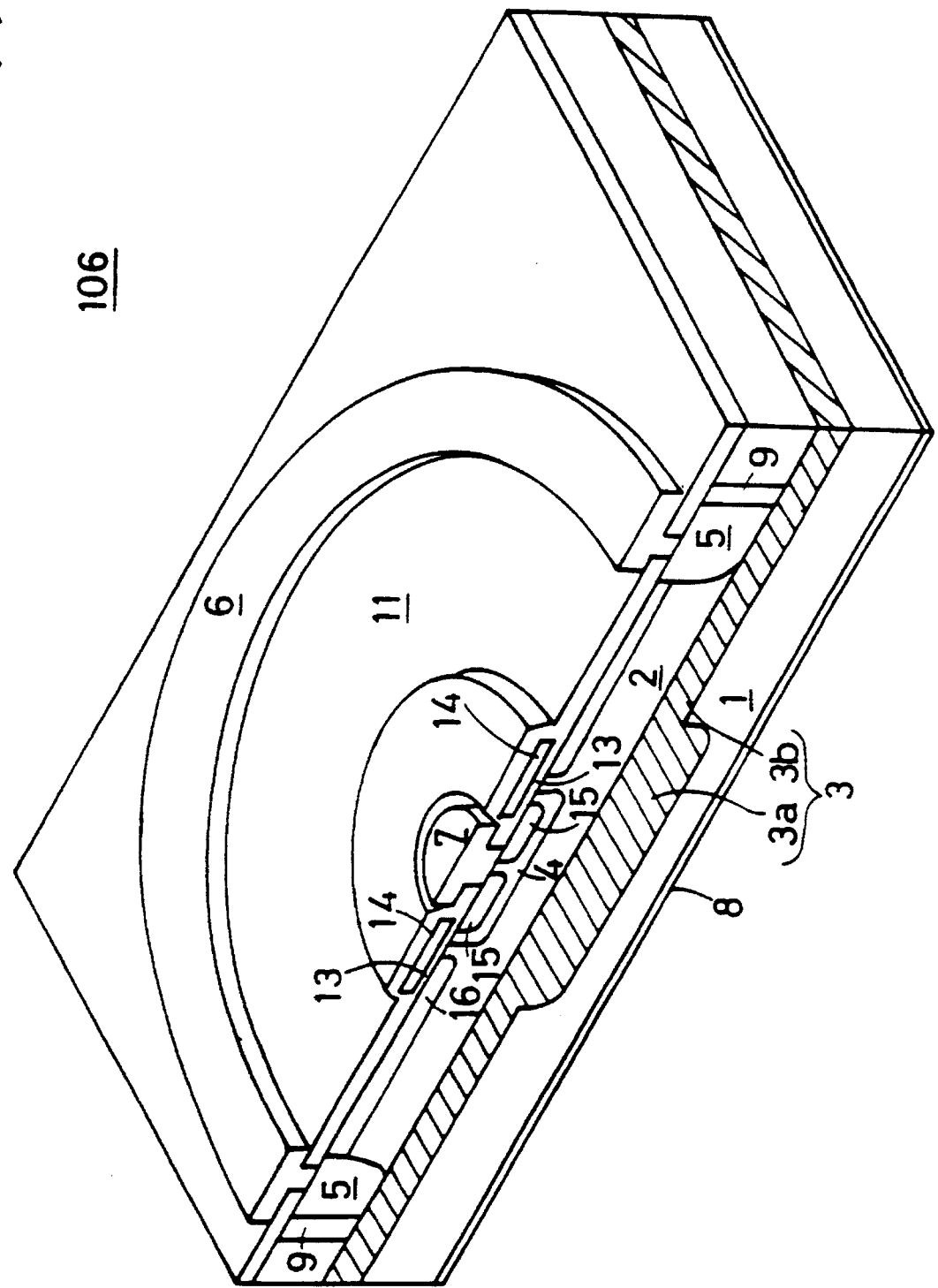
FIG. 39 is a perspective cross sectional view showing a tenth preferred embodiment of the present invention.
Figure 40:
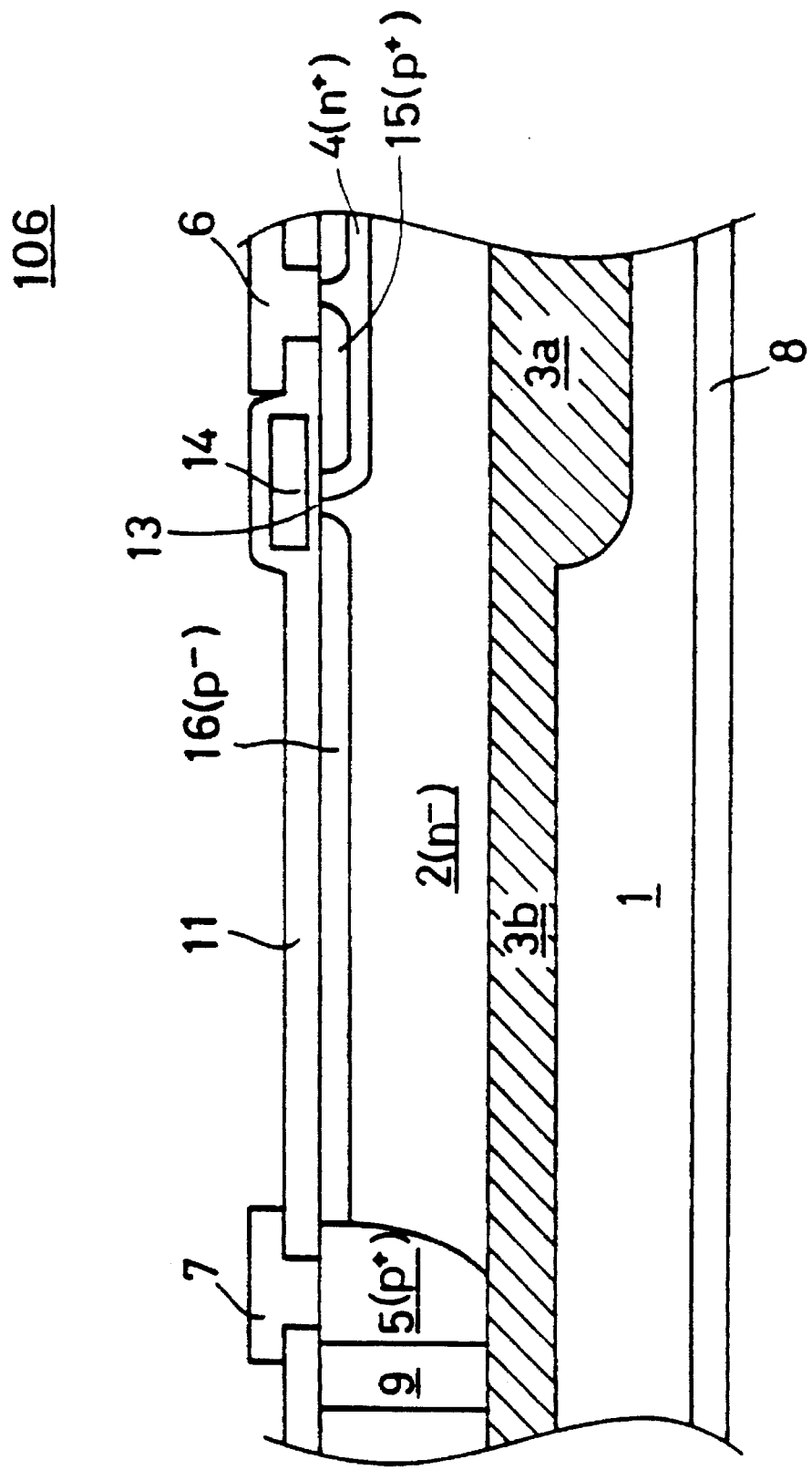
FIG. 40 is a cross sectional view showing the tenth preferred embodiment of the present invention.

FIGS. 39 and 40 are a perspective cross sectional view and a cross sectional view, respectively, of a dielectric element isolated semiconductor device 106 according to a tenth preferred embodiment of the present invention. The semiconductor substrate 1, the n⁻ type semiconductor layer 2, the dielectric layer 3, both as it is and in terms of its first and second regions 3a and 3b, the p⁺ type semiconductor region 5, the electrodes 6 and 7, the back surface electrode 8 and the insulation film 9 are located as they are disposed in the dielectric element isolated semiconductor device 100 of the first preferred embodiment.

In the tenth preferred embodiment, a p⁺ type semiconductor region 15 is selectively formed in the top surface of the n⁺ type semiconductor region 4 and connected to the electrode 6 like the n⁺ type semiconductor region 4 is. Along the electrode 6, an electrode 14 is disposed as buried in the insulation film 11. The p⁺ type semiconductor region 15 as well as the n⁺ type semiconductor region 4 extend immediately under the electrode 14.

In the top surface of the n⁻ type semiconductor layer P⁻ type semiconductor region 16 is formed from the vicinity of the p⁺ type semiconductor region 5 toward the outer rim of the electrode 14. In other words, the electrode 14 faces, through the insulation film 11, the P⁻ type semiconductor region 16, the n⁻ type semiconductor layer 2, the n⁺ type semiconductor region 4 and the p⁺ type semiconductor region 15 as arrayed one next to the other. The insulation film 11 disposed immediately under the electrode 14 is formed by an oxide film, for instance, and functions as a gate oxide film 13.

Hence, the P⁻ type semiconductor region 16, the n⁻ type semiconductor layer 2, the n⁺ type semiconductor region 4 and the p⁺ type semiconductor region 15, as combined with the electrode 14 and the gate oxide film 13, form a p-channel MOS transistor. In the p-channel MOS transistor, the electrode 7 serves as a drain electrode, the electrode 6 serves as a source electrode, and the electrode 14 serves as a gate electrode. Therefore, the terms "drain electrode 7," "source electrode 6" and "gate electrode 14" will be herein used.

Figure 41:
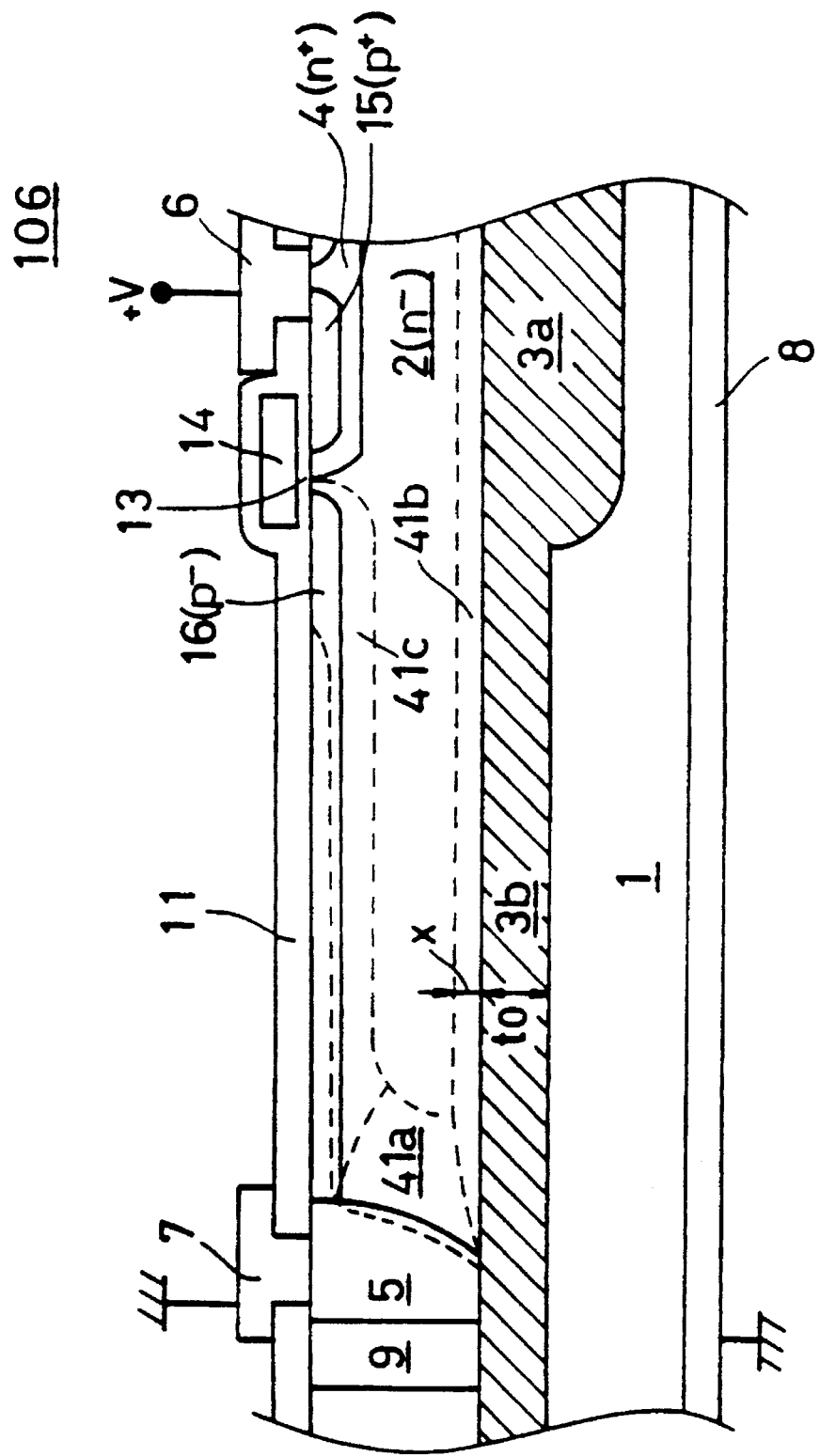
FIGS. 41 to 43 are cross sectional views for explaining the tenth preferred embodiment of the present invention.

FIG. 41 is a cross sectional view showing the operations of the dielectric element isolated semiconductor device 106. When the drain electrode 7 and the back surface electrode 8 are both kept at 0 V and a gradually increasing positive voltage is given to the source and the gate electrodes 6 and 14, a depletion layer 41a grows from a pn junction between the n⁻ type semiconductor layer 2 and the p⁺ type semiconductor region 5. Since the semiconductor substrate 1 serves through the dielectric layer 3 as a field plate, in addition to the depletion layer 41a, another depletion layer 41b extends from an interface between the n⁻ type semiconductor layer 2 and the dielectric layer 3 toward the top surface of the n⁻ type semiconductor layer 2.

Further, a depletion layer 41c extends from a pn junction between the P⁻ type semiconductor region 16 and the n⁻ type semiconductor layer 2. Having a relatively lower impurity concentration, the P⁻ type semiconductor region 16 allows growth of the depletion layer 41c thereinto. Hence, the depletion layers 41b and 41c facilitate the growth of the depletion layer 41a, achieving the RESURF effect which relieves electric field at the pn junction between the n⁻ type semiconductor layer 2 and the p⁺ type semiconductor region 5.

Figure 42:
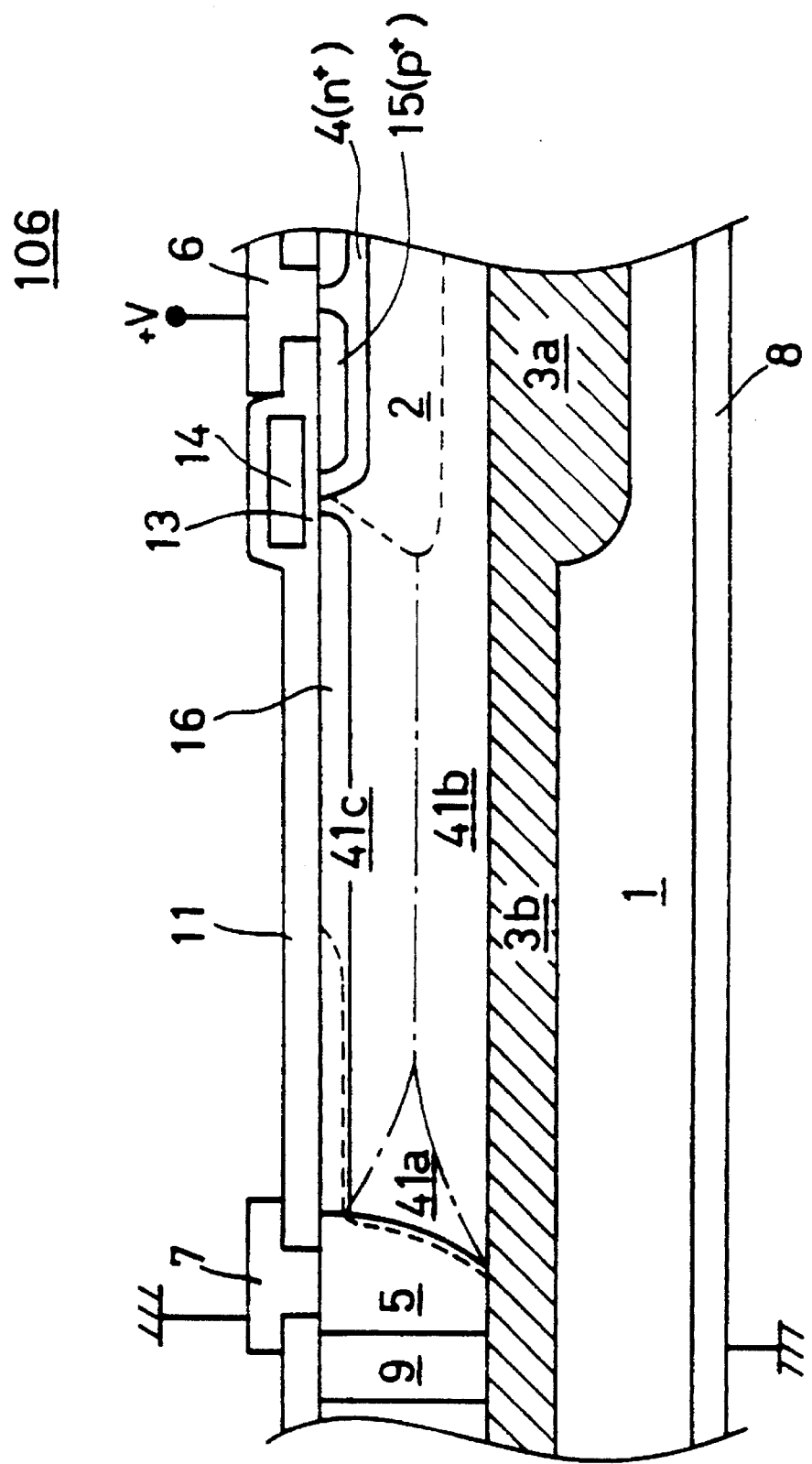
Figure 43:
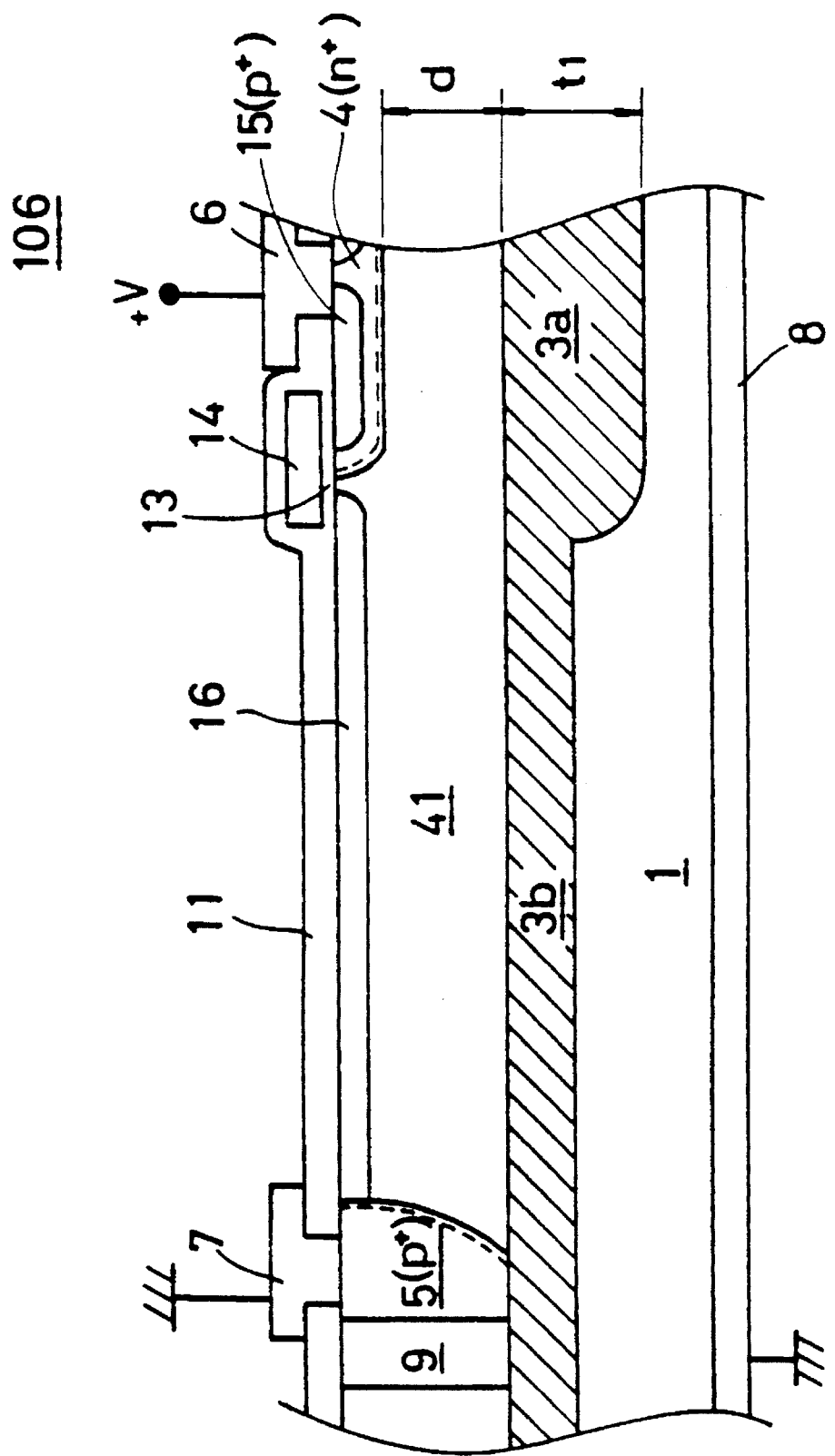

If the potential applied to the source electrode 6 is increased, the depletion layer 41c extends to the left side, too, as shown in FIG. 42. At last, the n⁻ type semiconductor layer 2 and the P⁻ type semiconductor region 16 will be completely depleted by the depletion layer 41 as shown in FIG. 43.

It is preferred that the impurity concentration of the P⁻ type semiconductor region 16 is controlled so that it would be depleted in this manner. When optimized as in the first preferred embodiment, the dependence of the location of the electric field strength is as shown in FIG. 6 which depicts the first preferred embodiment. The breakdown voltage is expressed as Eq. 6.

It then follows that similarly to the first preferred embodiment, a breakdown voltage between the source and the drain electrode 6 and 7 is improved by setting the thickness $t_0$ of the dielectric layer 3 relatively thin at the second region 3b to thereby ensure no punctuation of the RESURF effect and by setting the thickness $t_1$ of the dielectric layer 3 relatively thick at the first region 3a to thereby increase voltage drop.

By lowering the potential at the gate electrode 14 than the potential at the source electrode 6, conductivity inversion into the p-type occurs in the top surfaces of the n⁻ type semiconductor layer 2 and the n⁺ type semiconductor region 4 immediately under the electrode 14, initiating a hole current from the p⁺ type semiconductor region 15 into the p⁺ type semiconductor region 5 through the P⁻ type semiconductor region 16. As a result, the dielectric element isolated semiconductor device 106 turns on.

The dielectric element isolated semiconductor device 106 turns off when the gate electrode 14 is returned to the same potential as the drain electrode 7 and the p-type inversion consequently disappears.

Eleventh Preferred Embodiment

Figure 44:
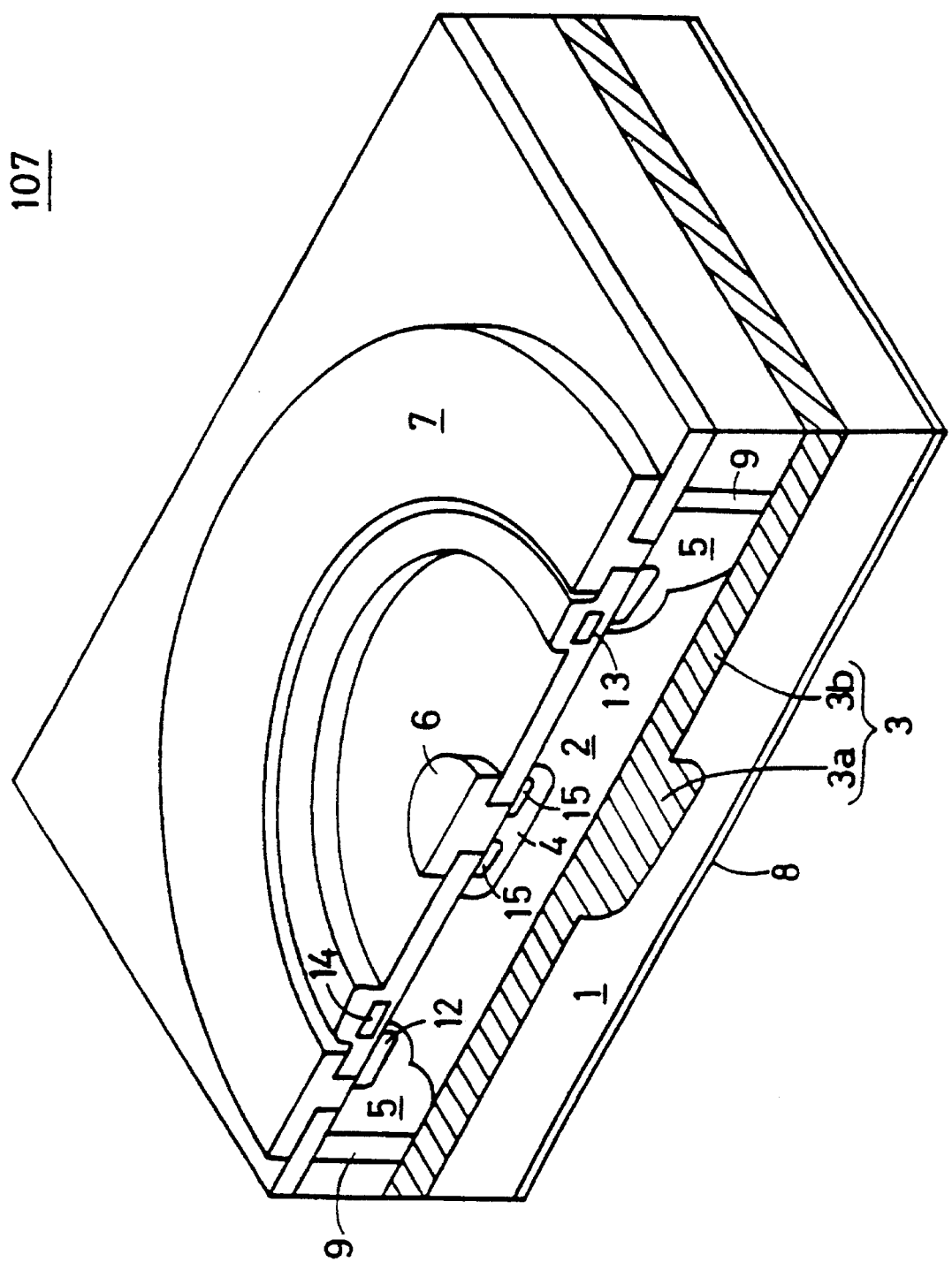
FIG. 44 is a perspective cross sectional view showing an eleventh preferred embodiment of the present invention.
Figure 45:
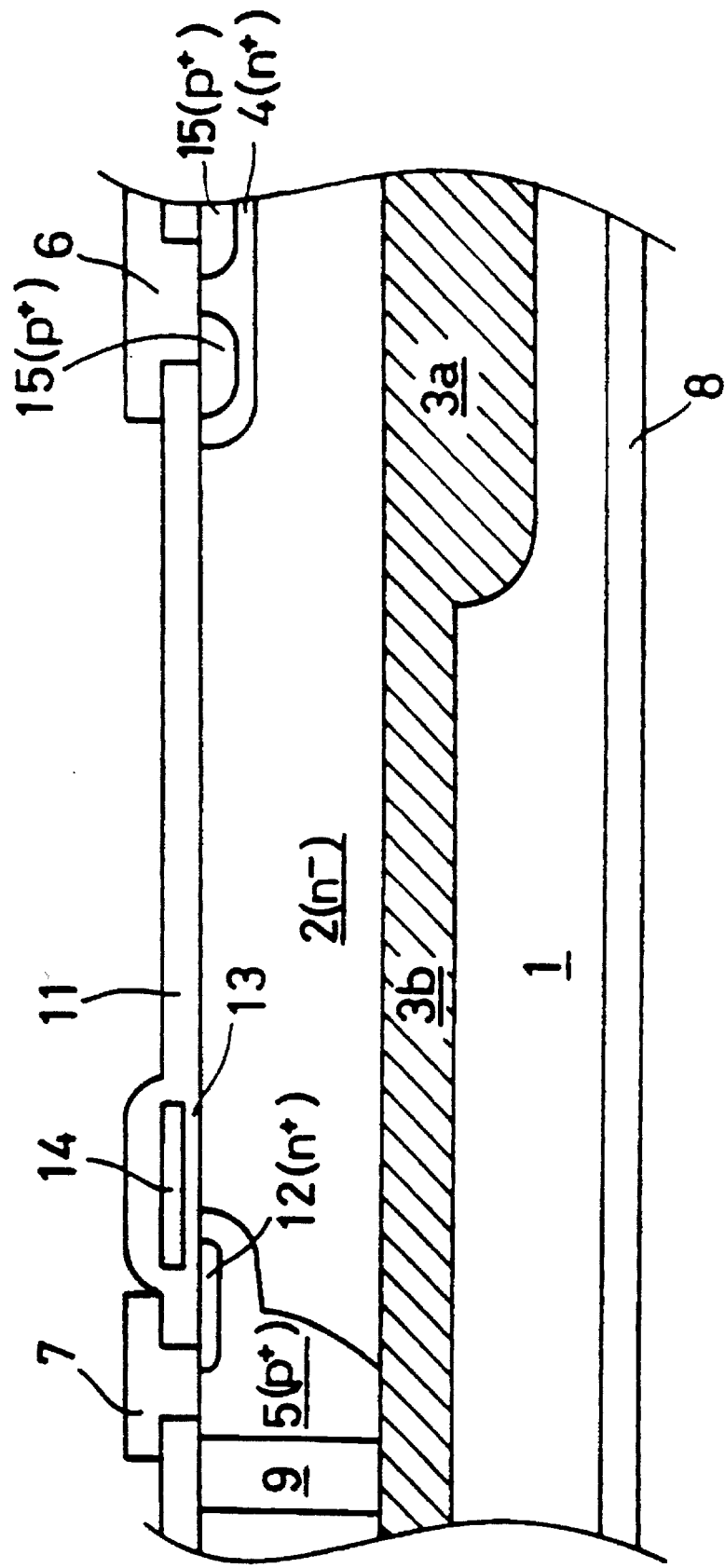
FIG. 45 is a cross sectional view showing the eleventh preferred embodiment of the present invention.

FIGS. 44 and 45 are a perspective cross sectional view and a cross sectional view, respectively, of a dielectric element isolated semiconductor device 107 according to an eleventh preferred embodiment of the present invention. The dielectric element isolated semiconductor device 107 is similar in structure to the dielectric element isolated semiconductor device 105 of the ninth preferred embodiment except for the electrode 6 which is directly connected not only to the p⁺ type semiconductor region 15 but also to the n⁺ type semiconductor region 4. Hence, the dielectric element isolated semiconductor device 107 operates as an n-channel IGBT. Constructed as an n-channel IGBT, the dielectric element isolated semiconductor device 107 has the same breakdown voltage holding mechanism as that of the ninth preferred embodiment. That is, the device holds the breakdown voltage when the emitter electrode 7, the gate electrode 14 and the back surface electrode 8 are all kept at 0 V and a positive potential given to the collector electrode 6 is gradually increased. Thus, the effects ensured in the ninth preferred embodiment are obtainable in the eleventh preferred embodiment.

On the other hand, when a positive voltage is applied to the gate electrode 14, the p⁺ type semiconductor region 5 is inverted into the n type at its portion immediately under the gate electrode 14 so that a channel is created thereat. Due to the n-type inversion, an electron current is initiated from the n⁺ type semiconductor region 12 to the collector electrode 6 through the channel created in the p⁺ type semiconductor region 5 and through the n⁻ type semiconductor layer 2.

While the electron current has a low concentration, the electron current flows into the collector electrode 6 through the n⁺ type semiconductor region 4. However, as the electron current becomes dense, voltage drop occurs within the n⁺ type semiconductor region 4, whereby a forward bias is applied between the p⁺ type semiconductor region 15 and the n⁺ type semiconductor region 4, and therefore, a hole current is initiated from the p⁺ type semiconductor region 15 to the n⁻ type semiconductor layer 2. Due to the hole current, the conductivity of the n⁻ type semiconductor layer 2 is modulated, thereby turning on the dielectric element isolated semiconductor device 107.

Thus, as compared with the ninth preferred embodiment, the modulation of conductivity would not easily caused during the device ON-operation. Despite this drawback, the device of the eleventh preferred embodiment is advantageous for its small turn-off loss and high-speed operations which are realized by immediate stop of hole implantation at device turning off upon disappearance of the forward bias applied between the p⁺ type semiconductor region 15 and the n⁺ type semiconductor region 4.

Twelfth Preferred Embodiment

Figure 46:
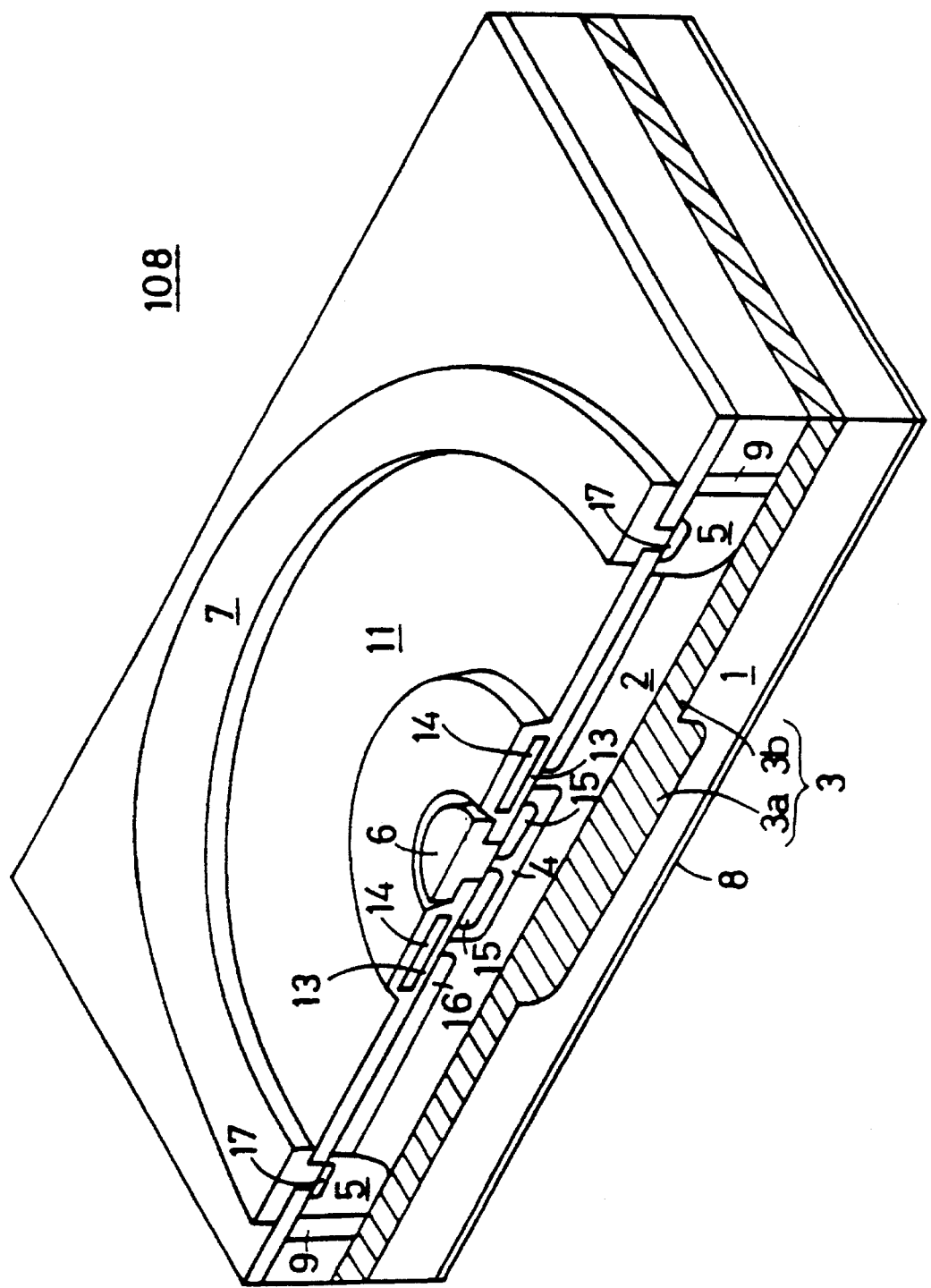
FIG. 46 is a perspective cross sectional view showing a twelfth preferred embodiment of the present invention.
Figure 47:
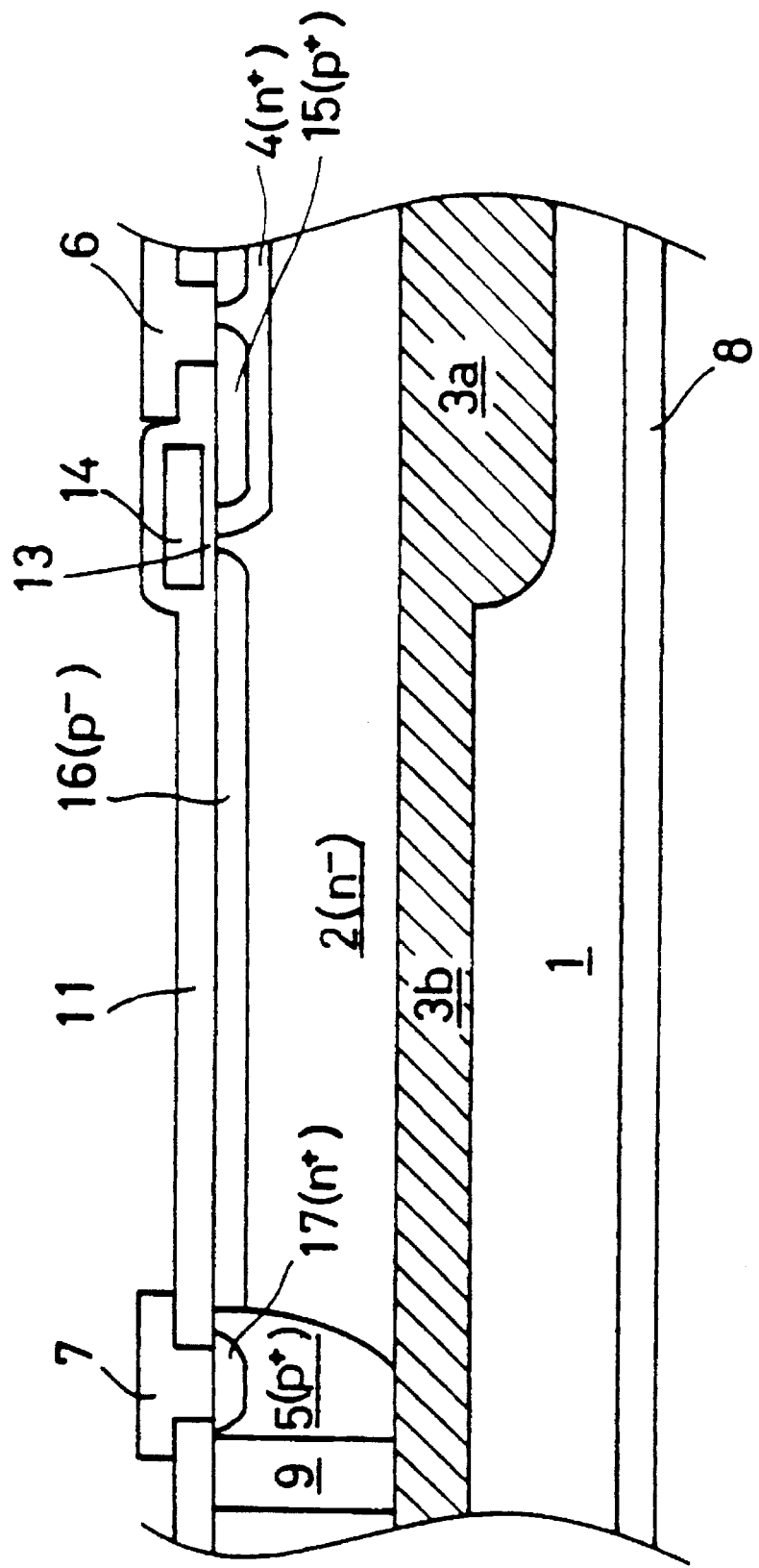
FIG. 47 is a cross sectional view showing the twelfth preferred embodiment of the present invention.

FIGS. 46 and 47 are a perspective cross sectional view and a cross sectional view, respectively, of a dielectric element isolated semiconductor device 108 according to a twelfth preferred embodiment of the present invention. The dielectric element isolated semiconductor device 108 is the same as the dielectric element isolated semiconductor device 106 of the tenth preferred embodiment as modified such that an n⁺ type semiconductor region 17 is selectively formed in the top surface of the p⁺ type semiconductor region 5 and the electrode 7 is connected to the p⁺ type semiconductor region 5 through the n⁺ type semiconductor region 17. Hence, the dielectric element isolated semiconductor device 108 has the same breakdown voltage holding mechanism as that of the tenth preferred embodiment.

The dielectric element isolated semiconductor device 108 departs from the device of the tenth preferred embodiment in that it operates as a p-channel IGBT. Since the electrode 7 serves as a collector electrode and the electrode 6 serves as an emitter electrode, the electrodes will be herein referred to as "collector electrode 7" and "emitter electrode 6."

The dielectric element isolated semiconductor device 108 holds the breakdown voltage when the collector electrode 7 and the back surface electrode 8 are both kept at 0 V and a gradually increasing positive voltage is given to the emitter and the gate electrodes 6 and 14. Hence, the effects promised in the tenth preferred embodiment are obtainable in the twelfth preferred embodiment.

By lowering the potential at the gate electrode 14 than the potential at the emitter electrode 6, conductivity inversion into the p-type occurs in the top surfaces of the n⁻ type semiconductor layer 2 and the n⁺ type semiconductor region 4 immediately under the electrode 14, initiating a hole current from the p⁺ type semiconductor region 15 into the p⁺ type semiconductor region 5 through the P⁻ type semiconductor region 16.

On the other hand, an electron current flows from the n⁺ type semiconductor region 17 into the n⁻ type semiconductor layer 2. As a result, the dielectric element isolated semiconductor device 108 turns on. In comparison with the dielectric element isolated semiconductor device 106, the dielectric element isolated semiconductor device 108, owing to the electron current created therein, has a higher current density.

When the potential at the gate electrode 14 is returned to the same potential level as that at the emitter electrode 6, the p-type inversion disappears, whereby the electrons which has moved from the n⁺ type semiconductor region 17 flow into the n⁺ type semiconductor region 4 and the dielectric element isolated semiconductor device 108 turns off. High-speed turning off with a small turn-off loss is possible in the dielectric element isolated semiconductor device 108 if the collector electrode 7 is disposed in contact with both the n⁺ type semiconductor region 17 and the p⁺ type semiconductor region 5 in the dielectric element isolated semiconductor device 108 as in the dielectric element isolated semiconductor device 107.

Thirteenth Preferred Embodiment

Figure 48:
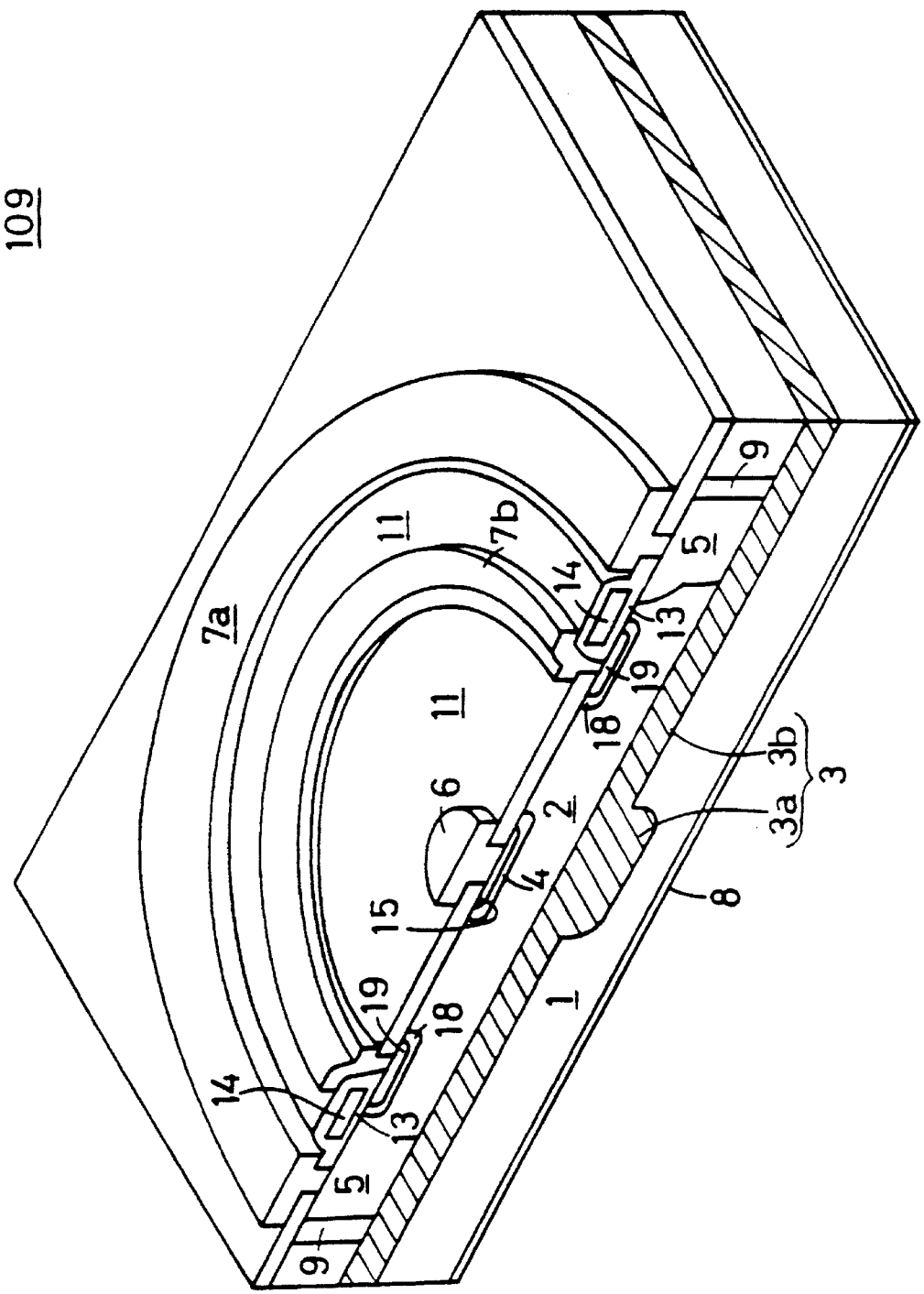
FIG. 48 is a perspective cross sectional view showing a thirteenth preferred embodiment of the present invention.
Figure 49:
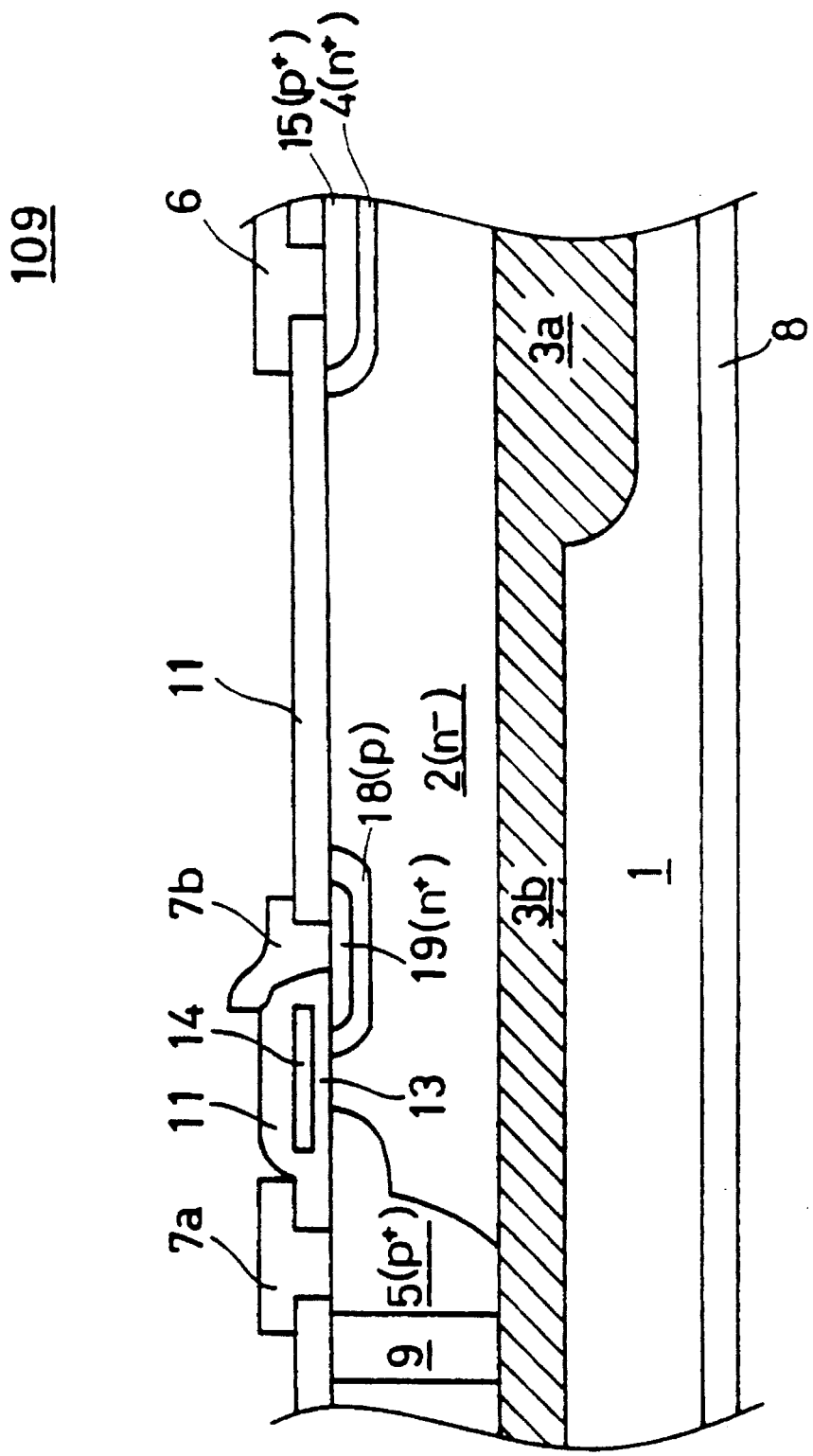
FIG. 49 is a cross sectional view showing the thirteenth preferred embodiment of the present invention.

FIGS. 48 and 49 are a perspective cross sectional view and a cross sectional view, respectively, of a dielectric element isolated semiconductor device 109 according to a thirteenth preferred embodiment of the present invention. The semiconductor substrate 1, the n⁻ type semiconductor layer the dielectric layer 3, both as it is and in terms of its first and second regions 3a and 3b, the n⁺ type semiconductor region 4, the p⁺ type semiconductor region 5, the electrode 6, the gate electrode 14, the back surface electrode 8, the insulation film 9 and the p⁺ type semiconductor region 15, are located as they are disposed in the dielectric element isolated semiconductor device 105 of the ninth preferred embodiment.

Unlike the ninth preferred embodiment, the dielectric element isolated semiconductor device 109 does not comprise what corresponds to the n⁺ type semiconductor region 12. An electrode 7a is disposed as an element which corresponds to the electrode 7.

In the top surface of the n⁻ type semiconductor layer 2 at a portion nearer to the electrode 6 and remote from the p⁺ type semiconductor region 5, a p type semiconductor region 18 is selectively formed. The p type semiconductor region 18 terminates below the gate electrode 14 opposite to the end of the p⁺ type semiconductor region 5. An n⁺ type semiconductor region 19 is selectively formed in the top surface of the p type semiconductor region 18. The n⁺ type semiconductor region 19 also terminates below the electrode 14. That is, the electrode 14 faces, through the insulation film 11, the n⁺ type semiconductor region 19, the p type semiconductor region 18, the n⁻ type semiconductor layer 2 and the p⁺ type semiconductor region 5 as arrayed one next to the other. The insulation film 11 disposed immediately under the electrode 14 is formed by an oxide film, for instance, and functions as a gate oxide film 13.

The insulation film 11 includes at a portion above the n⁺ type semiconductor region 19 an opening through which an electrode 7b is connected to the n⁺ type semiconductor region 19. In general, the electrode 7b is connected to the electrode 7a to short circuit therewith.

Thus, the dielectric element isolated semiconductor device 109 forms an n-channel MCT (MOS Controlled Thyristor). In the thyristor, the electrodes 7a and 7b in combination serve as a cathode electrode, the electrode 6 serves as an anode electrode, and the electrode 14 serves as a gate electrode. Therefore, the terms "cathode electrode 7 (which refers to the electrodes 7a and 7b as taken as one electrode)," "anode electrode 6" and "gate electrode 14" will be herein used.

When the cathode and the gate electrodes 7 and 14 and the back surface electrode 8 are all kept at 0 V and a gradually increasing positive voltage is given to the anode electrode 6, a depletion layer extends from a pn junction which is formed at where the p type semiconductor region 18 and the p⁺ type semiconductor region 5 abut the n⁻ type semiconductor layer 2. As a result, the dielectric element isolated semiconductor device 109 holds the breakdown voltage. The breakdown voltage holding mechanism, similarly to that of the first preferred embodiment, attains improvement in the breakdown voltage as in the first preferred embodiment.

On the other hand, when a positive voltage is applied to the gate electrode 14 while the dielectric element isolated semiconductor device is in such a state for holding the breakdown voltage, the p type semiconductor region 18 is inverted into the n type at its portion immediately under the gate electrode 14. Consequently, an electron current is initiated from the n⁺ type semiconductor region 19 to the anode electrode 6 through the n⁻ type semiconductor layer 2.

At the same time, a hole current is initiated which flows from the p⁺ type semiconductor region 15 to the n⁻ type semiconductor layer 2. The hole current flows from the p type semiconductor region 18 to the n⁺ type semiconductor region 19, whereby a forward bias is applied between the n⁺ type semiconductor region 19 and the p type semiconductor region 18. This allows that thyristor operations take place between the electrode 7b and the anode electrode 6, turning on the dielectric element isolated semiconductor device.

If the gate electrode 14 is changed to a negative potential when the dielectric element isolated semiconductor device is in such a state, the p type semiconductor region 18 is inverted into the p type at its portion immediately under the gate electrode 14, with a consequence that the p type semiconductor region 18 and the p⁺ type semiconductor region 5 short-circuit, which in turn conducts both the p type semiconductor region 18 and the n⁺ type semiconductor region 19 through the electrodes 7a and 7b. Hence, the potential difference between the p type semiconductor region 18 and the n⁺ type semiconductor region 19 disappears, and therefore, so do the thyristor operations. Thus, the dielectric element isolated semiconductor device 109 turns off.

Where the anode electrode 6 is connected with both the n⁺ type semiconductor region 4 and the p⁺ type semiconductor region 15, a turn-off loss is reduced as in the eleventh preferred embodiment, enabling high-speed thyristor operations.

Fourteenth Preferred Embodiment

Figure 50:
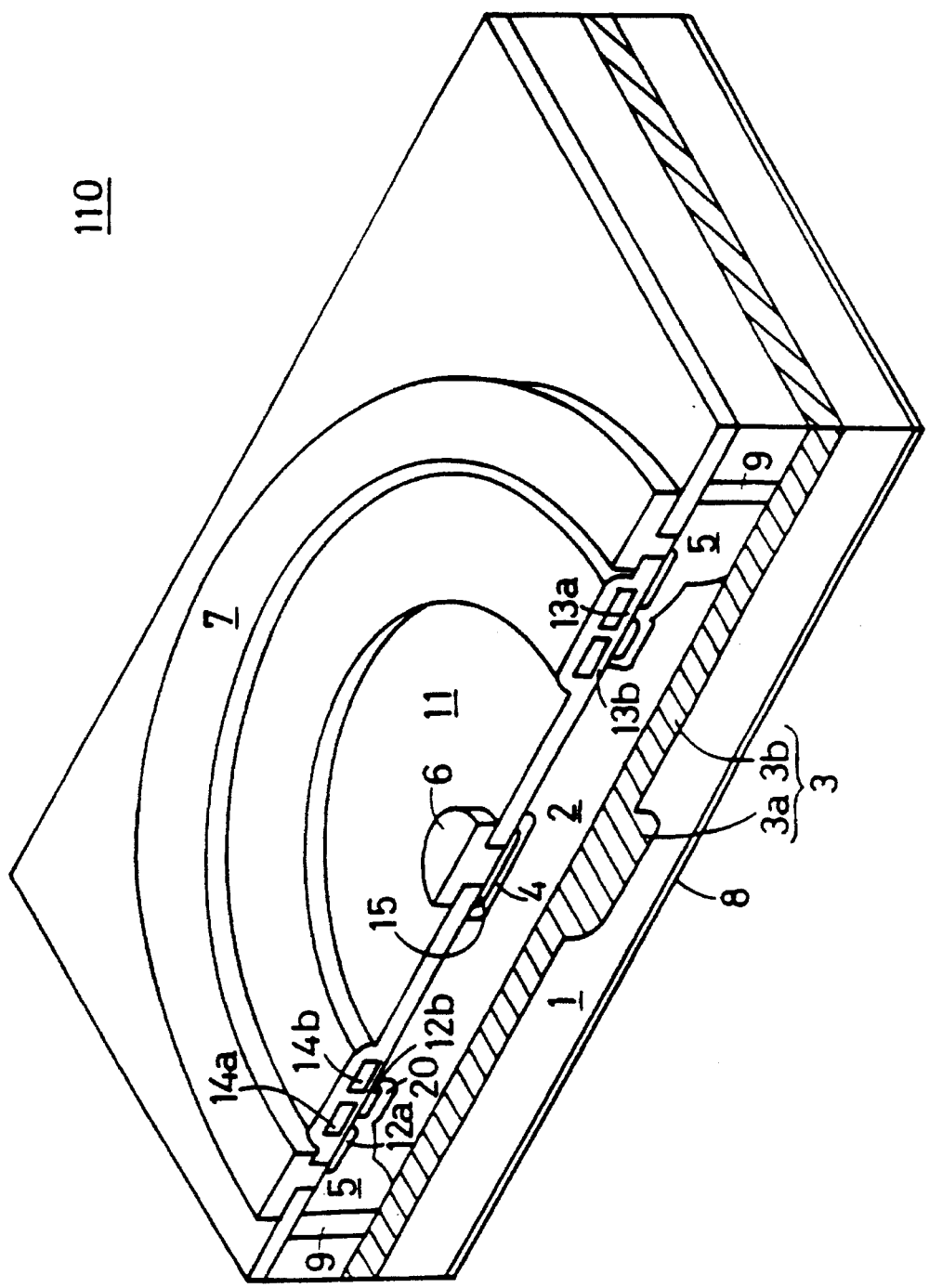
FIG. 50 is a perspective cross sectional view showing a fourteenth preferred embodiment of the present invention.
Figure 51:
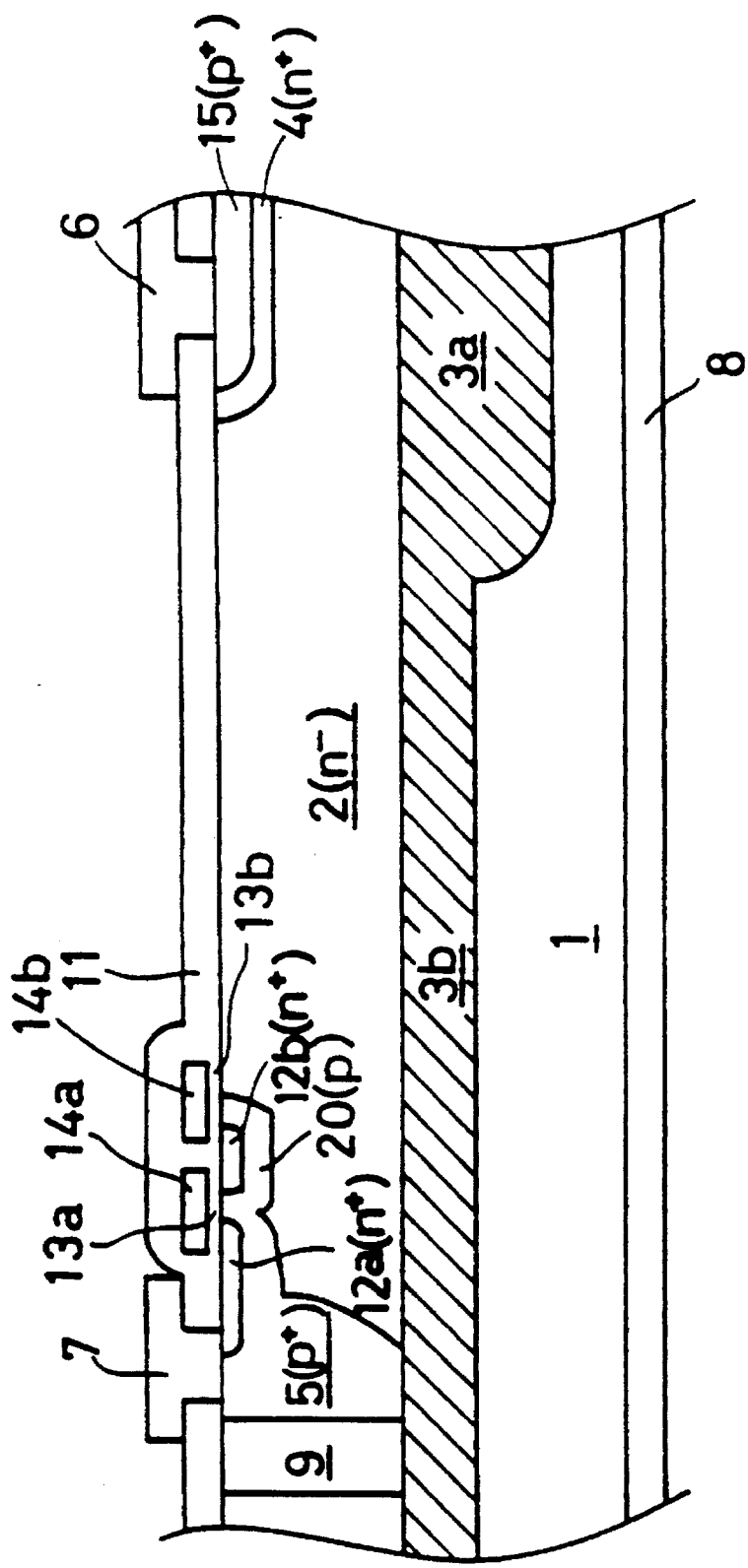
FIG. 51 is a cross sectional view showing the fourteenth preferred embodiment of the present invention.
Figure 52:
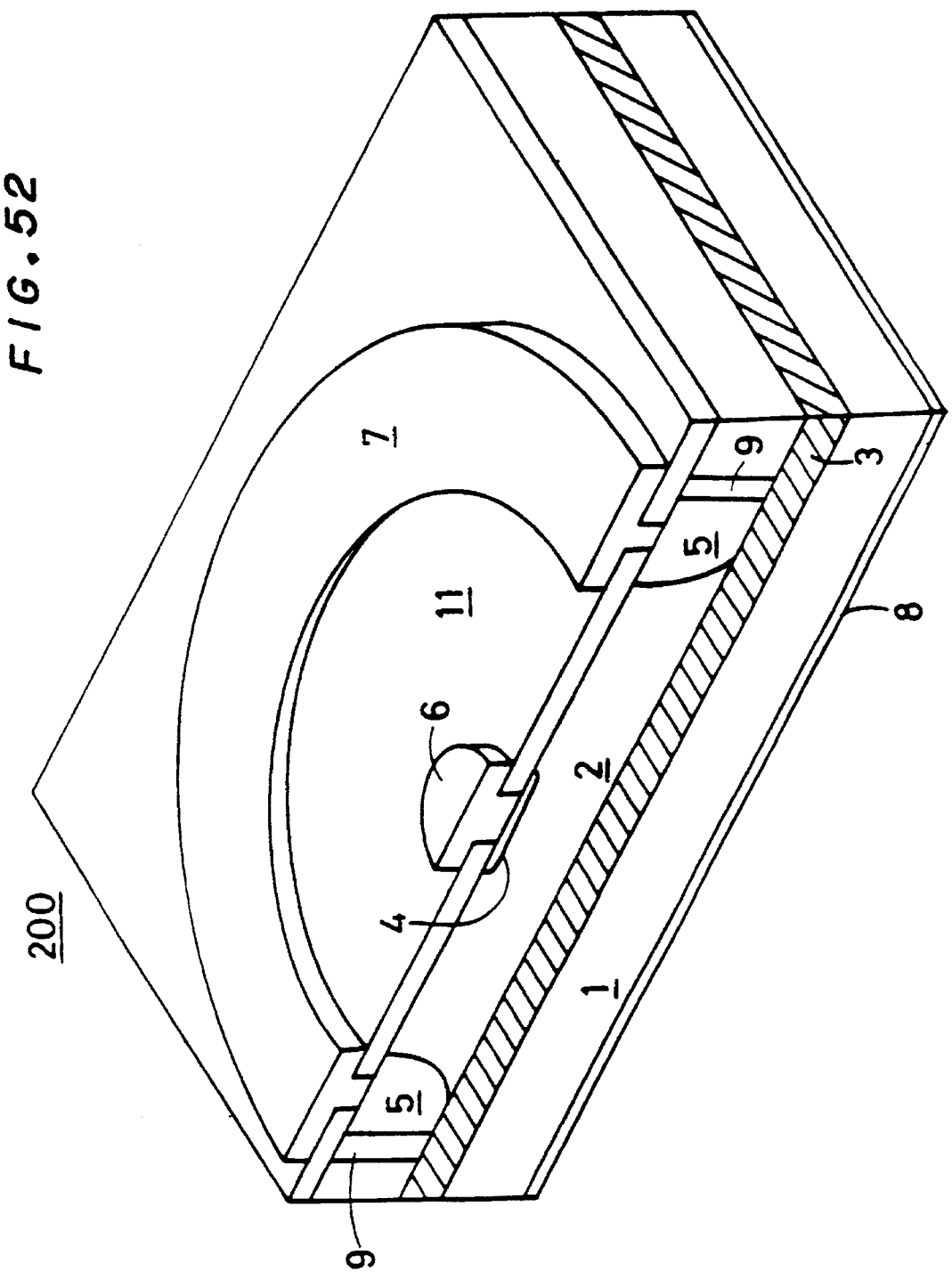
FIGS. 52 to 54 are cross sectional views showing a conventional technique.
Figure 53:
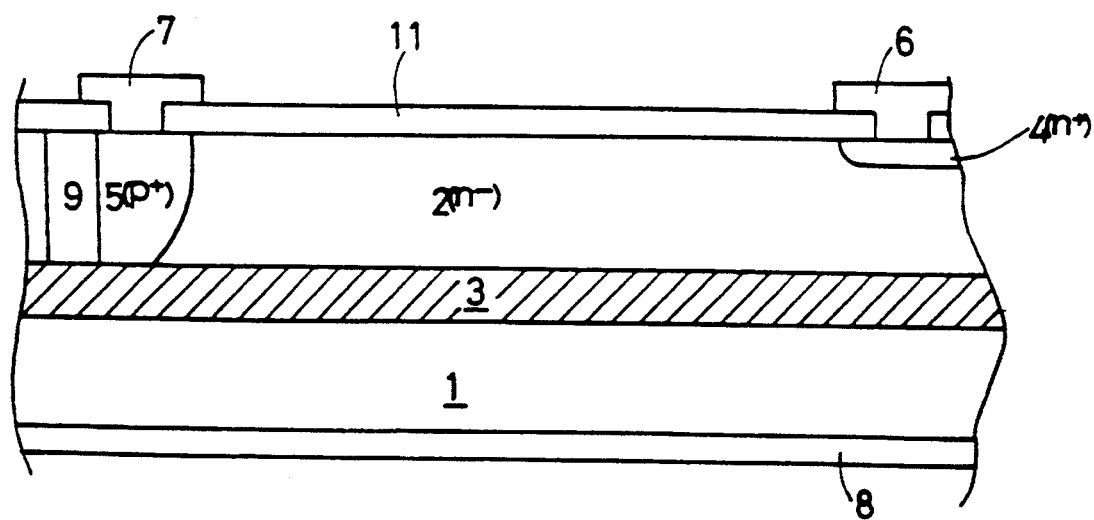
Figure 54:
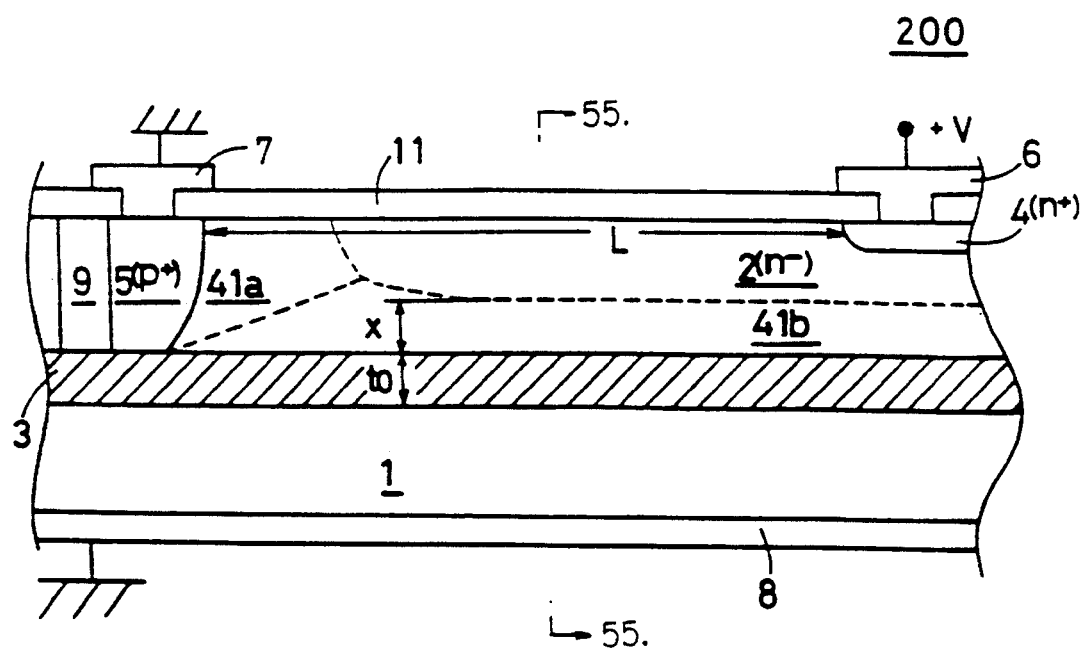

FIGS. 50 and 51 are a perspective cross sectional view and a cross sectional view, respectively, of a dielectric element isolated semiconductor device 110 according to a fourteenth preferred embodiment of the present invention. The semiconductor substrate 1, the n⁻ type semiconductor layer 2, the dielectric layer 3, both as it is and in terms of its first and second regions 3a and 3b, the n⁺ type semiconductor region 4, the p⁺ type semiconductor region 5, the electrode 6, the back surface electrode 8, the insulation film 9 and the p⁺ type semiconductor region 15 are located as they are disposed in the dielectric element isolated semiconductor device 105 of the ninth preferred embodiment.

In addition to the structure of the ninth preferred embodiment, the dielectric element isolated semiconductor device 110 comprises a p type semiconductor region 20 which is selectively formed in the top surface of the n⁻ type semiconductor layer 2. The p type semiconductor region 20 is located nearer to the electrode 6 than the p⁺ type semiconductor region 5 is and in contact with the p⁺ type semiconductor region 5.

The dielectric element isolated semiconductor device 110 also comprises an n⁺ type semiconductor region 12a which corresponds to the n⁺ type semiconductor region 12 of the dielectric element isolated semiconductor device 105. The n⁺ type semiconductor region 12a and other n⁺ type semiconductor region 12b are selectively disposed in the top surface of the p type semiconductor region 20.

Electrodes 14a and 14b are contained in the insulation film 11. Thus, the electrode 14a faces, through the insulation film 11, the n⁺ type semiconductor region 12a, the p⁺ type semiconductor region 5, the p type semiconductor region 20 and the n⁺ type semiconductor region 12b as arrayed one next to the other. The insulation film 11 is formed by an oxide film, for instance, at a portion immediately under the electrode 14a and functions as a gate oxide film 13a.

The electrode 14b faces, through the insulation film 11, the n⁺ type semiconductor region 12b, the p type semiconductor region 20 and the n⁻ type semiconductor layer 2 as arrayed one next to the other. The insulation film 11 is formed by,an oxide film, for instance, at a portion immediately under the electrode 14b and functions as a gate oxide film 13b. In general, the electrodes 14a and 14b are connected with each other so as to short-circuit.

In other words, the dielectric element isolated semiconductor device 110 forms an n-channel EST (Emitter Switched Thyristor). In this thyristor, the electrode 6 serves as an anode electrode, the electrode 7 serves as a cathode electrode, and the electrodes 14a and 14b in combination serve as a gate electrode. Therefore, the terms "anode electrode 6," "cathode electrode 14" and "gate electrode 14 (which refers to the electrodes 14a and 14b as taken as one electrode)" will be herein used.

When the cathode and the gate electrodes 7 and 14 and the back surface electrode 8 are all kept at 0 V and a gradually increasing positive voltage is given to the anode electrode 6, a depletion layer extends from a pn junction which is formed at where the p type semiconductor region 20 and the p⁺ type semiconductor region 5 abut the n⁻ type semiconductor layer 2. Hence, the dielectric element isolated semiconductor device 109 holds the breakdown voltage. The breakdown voltage holding mechanism, similarly to that of the first preferred embodiment, attains improvement in the breakdown voltage as in the first preferred embodiment.

When a positive voltage is applied to the gate electrode 14 while the dielectric element isolated semiconductor device is in such a state for holding the breakdown voltage, the p⁺ type semiconductor region 5 and the p type semiconductor region 20 are inverted into the n type where they are immediately under the gate electrode 14. As a result, an electron current is initiated from the n⁺ type semiconductor region 12a to the p⁺ type semiconductor region 15 through the n⁺ type semiconductor region 12b and the n⁻ type semiconductor layer 2.

On the other hand, a hole current is initiated from the p⁺ type semiconductor region 15 to the n⁻ type semiconductor layer 2. The hole current flows into the cathode electrode 7 through the p type semiconductor region 20, causing voltage drop. The n⁺ type semiconductor region 12a is connected to the cathode electrode 7, and connection is made between the n⁺ type semiconductor region 12a and the n⁺ type semiconductor region 12b because of the n-inverted layer therebetween. Hence, a forward bias is applied between the n⁺ type semiconductor region 12b and the p type semiconductor region 20.

As a result, thyristor operations are realized between the n⁺ type semiconductor region 12b and the p⁺ type semiconductor region 15. This permits that thyristor portion and the n-channel MOS immediately under the gate electrode 14 are connected in series, turning on the dielectric element isolated semiconductor device.

If the potential at the gate electrode 14 is changed to 0 again when the dielectric element isolated semiconductor device is in such ON-state, the n-inverted layer immediately under the gate electrode 14 disappears, rendering the thyristor current-starved. Hence, the dielectric element isolated semiconductor device turns off. Likewise in the eleventh preferred embodiment, high-speed turning off with a small turn-off loss is achieved if the electrode 6 is disposed in contact with both the n⁺ type semiconductor region 4 and the p⁺ type semiconductor region.

Other Applications of the Invention

The seventh to the fourteenth preferred embodiments heretofore described have disclosed various types of devices as modifications of the first preferred embodiment, i.e., the device structure in which the first region 3a is an insulation layer which is thicker than the second region 3b. The devices according to the seventh to the fourteenth preferred embodiments, however, may be realized as modifications of the second and the third preferred embodiments.

Further, the dielectric element isolated semiconductor devices according to the respective embodiments above may be incorporated together with other low-breakdown voltage elements in an integrated circuit instead of being used alone.

While the invention has been described in detail, the foregoing description is in all aspects illustrative and not restrictive. It is understood that numerous other modifications and variations can be devised without departing from the scope of the invention.

I claim:

1. A method of manufacturing a dielectric element isolated semiconductor device, comprising the steps of:
   (a) preparing a first substrate having a first major surface and a second major surface and a second substrate of a first conductivity type, said second substrate having a first and a second major surfaces and a relatively high resistance;
   (b) forming a first dielectric layer on said first major surface of said first substrate so that said first dielectric layer includes a relatively thick first region and a relatively thin second region surrounding said first region;
   (c) forming a second dielectric layer in the first major surface of said second substrate;
   (d) joining said first and said second substrates at said first major surfaces with said first and said dielectric layers in;
   (e) forming a first semiconductor layer of a relatively low resistance and a second semiconductor layer in said second major surface of said second substrate from a second major surface side of said second substrate so that said first semiconductor layer is in an opposed relationship with said first region and said second semiconductor layer is in an opposed relationship with said second region; and
   (f) forming a first electrode and a second electrode which are electrically connected to said first semiconductor layer and said second semiconductor layer, respectively.

2. A method of manufacturing a dielectric element isolated semiconductor device, comprising the steps of:
   (a) preparing a first substrate having a first major surface and a second major surface and a second substrate of a first conductivity type, said second substrate having a first and a second major surfaces and a relatively high resistance;
   (b) forming a first dielectric layer on said first major surface of said first substrate;
   (c) forming a second dielectric layer on said first major surface of said second substrate, said second dielectric layer including a first region of a relatively low specific inductive capacity and a second region of a relatively high specific inductive capacity surrounding said first region;
   (d) joining said first and said second substrates at said first major surfaces with said first and said second dielectric layers in;
   (e) forming a first semiconductor layer of a relatively low resistance and a second semiconductor layer in said second major surface of said second substrate from a second major surface side of said second substrate so that said first semiconductor layer is in an opposed relationship with said first region and said second semiconductor layer is in an opposed relationship with said second region; and
   (f) forming a first electrode and a second electrode which are electrically connected to said first semiconductor layer and said second semiconductor layer, respectively.

3. The method of claim 2, wherein said second dielectric layer includes at said first region a dielectric element strip which is thinner than said second dielectric layer.

4. A method of manufacturing a dielectric element isolated semiconductor device, comprising the steps of:
   (a) preparing a first substrate having a first and a second major surfaces and including in said first major surface thereof a relatively thin first region and a relatively thick second region surrounding said first region;
   (b) preparing a second substrate of a first conductivity having a first and a second major surfaces said second substrate having a relatively high resistance;
   (c) forming a first dielectric layer having a relatively high specific inductive capacity on said first major surface of said first substrate so that said first dielectric layer forms a concave portion in said first region;
   (d) filling said concave portion with a third dielectric layer having a relatively low specific inductive capacity;
   (e) forming a second dielectric layer having a relatively high specific inductive capacity on said first major surface of said second substrate;
   (f) joining said first and said second substrates at said first major surfaces with said first to said third dielectric layers in;
   (g) forming a first semiconductor layer of a relatively low resistance and a second semiconductor layer in said second major surface of said second substrate from a second major surface side of said second substrate so that said first semiconductor layer is in an opposed relationship with said first region and said second semiconductor layer is in an opposed relationship with said second region; and
   (h) forming a first electrode and a second electrode which are electrically connected to said first semiconductor layer and said second semiconductor layer, respectively.

5. The method of claim 4, wherein said third dielectric layer is an air layer.

6. A method of manufacturing a dielectric element isolated semiconductor device, comprising the steps of:
   (a) preparing a first substrate having a first and a second major surfaces and a second substrate of a first conductivity type having a first and a second major surfaces and a relatively high resistance;
   (b) forming a first dielectric layer on said first major surface of said first substrate, said first dielectric layer including a relatively thick first region, a relatively thin second region surrounding said first region and a relatively thick third region which is disposed outside said second region;

(c) forming a second dielectric layer on the first major surface of said second substrate;

(d) joining said first and said second substrates at said first major surfaces with said first and said second dielectric layers in;

(e) selectively removing said second substrate, said first dielectric layer and said second dielectric layer and thereby exposing said first dielectric layer in said third region; and (f) forming a first semiconductor layer of a relatively low resistance and a second semiconductor layer in said second major surface of said second substrate from a second major surface side of said second substrate using said first dielectric layer in said third region as a reference patterning position so that said first semiconductor layer is in an opposed relationship with said first region and said second semiconductor layer is in an opposed relationship with said second region.

7. A method of manufacturing a dielectric element isolated semiconductor device, comprising the steps of:

(a) preparing a first substrate having a first and a second major surfaces and a second substrate of a first conductivity type, said second substrate having a first and a second major surfaces and a relatively high resistance;

(b) forming a first dielectric layer on the first major surface of said first substrate;

(c) forming on said first major surface of said second substrate a second dielectric layer which includes a relatively thin first region, a relatively thick second region surrounding said first region and a relatively thin third region which is disposed outside said second region so that said second dielectric layer forms a concave portion in said first and said third regions;

(d) joining said first and said second substrates at said first major surfaces with said first and said second dielectric layers in;

(e) selectively removing said second substrate, said first dielectric layer and said second dielectric layer and thereby exposing said first dielectric layer in said third region; and (f) forming a first semiconductor layer of a relatively low resistance and a second semiconductor layer in said second major surface of said second substrate from a second major surface side of said second substrate using said first dielectric layer in said third region as a reference patterning position so that said first semiconductor layer is in an opposed relationship with said first region and said second semiconductor layer is in an opposed relationship with said second region.

8. A method of manufacturing a dielectric element isolated semiconductor device, comprising the steps of:

(a) preparing a first substrate having a first and a second major surfaces and including in said first major surface thereof a relatively thin first region, a relatively thick second region surrounding said fist region and a relatively thin third region which is disposed outside said second region;

(b) preparing a second substrate of a first conductivity type having a first and a second major surfaces and a relatively high resistance;

(c) forming a first dielectric layer on said first major surface of said first substrate so that said first dielectric layer forms a concave portion in said first and said third regions;

(d) forming a second dielectric layer on said first major surface of said second substrate;

(e) joining said fist and said second substrates at said first major surfaces with said first and said second dielectric layers in;

(f) selectively removing said second substrate, said first dielectric layer and said second dielectric layer and thereby exposing said first dielectric layer in said third region; and (g) forming a fist semiconductor layer of a relatively low resistance and a second semiconductor layer in said second major surface of said second substrate from a second major surface side of said second substrate using said first dielectric layer in said third region as a reference patterning position so that said fist semiconductor layer is in an opposed relationship with said first region and said second semiconductor layer is in an opposed relationship with said second region.

* * * * *